(12) United States Patent
Fang et al.

(10) Patent No.: US 10,797,022 B2
(45) Date of Patent: Oct. 6, 2020

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Hsu-Nan Fang, Kaohsiung (TW); Chun-Jun Zhuang, Kaohsiung (TW); Yung I. Yeh, Kaohsiung (TW); Ming-Chiang Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/152,270

(22) Filed: Oct. 4, 2018

(65) Prior Publication Data

US 2019/0109117 A1    Apr. 11, 2019

Related U.S. Application Data

(60) Provisional application No. 62/569,390, filed on Oct. 6, 2017.

(51) Int. Cl.
*H01L 25/065* (2006.01)
*H01L 23/31* (2006.01)
(Continued)

(52) U.S. Cl.
CPC ........ *H01L 25/0655* (2013.01); *H01L 21/568* (2013.01); *H01L 21/6835* (2013.01);
(Continued)

(58) Field of Classification Search
CPC .............. H01L 21/568; H01L 21/4857; H01L 21/6835; H01L 21/76895; H01L 23/3121; H01L 23/5386; H01L 23/367; H01L 23/5381; H01L 23/562; H01L 23/5385; H01L 23/49816; H01L 23/5383;
(Continued)

(56) References Cited

U.S. PATENT DOCUMENTS 9,543,242 B1 *   1/2017   Kelly ................ H01L 23/49816
9,673,131 B2     6/2017   Hu et al.
(Continued)

OTHER PUBLICATIONS

U.S. Appl. No. 15/596,956, filed May 16, 2017, Chang Chien et al.

*Primary Examiner* — Jasmine J Clark
(74) *Attorney, Agent, or Firm* — Foley & Lardner LLP

(57) ABSTRACT

A semiconductor device package includes a first redistribution layer (RDL), a first die, a second die, a second RDL and an encapsulant. The first die is disposed on the first RDL and is electrically connected to the first RDL. The first die has a first electrical contact. The second die is disposed on the first RDL and is electrically connected to the first RDL. The second die has a first electrical contact. The second RDL is surrounded by the first RDL. The second RDL has a first electrical contact electrically connected to the first electrical contact of the first die and a second electrical contact electrically connected to the first electrical contact of the second die. A size of the first electrical contact of the second RDL is greater than a size of the second electrical contact of the second RDL.

20 Claims, 66 Drawing Sheets

1a

(51) Int. Cl.
*H01L 23/538* (2006.01)
*H01L 23/00* (2006.01)
*H01L 21/56* (2006.01)
*H01L 21/683* (2006.01)
*H01L 23/367* (2006.01)
*H01L 21/48* (2006.01)
*H01L 23/498* (2006.01)

(52) U.S. Cl.
CPC ...... *H01L 23/3121* (2013.01); *H01L 23/5385* (2013.01); *H01L 23/5386* (2013.01); *H01L 24/16* (2013.01); *H01L 21/4857* (2013.01); *H01L 23/3128* (2013.01); *H01L 23/367* (2013.01); *H01L 23/49816* (2013.01); *H01L 23/5381* (2013.01); *H01L 23/5383* (2013.01); *H01L 23/562* (2013.01); *H01L 2221/68345* (2013.01); *H01L 2221/68359* (2013.01); *H01L 2224/16238* (2013.01)

(58) Field of Classification Search
CPC ... H01L 23/3128; H01L 23/528; H01L 24/16; H01L 25/0655; H01L 2221/68359; H01L 2224/16238; H01L 2924/18162; H01L 2224/97; H01L 2224/023
See application file for complete search history.

(56) References Cited

U.S. PATENT DOCUMENTS

2015/0318262 A1* 11/2015 Gu ................... H01L 23/49811
 257/738
2015/0364422 A1 12/2015 Zhai et al.

\* cited by examiner

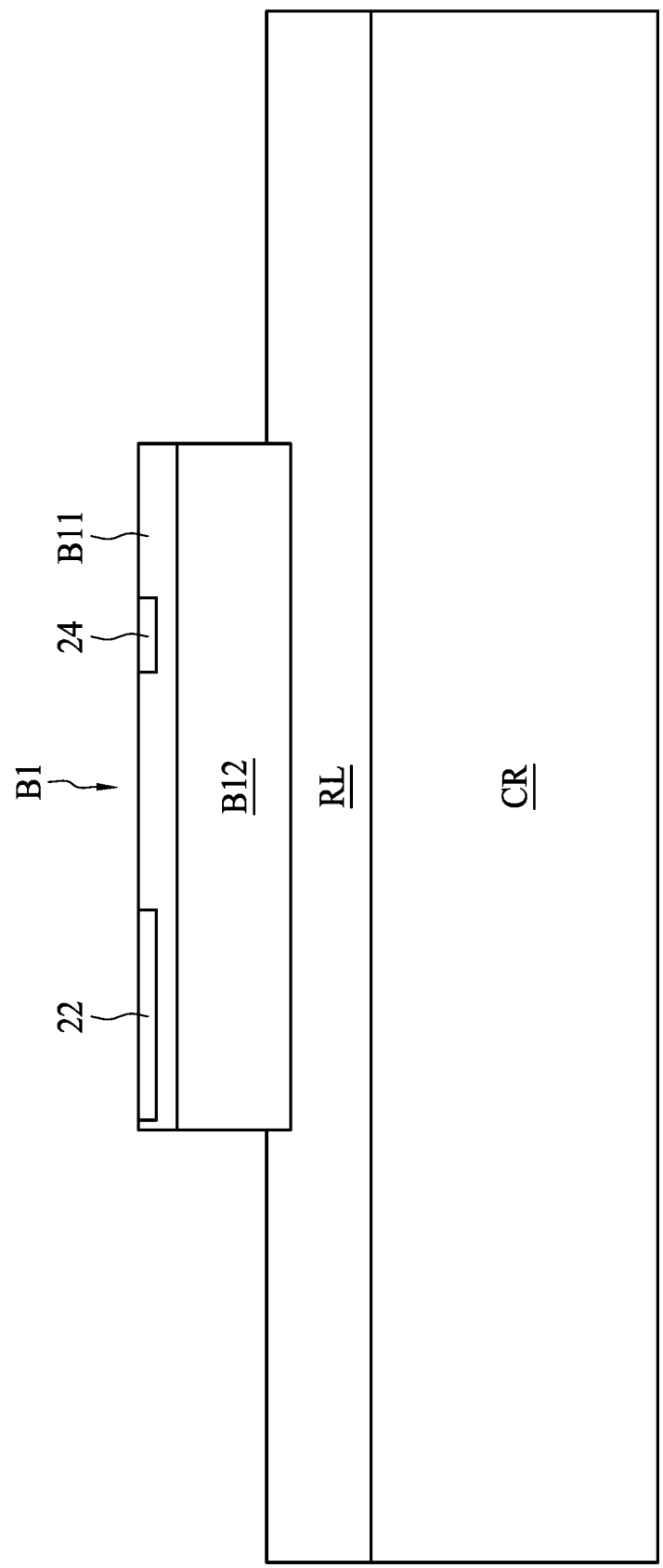

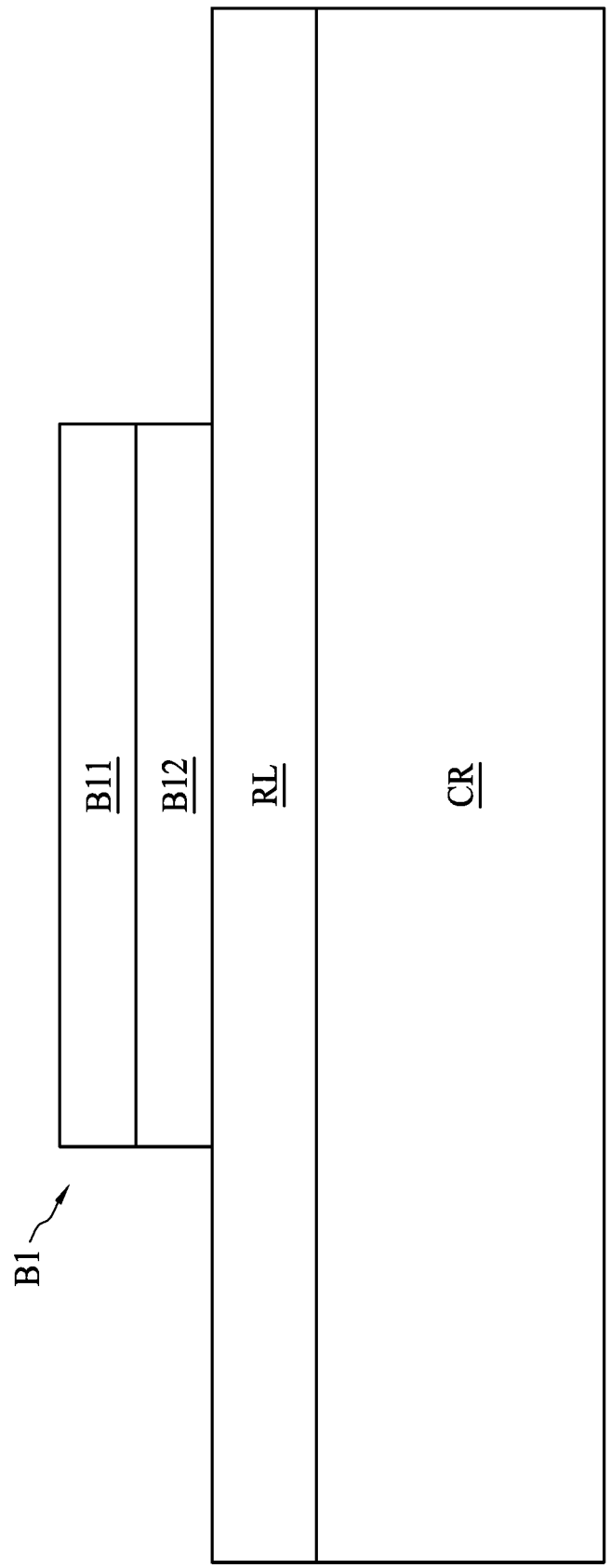

SEMICONDUCTOR DEVICE PACKAGE AND METHOD OF MANUFACTURING THE SAME

CROSS-REFERENCE TO RELATED APPLICATION

This application claims the benefit of and priority to U.S. Provisional Application No. 62/569,390, filed Oct. 6, 2017, the contents of which are incorporated herein by reference in their entireties.

BACKGROUND

1. Technical Field

The present disclosure relates generally to a semiconductor device package, and more particularly, the present disclosure relates to a semiconductor device package including an interposer and a method of manufacturing the same.

2. Description of the Related Art

In 2.5 or 3 dimensional semiconductor packages, a through silicon via (TSV) interposer is often used to achieve fine line or fine pitch connection between different chips. However, a TSV structure may increase the cost or difficulty of manufacturing the semiconductor package. Furthermore, conductive pads of a TSV interposer have uniform size or pitches therebetween and may not support connection between chips with conductive pads of different sizes.

SUMMARY

In one aspect, according to some embodiments, a semiconductor device package includes a first redistribution layer (RDL), a first die, a second die, a second RDL and an encapsulant. The first die is disposed on the first RDL and is electrically connected to the first RDL. The first die has a first electrical contact. The second die is disposed on the first RDL and is electrically connected to the first RDL. The second die has a first electrical contact. The second RDL is surrounded by the first RDL. The second RDL has a first electrical contact electrically connected to the first electrical contact of the first die and a second electrical contact electrically connected to the first electrical contact of the second die. A size of the first electrical contact of the second RDL is greater than a size of the second electrical contact of the second RDL. The encapsulant is disposed on the first RDL and covers the first die and the second die.

In another aspect, according to some embodiments, a method of manufacturing a semiconductor device package includes providing a carrier, disposing an interconnection structure on the carrier, forming a redistribution layer (RDL) on the carrier at least partially surrounding the interconnection structure, disposing a first die and a second die on the RDL and the interconnection structure, and forming an encapsulant on the RDL to cover the first die and the second die.

In yet another aspect, according to some embodiments, a method of manufacturing a semiconductor device package includes providing a carrier, disposing a first die and a second die on the carrier, forming an encapsulant covering the first die and the second die, removing the carrier to expose the first die and the second die, disposing an interconnection structure on the first die and the second die, wherein a first electrical contact of the interconnection structure is electrically connected to the first die and a second electrical contact of the interconnection structure is electrically connected to the second die, and forming a first redistribution layer (RDL) surrounding the interconnection structure.

BRIEF DESCRIPTION OF THE DRAWINGS

Aspects of the present disclosure are best understood from the following detailed description when read with the accompanying drawings. It is noted that various features may not be drawn to scale, and, in the drawings, the dimensions of the depicted features may be arbitrarily increased or reduced for clarity of discussion.

FIG. 3A, FIG. 3B, FIG. 3C, FIG. 3D, FIG. 3E, FIG. 3F, FIG. 3G, FIG. 3H, FIG. 3I, FIG. 3J and FIG. 3K are cross-sectional views of a semiconductor device package fabricated at various stages, in accordance with some embodiments of the present disclosure.

FIG. 4A, FIG. 4B, FIG. 4C, FIG. 4D, FIG. 4E, FIG. 4F, FIG. 4G, FIG. 4H, FIG. 4I, and FIG. 4J are cross-sectional views of a semiconductor device package fabricated at various stages, in accordance with some embodiments of the present disclosure.

Common reference numerals are used throughout the drawings and the detailed description to indicate the same or similar elements. The present disclosure will be more readily understood from the following detailed description taken in conjunction with the accompanying drawings.

DETAILED DESCRIPTION

According to some embodiments of the present disclosure, by replacing the TSV interposer in a semiconductor package with a silicon bridge interposer, which has a redistribution layer (RDL) having pads of different sizes allocated according to the arrangement of different chips for interconnection between the chips, the manufacturing of the semiconductor package can be more cost-effective and flexible.

Figure 1A:
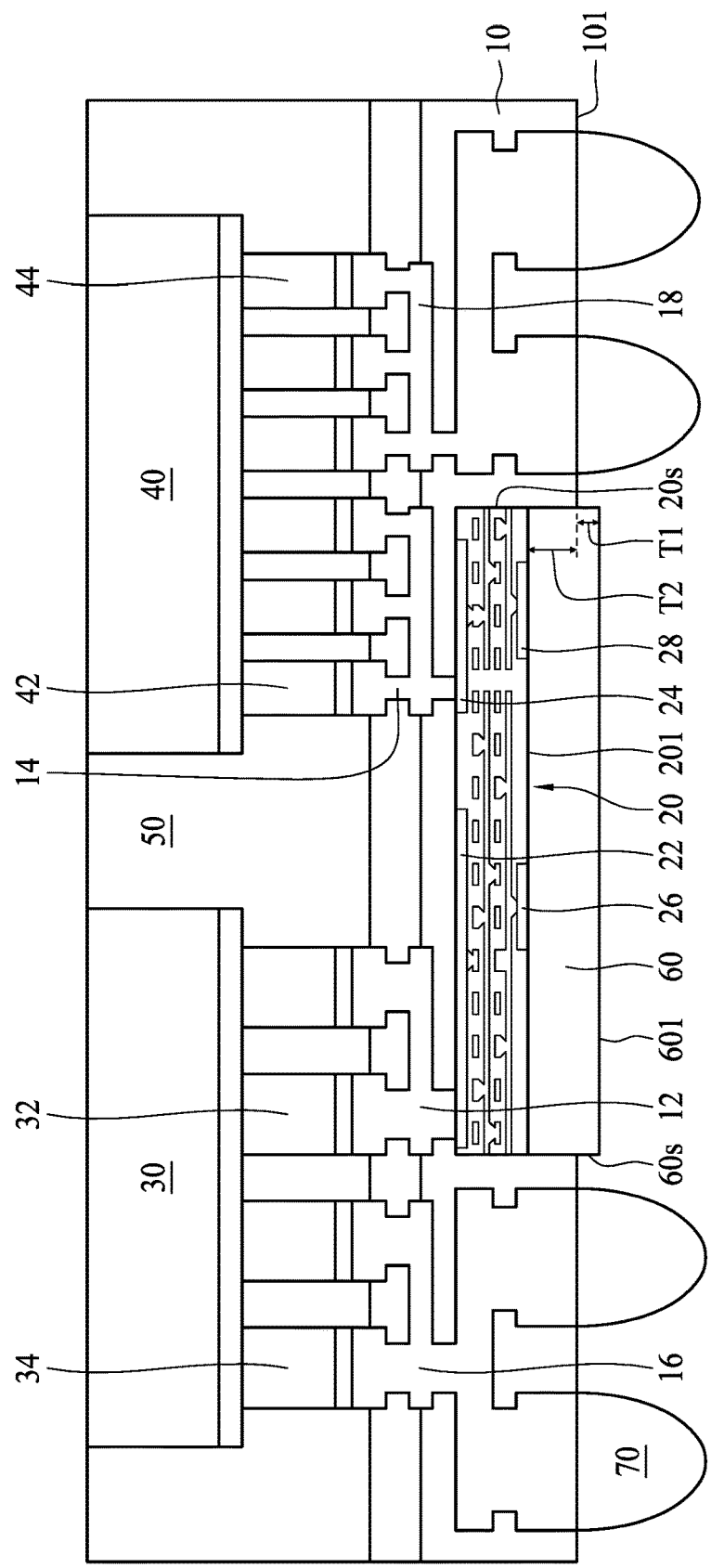
FIG. 1A illustrates a cross-sectional view of a semiconductor device package in accordance with some embodiments of the present disclosure.

FIG. 1A illustrates a cross-sectional view of a semiconductor device package 1a in accordance with some embodiments of the present disclosure.

The semiconductor device package 1a includes a redistribution layer (RDL) 10, an interconnection structure (or an RDL) 20, semiconductor dies 30 and 40, an encapsulant 50, a base portion 60 and connection elements 70.

The semiconductor dies 30 and 40 are disposed on the RDL 10. The semiconductor die 30 and the semiconductor die 40 are electrically connected to the RDL 10. The interconnection structure 20 is surrounded by or embedded in the RDL 10, and has a side wall 20s in contact with the RDL 10. The interconnection structure 20 is electrically connected to the semiconductor die 30 and the semiconductor die 40. The interconnection structure 20 may be referred to as a bridge interposer.

Each of the semiconductor dies 30 and 40 may include a plurality of semiconductor devices, such as, but not limited to, transistors, capacitors and resistors interconnected together by a die interconnection structure into functional circuits to thereby form an integrated circuit. Each of the semiconductor dies 30 and 40 may be any suitable integrated circuit device including, but not limited to, a microprocessor (e.g., single or multi-core), a memory device, a chipset, a graphics device, or an application-specific integrated circuit (ASIC) according to several different embodiments. In some embodiments, the semiconductor die 30 is a memory and the semiconductor die 40 is an ASIC.

The semiconductor die 30 has an electrical contact 32 (also referred to as "a first electrical contact"). The electrical contact 32 is electrically connected to an electrical contact 12 (also referred to as "a fifth electrical contact") of the RDL 10 and an electrical contact 22 (also referred to as "a third electrical contact") of the interconnection structure 20. The semiconductor die 40 has an electrical contact 42 (also referred to as "a second electrical contact"). The electrical contact 42 is electrically connected to an electrical contact 14 (also referred to as "a sixth electrical contact") of the RDL 10 and an electrical contact 24 (also referred to as "a fourth electrical contact") of the interconnection structure 20.

In the embodiment shown in FIG. 1A, the electrical contact 32 of the semiconductor die 30 is connected to the electrical contact 22 of the interconnection structure 20 through the electrical contact 12 of the RDL 10. In another embodiment, the electrical contact 12 of the RDL 10 may be omitted and the electrical contact 32 of the semiconductor die 30 may be directly connected to the electrical contact 22 of the interconnection structure 20. In the embodiment shown in FIG. 1A, the electrical contact 42 of the semiconductor die 40 is connected to the electrical contact 24 of the interconnection structure 20 through the electrical contact 14 of the RDL 10. In another embodiment, the electrical contact 14 of the RDL 10 may be omitted and the electrical contact 42 of the semiconductor die 40 may be directly connected to the electrical contact 24 of the interconnection structure 20.

In some embodiments, a size (e.g., a width or a diameter) of the electrical contact 32 of the semiconductor die 30 is different from a size of the electrical contact 42 of the semiconductor die 40. For example, the size of the electrical contact 32 of the semiconductor die 30 may be greater than the size of the electrical contact 42 of the semiconductor die 40. The size of the electrical contact 32 of the semiconductor die 30 and/or the size of the electrical contact 42 of the semiconductor die 40 may be less than 2 μm, e.g., about 0.4 μm. In some embodiments, a size of the electrical contact 12 of the RDL 10 is different from a size of the electrical contact 14 of the RDL 10. For example, the size of the electrical contact 12 of the RDL 10 may be greater than the size of the electrical contact 14 of the RDL 10. In some embodiments, a size of the electrical contact 22 of the interconnection structure 20 is different from a size of the electrical contact 24 of the interconnection structure 20. For example, the size of the electrical contact 22 of the interconnection structure 20 may be greater than a size of the electrical contact 24 of the interconnection structure 20. The size of the electrical contact 22 of the interconnection structure 20 and/or the size of the electrical contact 24 of the interconnection structure 20 may be less than 2 μm, e.g., about 0.4 μm. In some embodiments, the size of the electrical contact 22 of the interconnection structure 20 corresponds to the size of the electrical contact 32 of the semiconductor die 30. In some embodiments, the size of the electrical contact 24 of the interconnection structure 20 corresponds to the size of the electrical contact 42 of the semiconductor die 40. As shown in FIG. 1A, the interconnection structure 20 may have an electrical contact 26 (also referred to as "a fifth electrical contact") and an electrical contact 28 facing opposite the electrical contacts 22 and 24. The interconnection structure 20 may have an insulation material or a dielectric material surrounding the electrical contacts 22, 24, 26 and 28. The interconnection structure 20 may have conductive structures (e.g., conductive traces, lines, vias or pillars) electrically connecting the electrical contacts 22, 24, 26 and/or 28.

The semiconductor die 30 may have a plurality of electrical contacts 32. The semiconductor die 40 may have a plurality of electrical contacts 42. A pitch of the electrical contacts 32 of the semiconductor die 30 may be greater than a pitch of the electrical contacts 42 of the semiconductor die 40. The interconnection structure 20 may have a plurality of electrical contacts 22 and a plurality of electrical contacts 24. A pitch of the electrical contacts 22 may be greater than a pitch of the electrical contacts 24. The pitch of the electrical contacts 22 of the interconnection structure 20 may correspond to the pitch of the electrical contacts 32 of the semiconductor die 30. The pitch of the electrical contacts 24 of the interconnection structure 20 may correspond to the pitch of the electrical contacts 42 of the semiconductor die 40. The interconnection structure 20 may provide fine line or fine pitch connection between the electrical contact 32 of the semiconductor die 30 and the electrical contact 42 of the semiconductor die 40.

The semiconductor die 30 has an electrical contact 34 (also referred to as "a ninth electrical contact") electrically connected to an electrical contact 16 (also referred to as "a seventh electrical contact") of the RDL 10. The semiconductor die 40 has an electrical contact 44 (also referred to as "a tenth electrical contact") electrically connected to an electrical contact 18 (also referred to as "an eighth electrical contact") of the RDL 10. A size of the electrical contact 34 may be the same as or different from the size of the electrical contact 32 of the semiconductor die 30. A size of the electrical contact 44 may be the same as or different from the size of the electrical contact 42 of the semiconductor die 40. A size of the electrical contact 16 and/or a size of the electrical contact 18 of the RDL 10 may be the same as or different from the size of the electrical contact 12 and/or the size of the electrical contact 14 of the first RDL 10. For example, the size of the electrical contact 16 and/or the size of the electrical contact 18 of the RDL 10 may be greater than the size of the electrical contact 12 and/or the size of the electrical contact 14 of the first RDL 10.

The RDL 10 may include but is not limited to, for example, a single-layer structure or a multi-layer structure. The RDL 10 may include but is not limited to, for example, conductive vias, traces or pads.

The base portion 60 is disposed on a surface 201 of the interconnection structure 20. The base portion 60 is in contact with the interconnection structure 20. A side wall 60s of the base portion 60 is in contact with the RDL 10. The base portion 60 is at least partially surrounded by the RDL 10. As shown in FIG. 1A, an upper portion of the base portion 60 is covered by the RDL 10, and a lower portion of the base portion 60 protrudes beyond the RDL 10. A thickness T1 of the lower portion (or the protruded portion) of the base portion 60 may be equal to or less than 8 micrometers (μm). A thickness T2 of the upper portion of the base portion 60 may be greater than 8 μm. In some embodiments, the thickness T1 of the lower portion of the base portion 60 may be greater than 8 μm. The thickness T2 of the upper portion of the base portion 60 may be equal to or less than 8 μm. A surface 601 of the base portion 60 is exposed from the RDL 10. A portion of the side wall 60s of the base portion 60 is exposed from the RDL 10. In some embodiments, a protruded portion of the base portion 60 may facilitate heat dissipation of the semiconductor device package 1a. In some other embodiments, the base portion 60 does not protrude beyond the RDL 10 and the surface 601 is coplanar with a surface 101 of the RDL 10. In some embodiments, the base portion 60 includes silicon. The base portion 60 may increase the overall structural strength of the semiconductor device package 1a. The base portion 60 and the interconnection structure 20 may together form a bridge interposer.

The encapsulant 50 is disposed on the RDL 10 and covers the semiconductor dies 30 and 40. The encapsulant 50 encapsulates the semiconductor dies 30 and 40. The encapsulant 50 may include but is not limited to resin and particles (or fillers).

The connection elements 70 are disposed on the surface 101 of the RDL 10. The connection elements 70 are electrically connected to conductive lines, traces, vias or pillars in the RDL 10. The connection elements 70 may include solder.

Figure 1B:
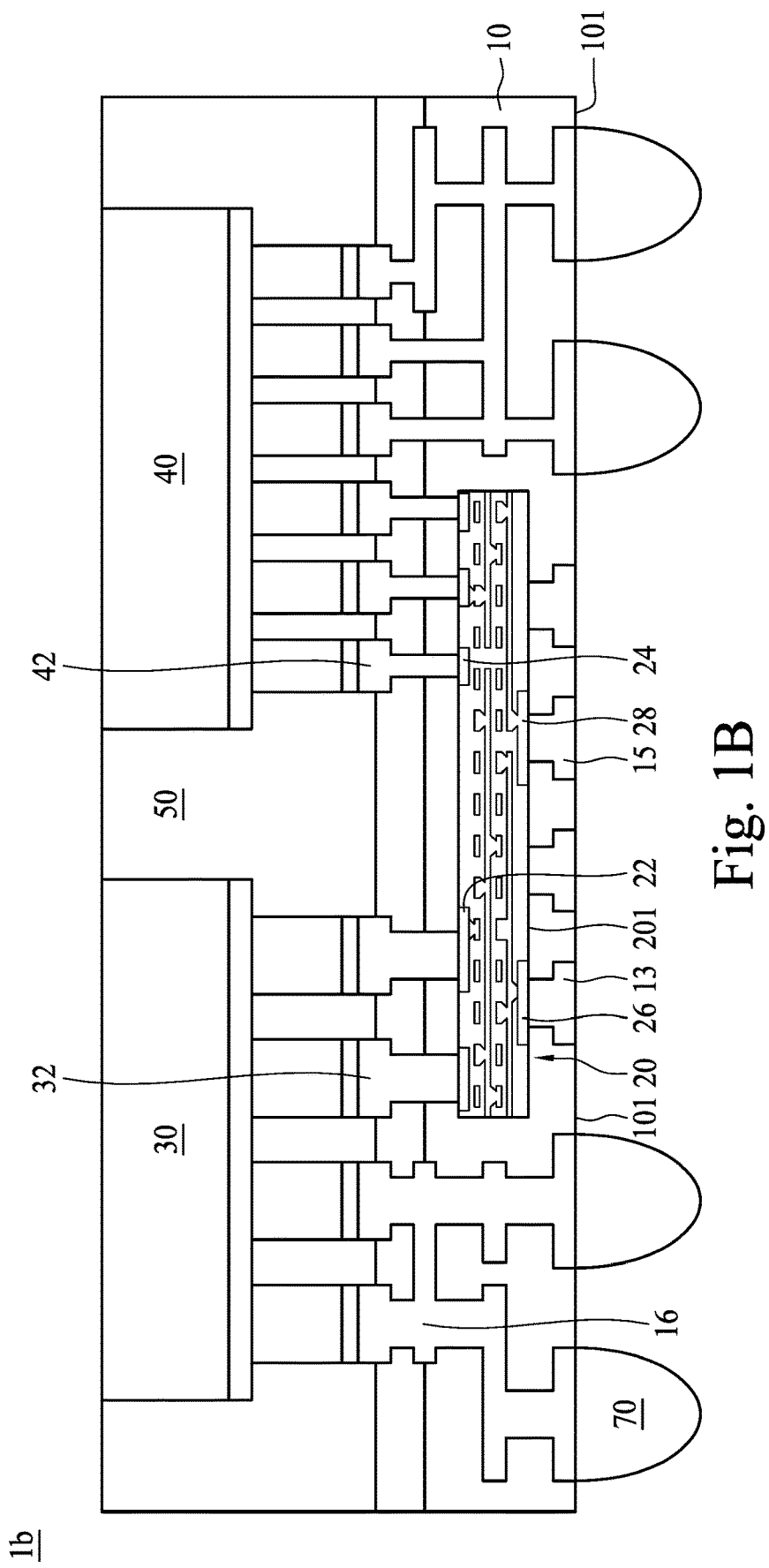
FIG. 1B illustrates a cross-sectional view of a semiconductor device package in accordance with some embodiments of the present disclosure.

FIG. 1B illustrates a cross-sectional view of a semiconductor device package 1b in accordance with some embodiments of the present disclosure. The semiconductor device package 1b is similar to the semiconductor device package 1a with some differences described below.

The base portion 60 in FIG. 1A is omitted. The surface 201 is covered by the RDL 10. The RDL 10 has a conductor (e.g., a conductive trace, line, via or pillar) 13 electrically connected to the electrical contact 26 of the interconnection structure 20 and a conductor 15 electrically connected to the electrical contact 28 of the interconnection structure 20. The conductors 13 and 15 may be electrically connected to the semiconductor die 30 and/or the semiconductor die 40 through the interconnection structure 20. The conductors 13 and 15 are exposed from the surface 101 of the RDL 10 and may function as input/output interfaces for the semiconductor device package 1b. The semiconductor device package 1b may be thinner than the semiconductor device 1a. The electrical contact 32 of the semiconductor die 30 and the electrical contact 42 of the semiconductor die 40 are connected to the electrical contact 22 and the electrical contact 24, respectively. The interconnection structure 20 may provide fine line or fine pitch connection between the electrical contact 32 of the semiconductor die 30 and the electrical contact 42 of the semiconductor die 40. The electrical contact 32 of the semiconductor die 30 and the electrical contact 42 of the semiconductor die 40 may have different sizes.

Figure 1C:
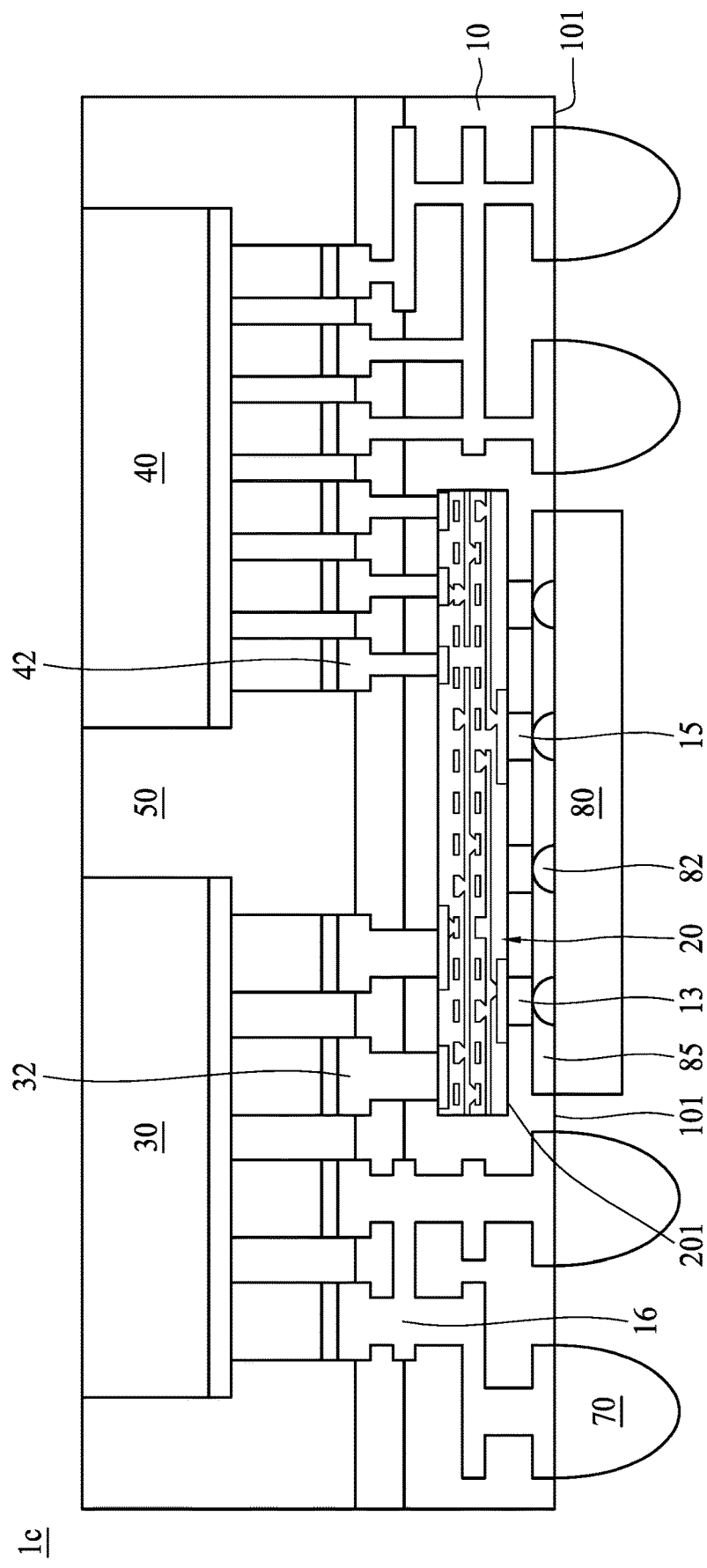
FIG. 1C illustrates a cross-sectional view of a semiconductor device package in accordance with some embodiments of the present disclosure.

FIG. 1C illustrates a cross-sectional view of a semiconductor device package 1c in accordance with some embodiments of the present disclosure. The semiconductor device package 1c is similar to the semiconductor device package 1b with some differences described below.

A semiconductor die 80 is disposed on the conductors 13 and 15 of the RDL 10. The semiconductor die 80 may have similar features as the semiconductor dies 30 and 40. The semiconductor die 80 has conductors (e.g., conductive pads or bumps) 82 electrically connected to the conductors 13 and 15 of the RDL 10. The conductors 82 of the semiconductor die 80 may be electrically connected to the electrical contact 26 of the interconnection structure 20 and/or the electrical contact 28 of the interconnection structure 20. The semiconductor die 80 is electrically connected to the semiconductor die 30 and/or the semiconductor die 40 through the interconnection structure 20. The conductors 82 of the semiconductor die 80 are surrounded by an underfill 85. The underfill 85 is disposed between the semiconductor die 80 and the RDL 10. The underfill 85 is at least partially surrounded by the RDL 10. The semiconductor die 80 may be partially surrounded by the RDL 10, which may provide sufficient stand-off tolerance for the connection elements 70 and may reduce the total height of the semiconductor device package 1c. Sufficient stand-off for the connection elements 70 may prevent non-contact issue when the connection elements 70 are connected to another electronic device.

Figure 1D:
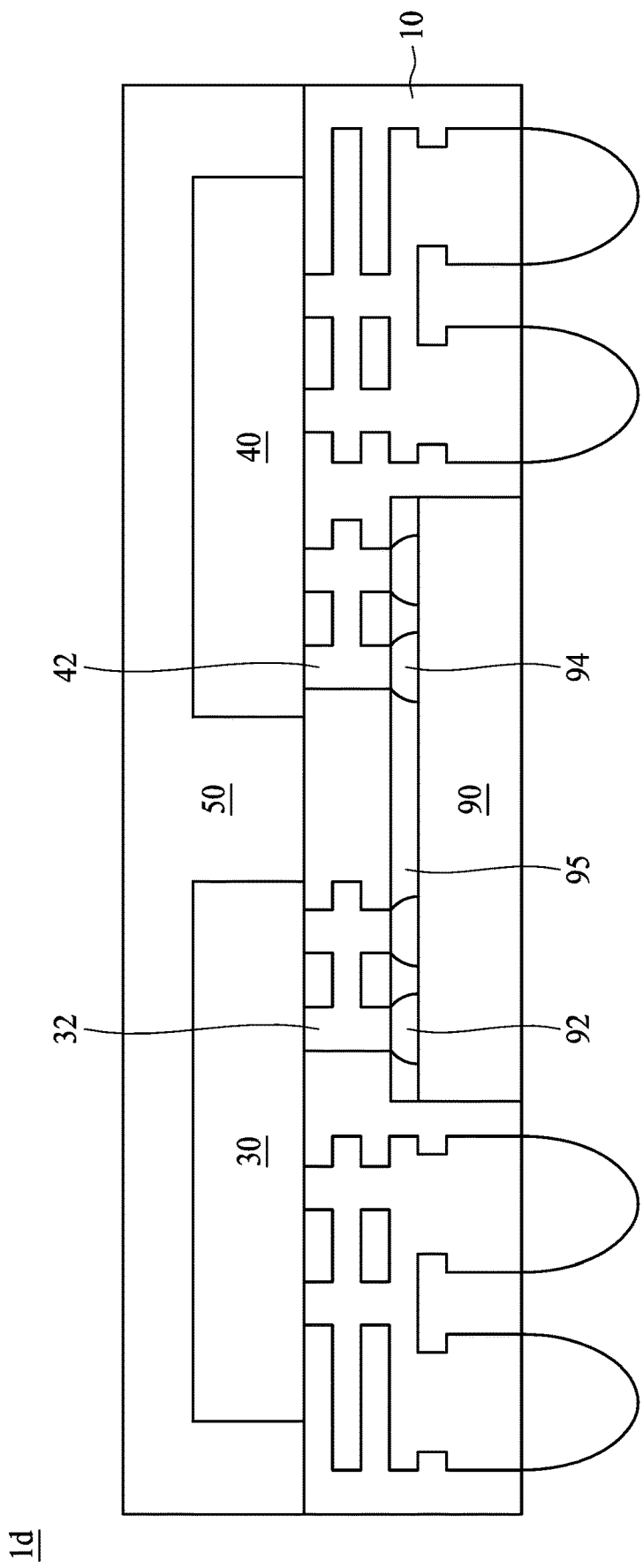
FIG. 1D illustrates a cross-sectional view of a semiconductor device package in accordance with some embodiments of the present disclosure.

FIG. 1D illustrates a cross-sectional view of a semiconductor device package 1d in accordance with some embodiments of the present disclosure. The semiconductor device package 1d is similar to the semiconductor device package 1a except that the interconnection structure 20 and the base portion 60 are replaced by a bridge interposer 90.

The bridge interposer 90 includes conductors (e.g., conductive bump or pad) 92 and 94 electrically connected to the electrical contact 32 of the semiconductor die 30 and the electrical contact 42 of the semiconductor die 40. The conductors 92 and 94 are surrounded by an underfill 95. The underfill 95 may include resin and fillers.

Figure 1E:
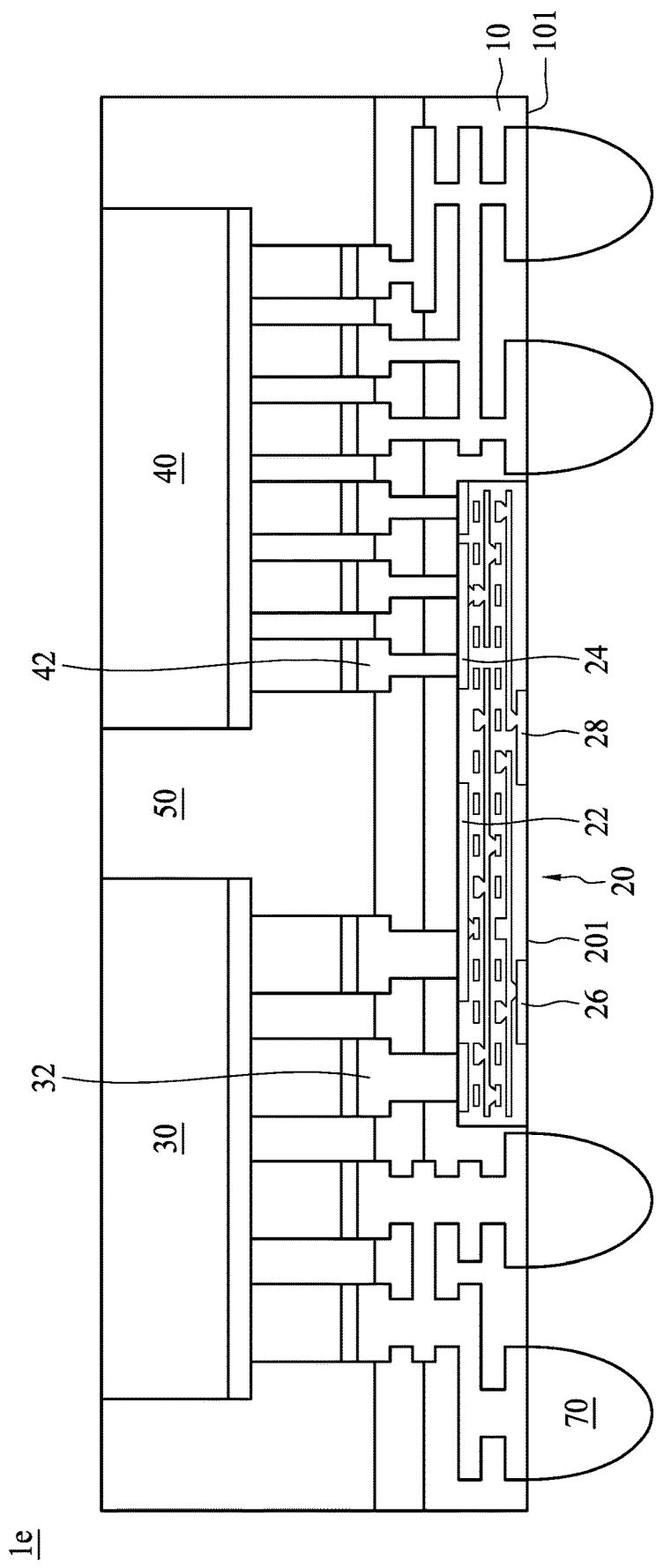
FIG. 1E illustrates a cross-sectional view of a semiconductor device package in accordance with some embodiments of the present disclosure.

FIG. 1E illustrates a cross-sectional view of a semiconductor device package 1e in accordance with some embodiments of the present disclosure. The semiconductor device package 1e is similar to the semiconductor device package 1a except that the base portion 60 in FIG. 1A is omitted.

The surface 201 of the interconnection structure 20 is exposed from the RDL 10. The surface 201 of the interconnection structure 20 is coplanar with the surface 101 of the RDL 10. The electrical contacts 26 and 28 are exposed from the surface 201 of the interconnection structure 20. The electrical contacts 26 and 28 of the interconnection structure 20 may provide external electrical connection for the semiconductor device package 1e. For example, the electrical contact 26 and/or the electrical contact 28 may be connected to another electronic component.

FIG. 2A, FIG. 2B, FIG. 2C, FIG. 2D, FIG. 2E and FIG. 2F are cross-sectional views of a bridge interposer 2f fabricated at various stages, in accordance with some embodiments of the present disclosure. Various figures have been simplified for a better understanding of the aspects of the present disclosure.

Figure 2A:
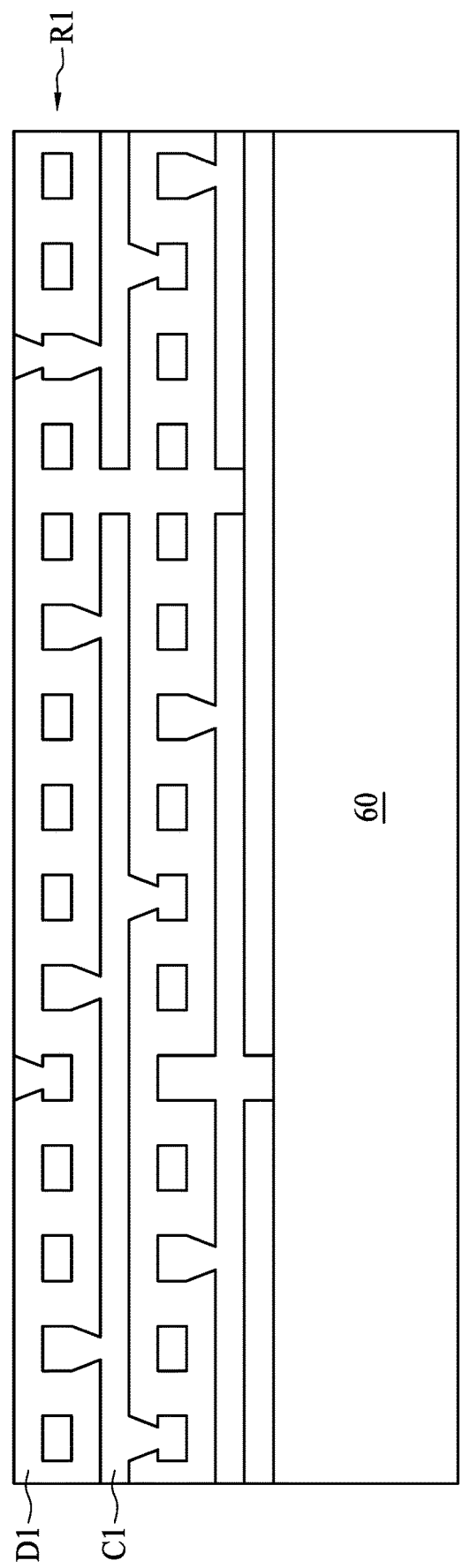
FIG. 2A, FIG. 2B, FIG. 2C, FIG. 2D, FIG. 2E and FIG. 2F are cross-sectional views of a bridge interposer fabricated at various stages, in accordance with some embodiments of the present disclosure.

Referring to FIG. 2A, a base portion 60 is provided. A redistribution layer (RDL) R1 is disposed on the base portion 60. The base portion 60 in FIG. 2A is similar to or the same as the base portion 60 as described and illustrated with reference to FIG. 1A. The RDL R1 includes a dielectric material D1 and a conductive structure C1 surrounded by the dielectric material D1.

Figure 2B:
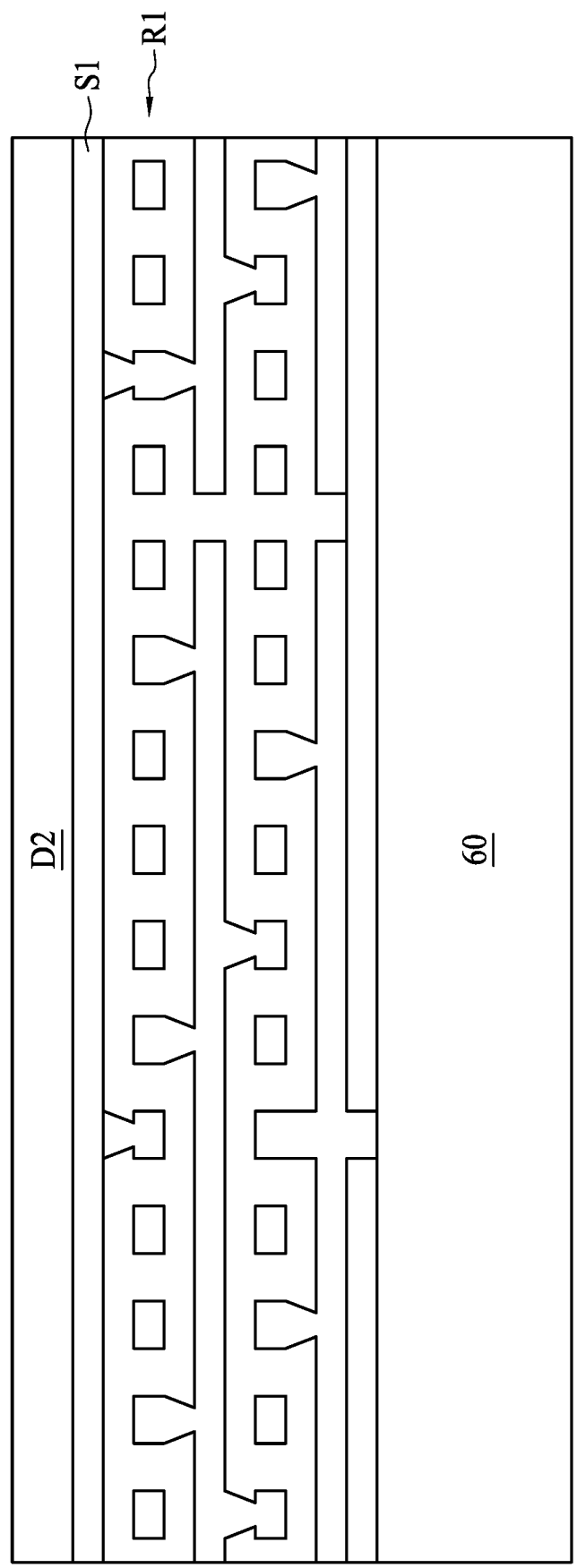

Referring to FIG. 2B, a stop layer S1 is formed on the RDL R1, and a dielectric material D2 is formed on the stop layer S1. The stop layer S1 may include but is not limited to, for example, metal or other suitable materials. The stop layer S1 may resist etchant used to etch or remove the dielectric material D2 formed thereon. The stop layer S1 may be formed by deposition technique, coating technique or sputtering technique. The dielectric material D2 may be formed by coating technique.

Figure 2C:
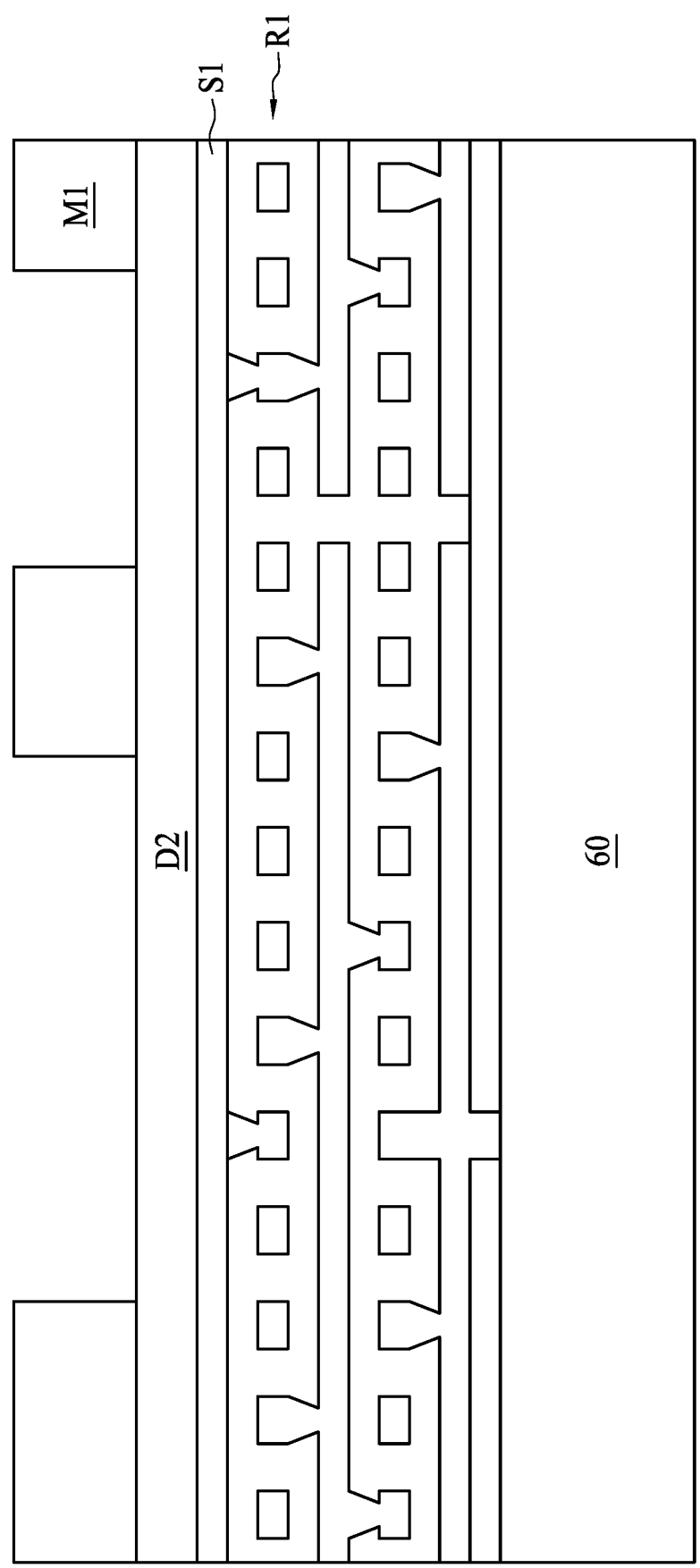

Referring to FIG. 2C, a patterned mask layer (e.g. photosensitive resist (PR) layer) M1 is formed on the dielectric material D2. The patterned mask layer M1 may be formed by photolithography technique. The patterned mask layer M1 may be formed by coating technique. The patterned mask layer M1 may be formed by exposure technique. The patterned mask layer M1 may be formed by development technique. An exposure operation is performed on the portions of the dielectric material D2 exposed from the patterned mask layer M1.

Figure 2D:
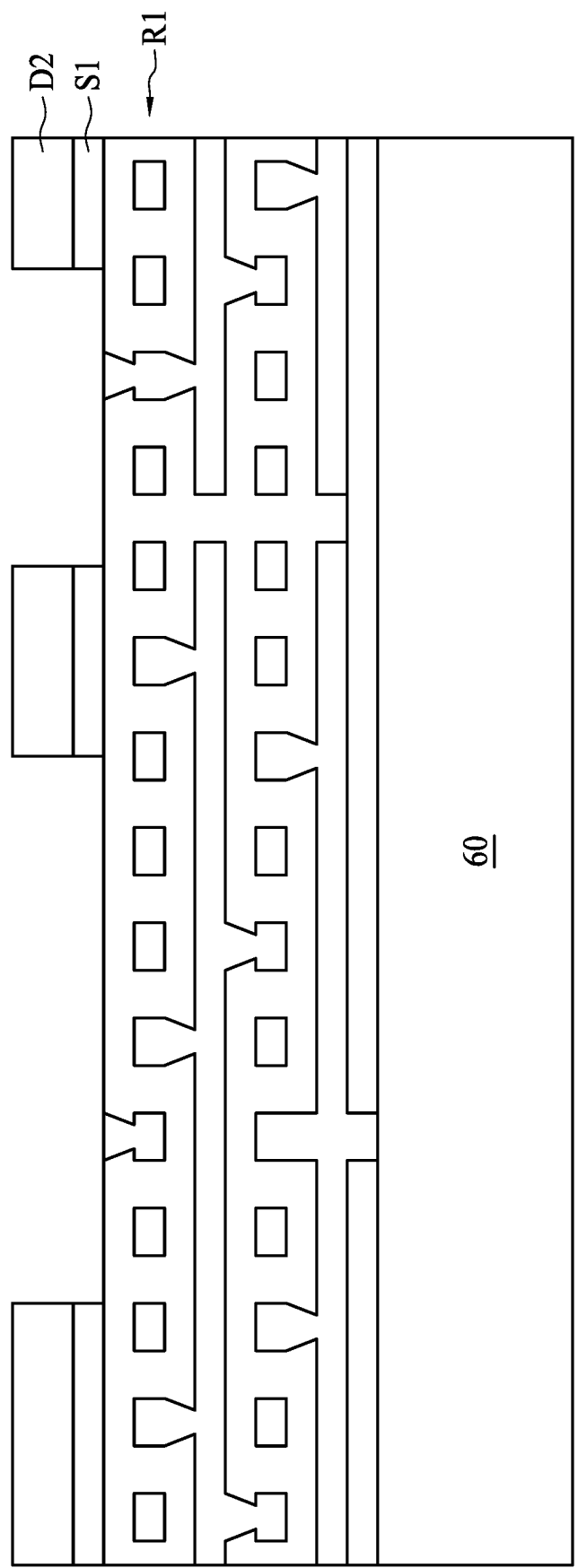

Referring to FIG. 2D, the stop layer S1 and the dielectric material D2 which are not covered by the patterned mask layer M1 are removed. The patterned mask layer M1 is removed. The stop layer S1 and the dielectric material D2 may be removed by etching technique. The stop layer S1 may be etched by a first etchant. The dielectric material D2 may be etched by a second etchant. The first etchant may be different from the second etchant. The patterned mask layer M1 may be removed by chemical technique or optical technique.

Figure 2E:
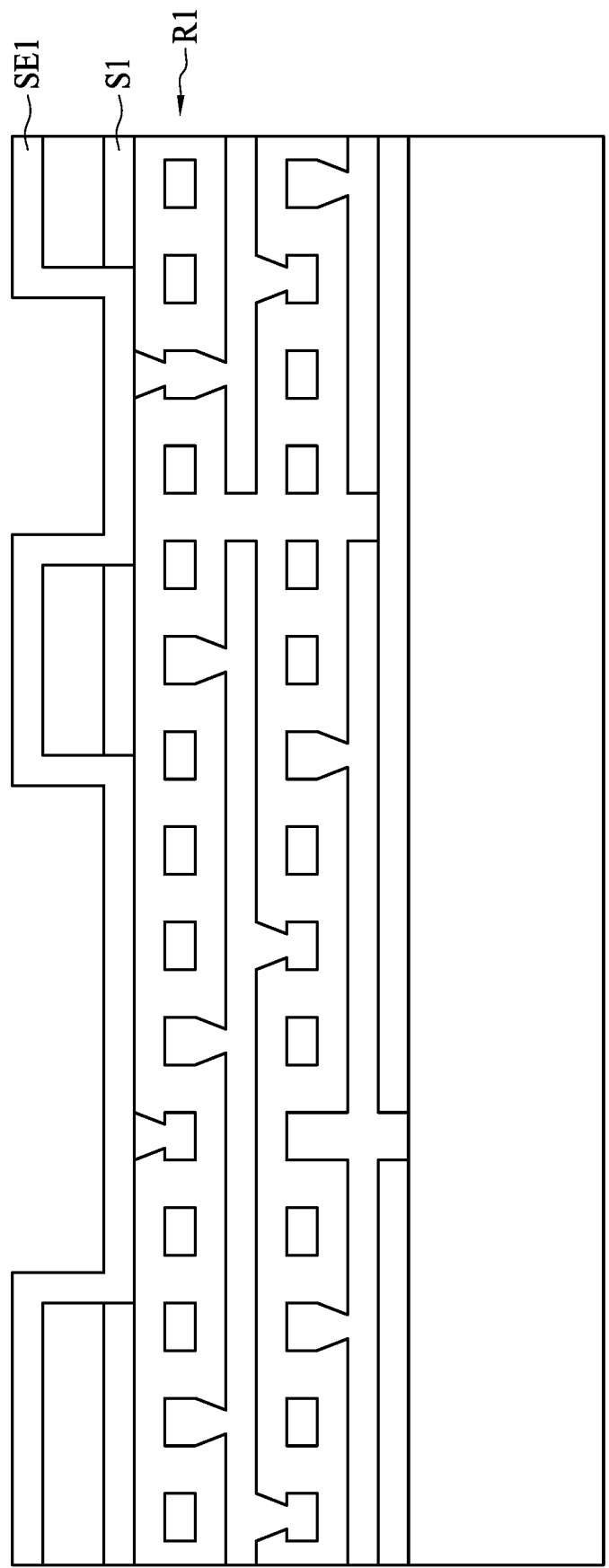

Referring to FIG. 2E, a seed layer SE1 is conformally formed on the structure as shown in FIG. 2D. The seed layer SE1 may include but is not limited to, for example, titanium (Ti), copper (Cu), or other suitable metals, alloy or conductive materials. The seed layer SE1 may be formed by deposition technique or sputtering technique.

Figure 2F:
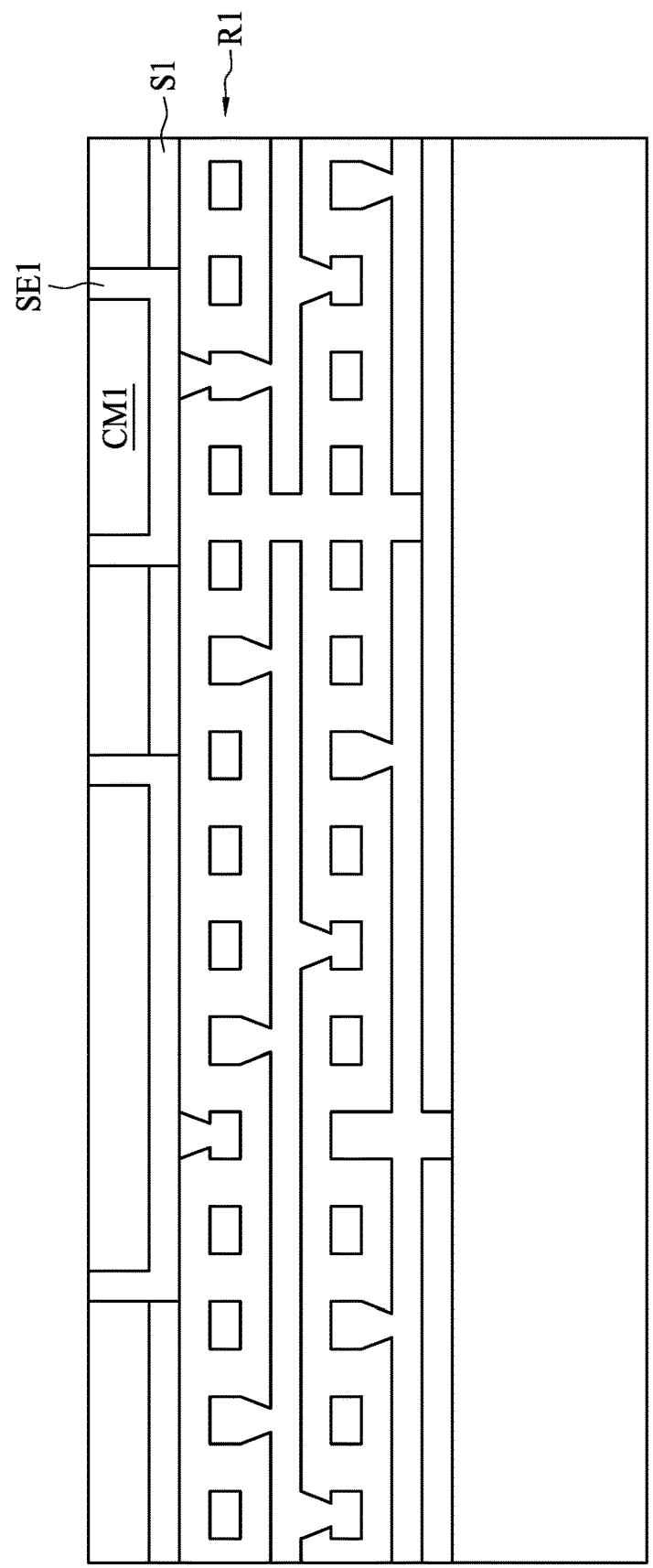

Referring to FIG. 2F, a conductive material CM1 is formed on the seed layer SE1. A portion of the conductive material CM1 and a portion of the seed layer SE1 are removed. The conductive material CM1 may include but is not limited to, for example, copper (Cu), aluminum (Al) or other suitable metals or alloy. The conductive material CM1 may be formed by plating technique, deposition technique or sputtering technique. The conductive material CM1 may be planarized, thinned or ground. The conductive material CM1 may be planarized, thinned or ground by Chemical-Mechanical Planarization (CMP) technique, grinding technique, sandblast technique or etching technique. The conductive material CM1 may be planarized, thinned or ground to form the electrical contacts 22 and 24 of the interconnection structure 20 as described and illustrated with reference to FIG. 1A, FIG. 1B, FIG. 1C and FIG. 1E, wherein the electrical contacts 22 and 24 may have different sizes. The seed layer SE1 on the dielectric material D2 is removed to form the bridge interposer 2f. The seed layer SE1 may be removed by etching technique. The interconnection structure 20 in FIG. 1A, FIG. 1B, FIG. 1C, and FIG. 1E may have similar manufacturing methods as the interposer 2f.

FIG. 3A, FIG. 3B, FIG. 3C, FIG. 3D, FIG. 3E, FIG. 3F, FIG. 3G, FIG. 3H, FIG. 3I, FIG. 3J and FIG. 3K are cross-sectional views of a semiconductor device package 3k fabricated at various stages, in accordance with some embodiments of the present disclosure. Various figures have been simplified for a better understanding of the aspects of the present disclosure.

Figure 3A:
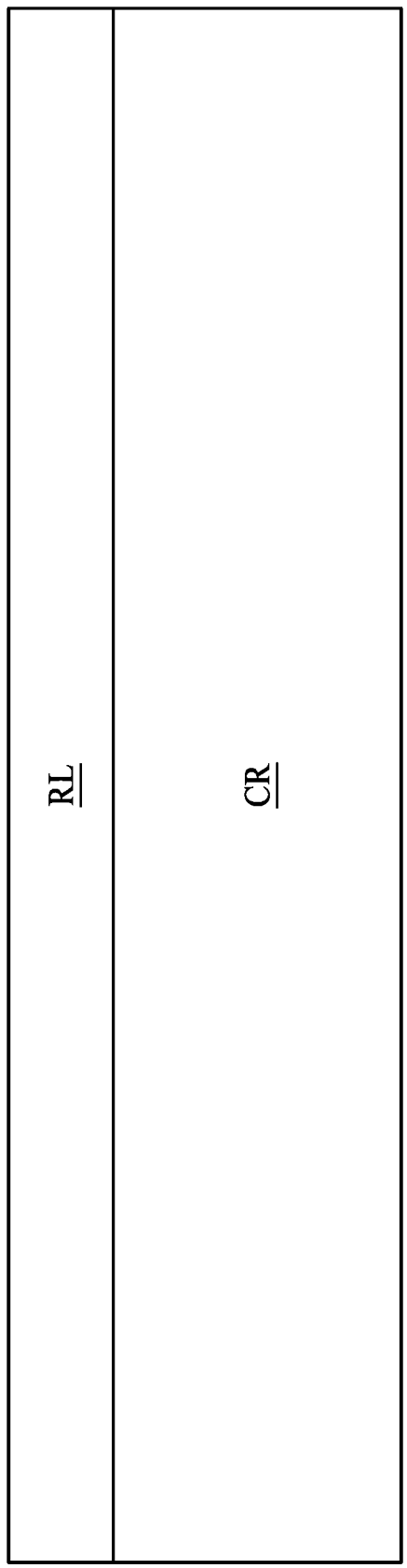

Referring to FIG. 3A, a release layer RL is provided on a carrier CR. The carrier CR may include glass. Referring to FIG. 3B, a bridge interposer B1 is disposed on the release layer RL. The bridge interposer B1 includes an interconnection structure B11 and a base portion B12. The bridge interposer B1 is similar to or the same as the bridge interposer 2f in FIG. 2F. The interconnection structure B11 is similar to or the same as the interconnection structure 20 as described and illustrated with reference to FIG. 1A, FIG. 1B, FIG. 1C and FIG. 1E. The interconnection structure B11 includes electrical contacts 22 and 24. The base portion B12 is similar to or the same as the base portion 60 as described and illustrated with reference to FIG. 1A. A portion of the bridge interposer B1 protrudes into the release layer RL.

Figure 3C:
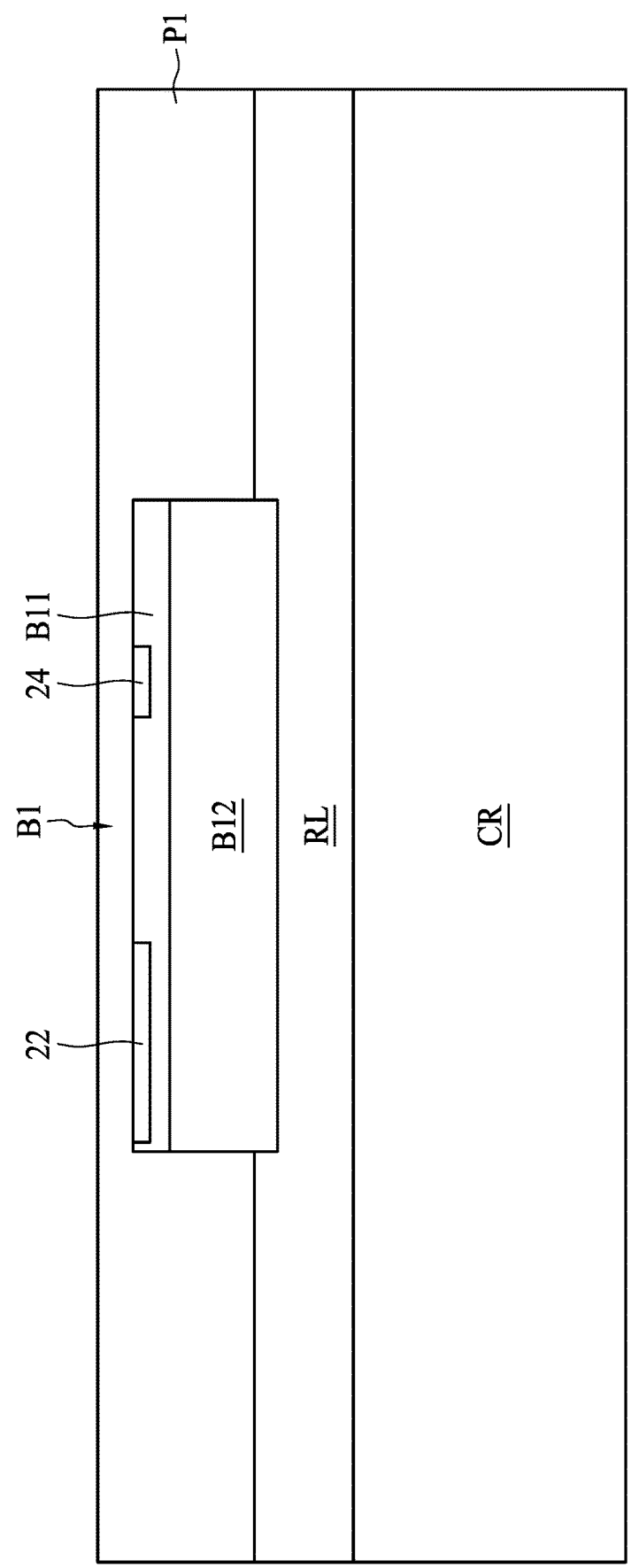
Figure 3D:
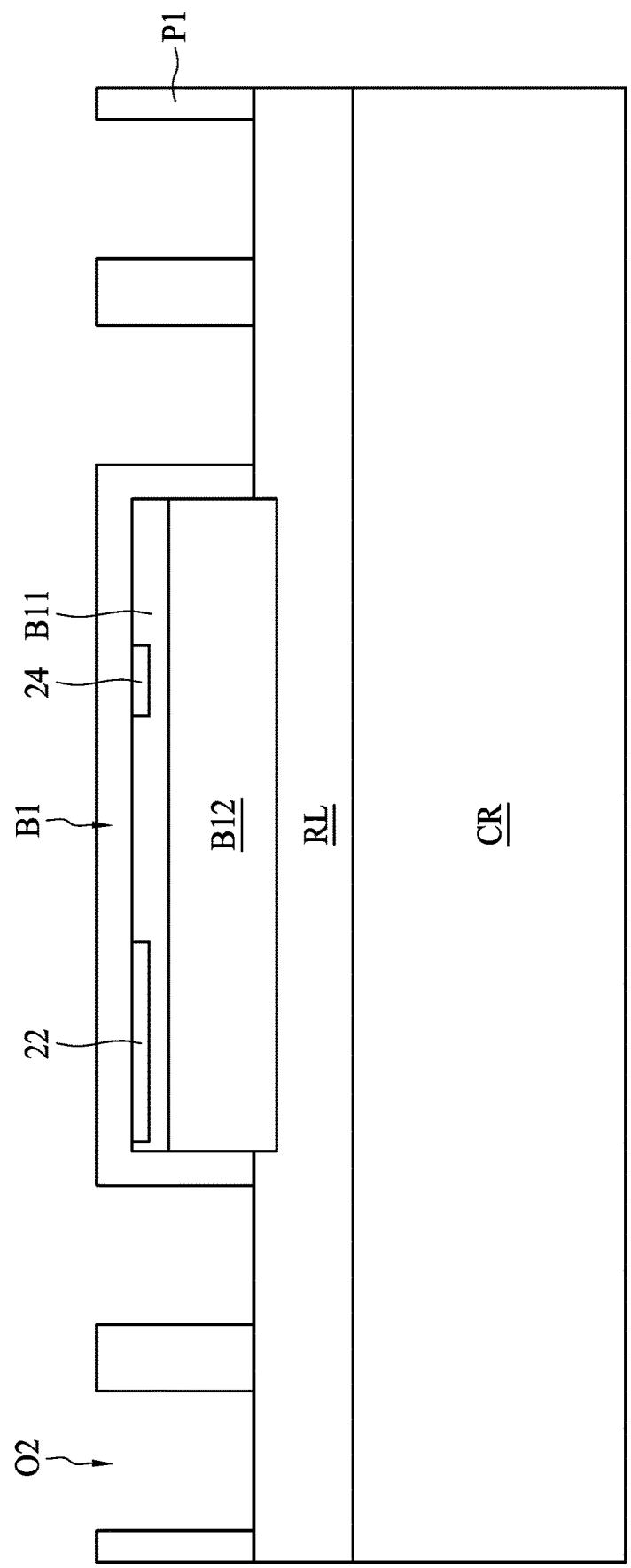

Referring to FIG. 3C, a passivation layer (e.g. PI) P1 is formed on the release layer RL to cover the bridge interposer B1. The passivation layer P1 may be formed by coating technique. Referring to FIG. 3D, the passivation layer P1 is patterned to define a number of openings O1. The passivation layer P1 may be patterned by optical technique, mechanical technique or chemical technique.

Figure 3E:
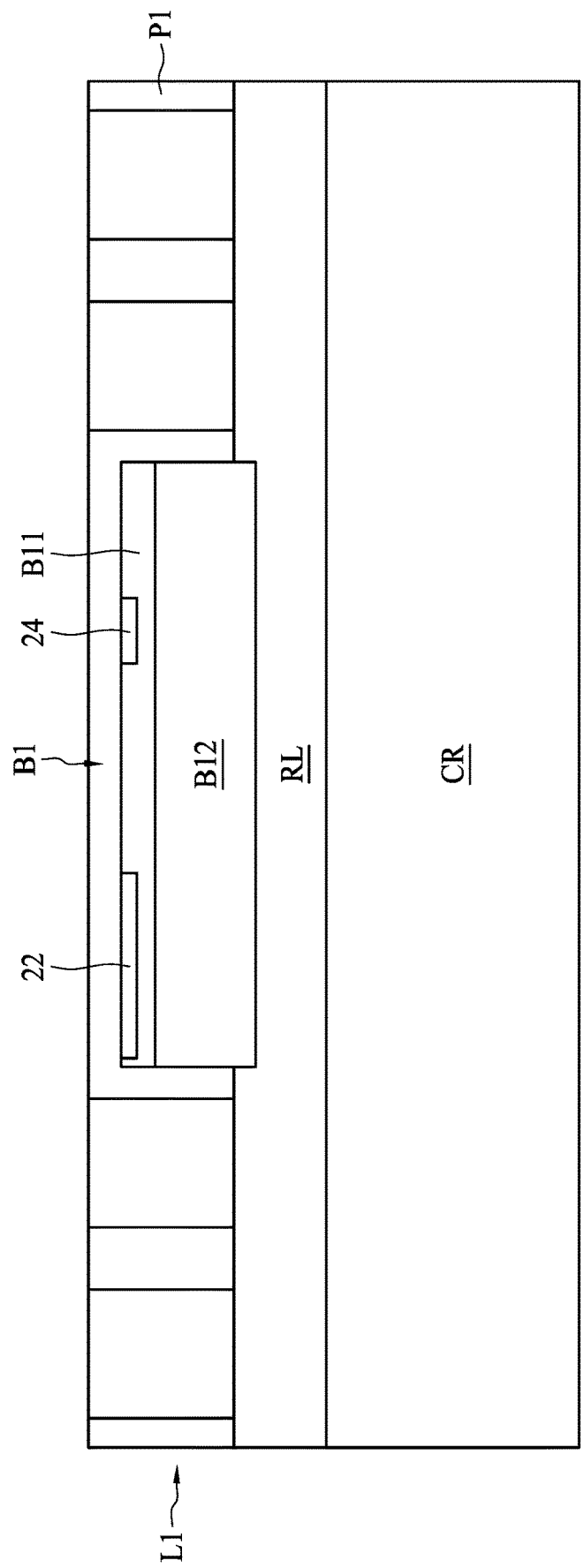
Figure 3F:
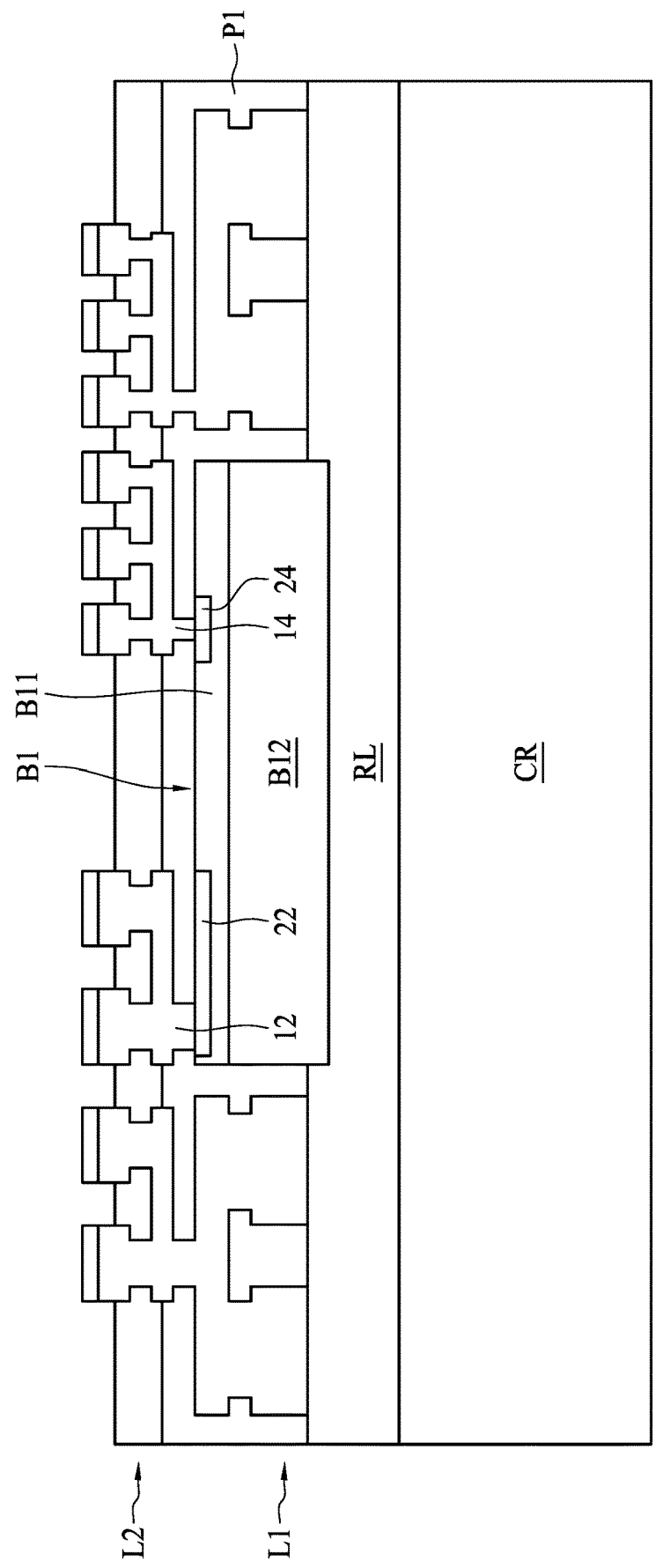

Referring to FIG. 3E, a conductive material (e.g. Cu layer) is formed in the openings O1 to form a redistribution layer L1. In forming the redistribution layer L1, a seed layer may be formed on the patterned passivation layer P1 and the release layer RL exposed by the openings O1, and the conductive material is formed on the seed layer. A portion of the seed layer and the conductive material may be removed to form the RDL L1. The RDL L1 surrounds the bridge interposer B1. Referring to FIG. 3F, an RDL L2 is formed on the RDL L1. Electrical contacts 12 and 14 are formed to be connected with the electrical contacts 22 and 24 of the interconnection structure B11.

Figure 3G:
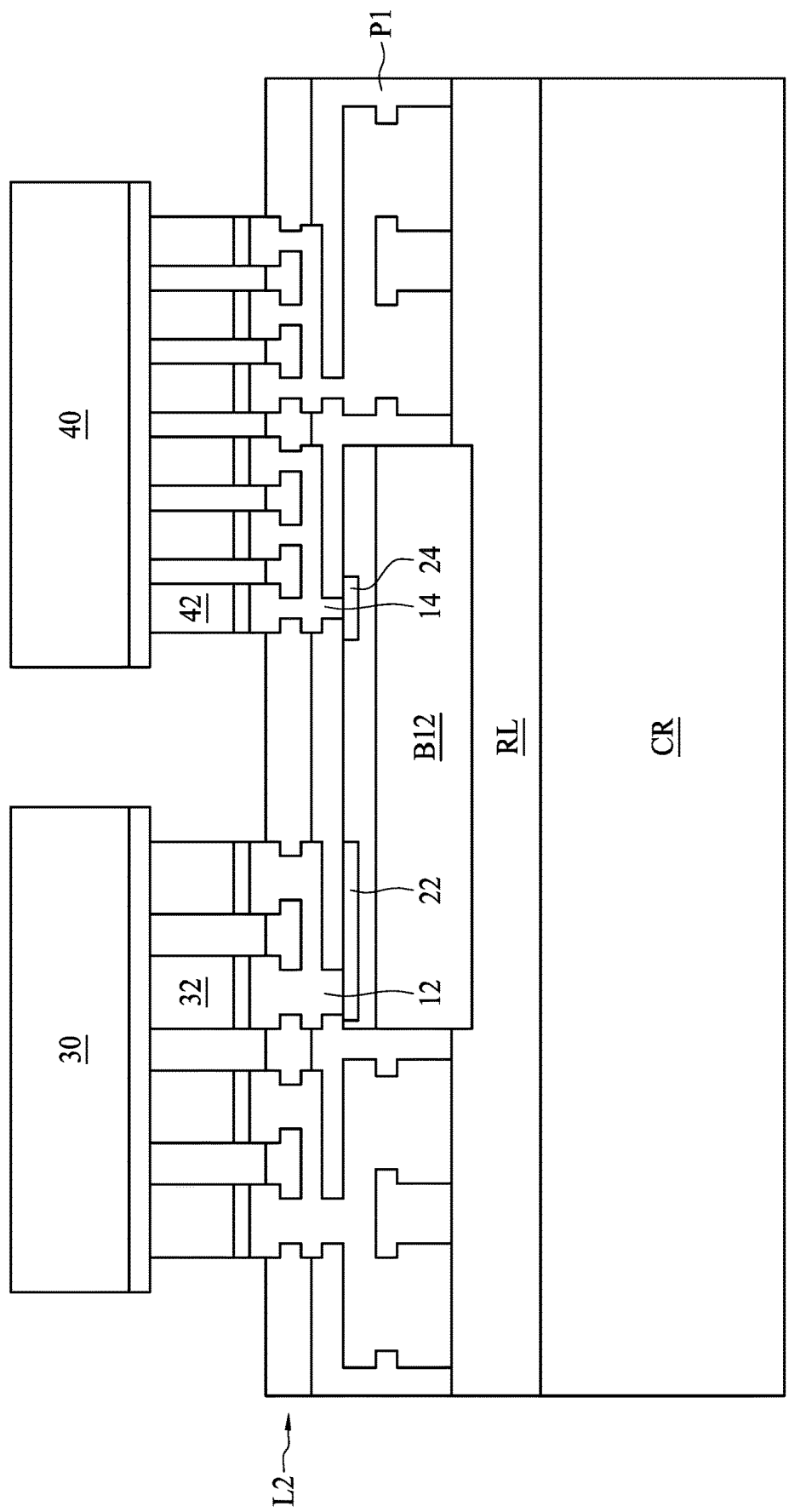
Figure 3H:
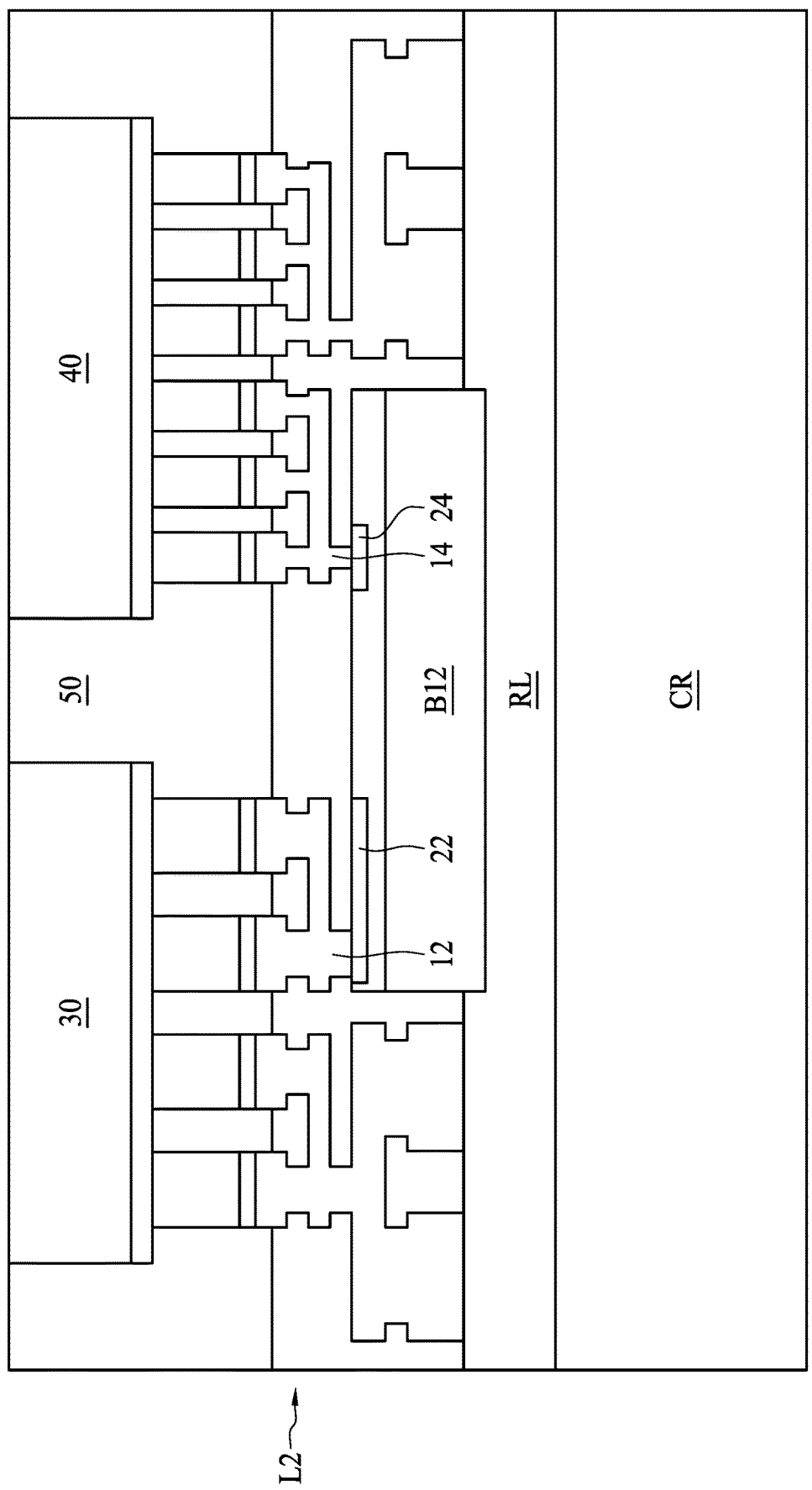
Figure 3I:
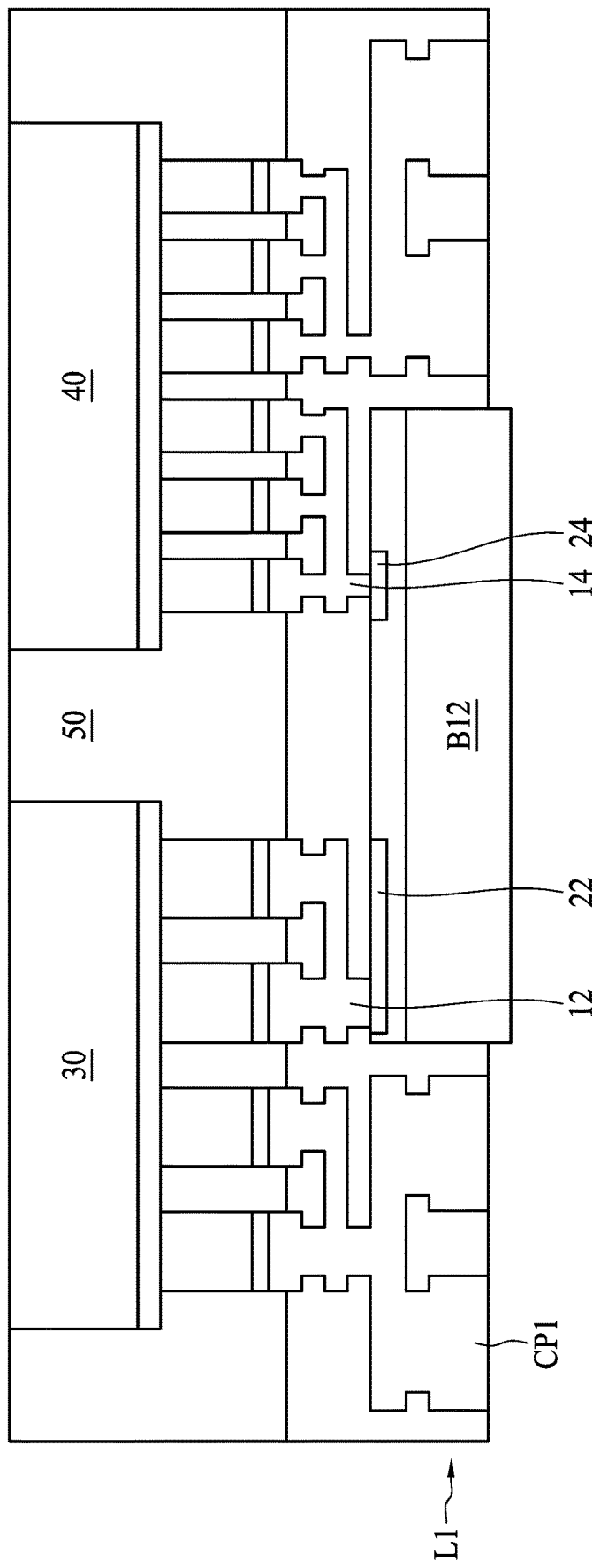
Figure 3J:
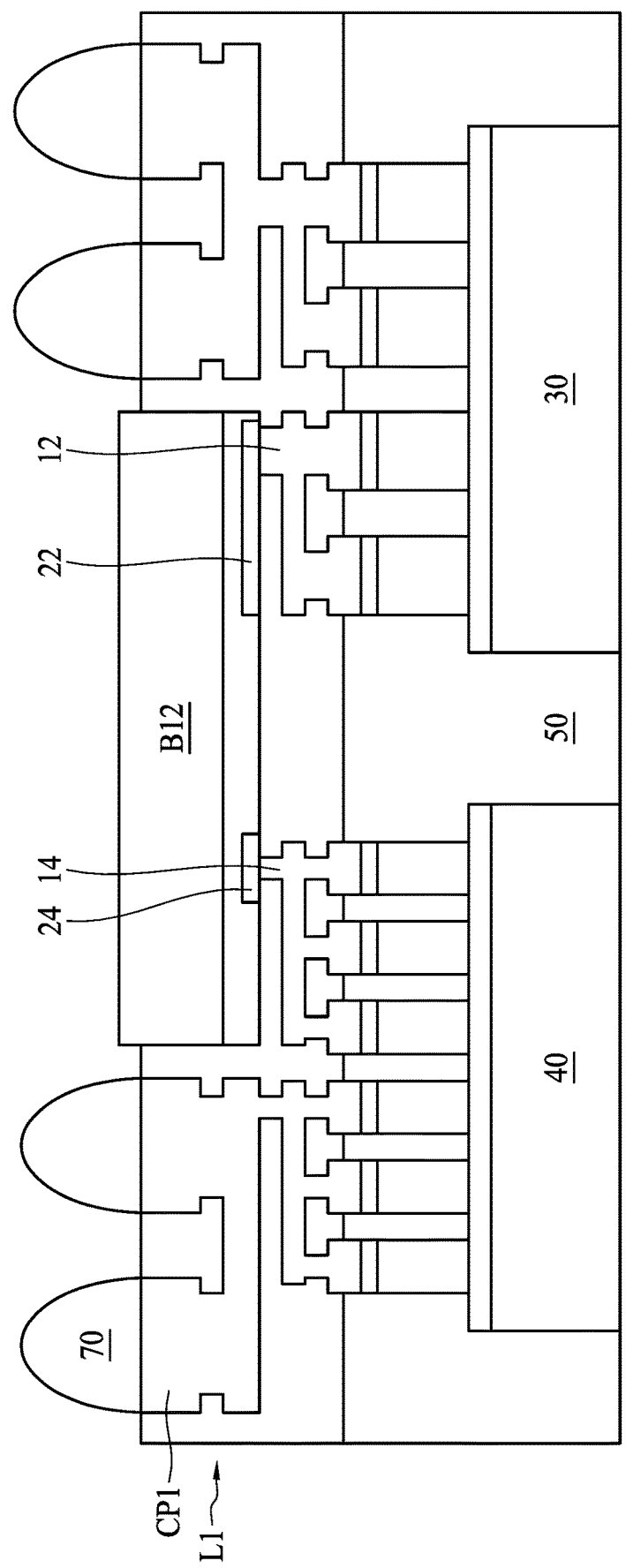
Figure 3K:
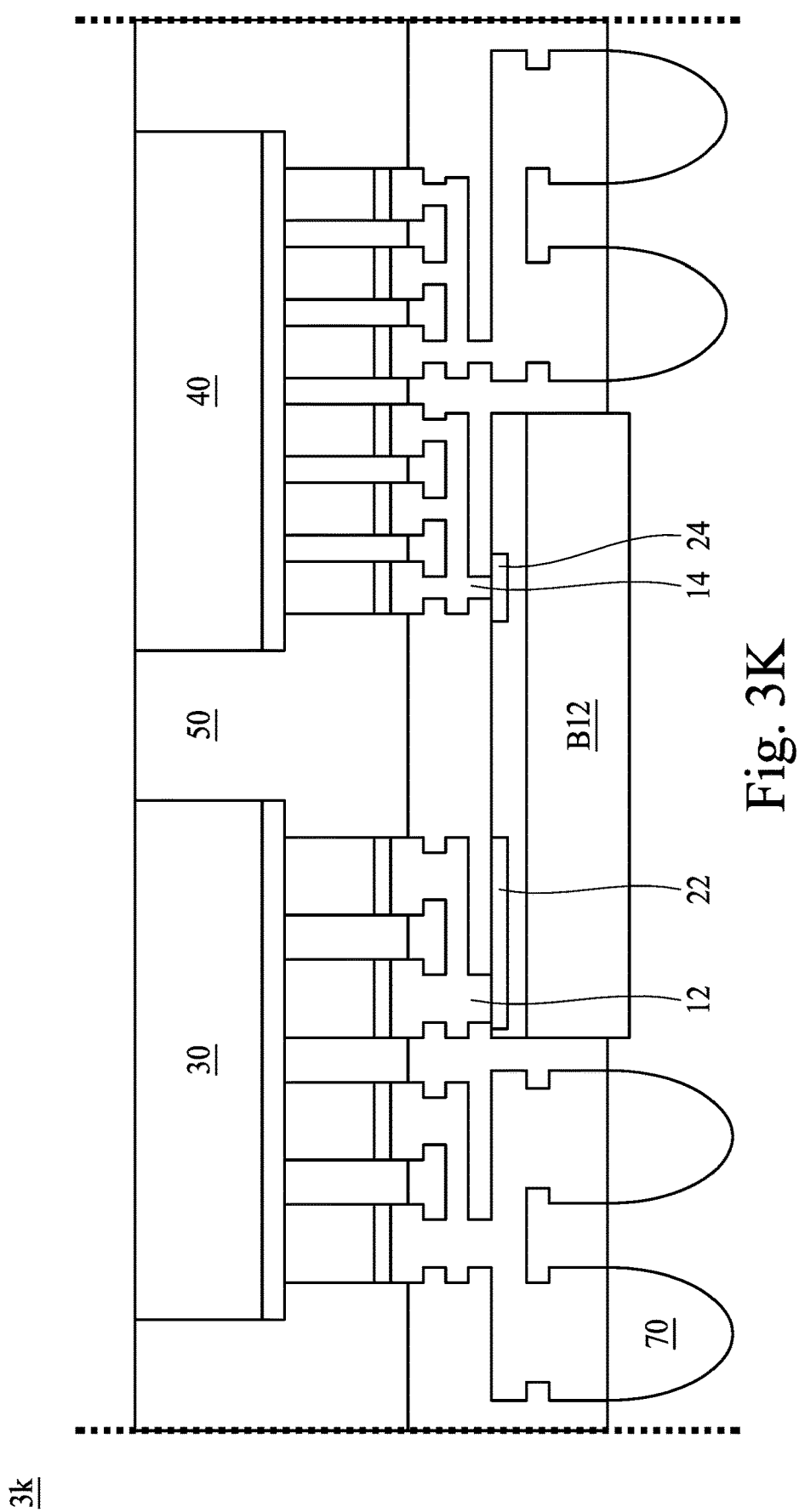

Referring to FIG. 3G, semiconductor dies 30 and 40 are disposed on the RDL L2. The semiconductor die 30 includes an electrical contact 32 electrically connected to the electrical contacts 12 and 22. The semiconductor die 40 includes an electrical contact 42 electrically connected to the electrical contacts 14 and 24. Referring to FIG. 3H, the semiconductor dies 30 and 40 are encapsulated or covered by an encapsulant (or molding compound) 50. Referring to FIG. 3I, the release layer RL and the carrier CR are removed. Conductive pads CP1 of the RDL L1 are exposed. Referring to FIG. 3J, connection elements (e.g. solder balls or solder bumps) 70 are formed on the conductive pads CP1 RDL L1. Referring to FIG. 3K, a singulation operation is performed to form the semiconductor device package 3k. The semiconductor device package 3k may be similar to or the same as the semiconductor device package 1a of FIG. 1A.

FIG. 4A, FIG. 4B, FIG. 4C, FIG. 4D, FIG. 4E, FIG. 4F, FIG. 4G, FIG. 4H, FIG. 4I, and FIG. 4J are cross-sectional views of a semiconductor device package 4j fabricated at various stages, in accordance with some embodiments of the present disclosure. Various figures have been simplified for a better understanding of the aspects of the present disclosure.

Figure 4A:
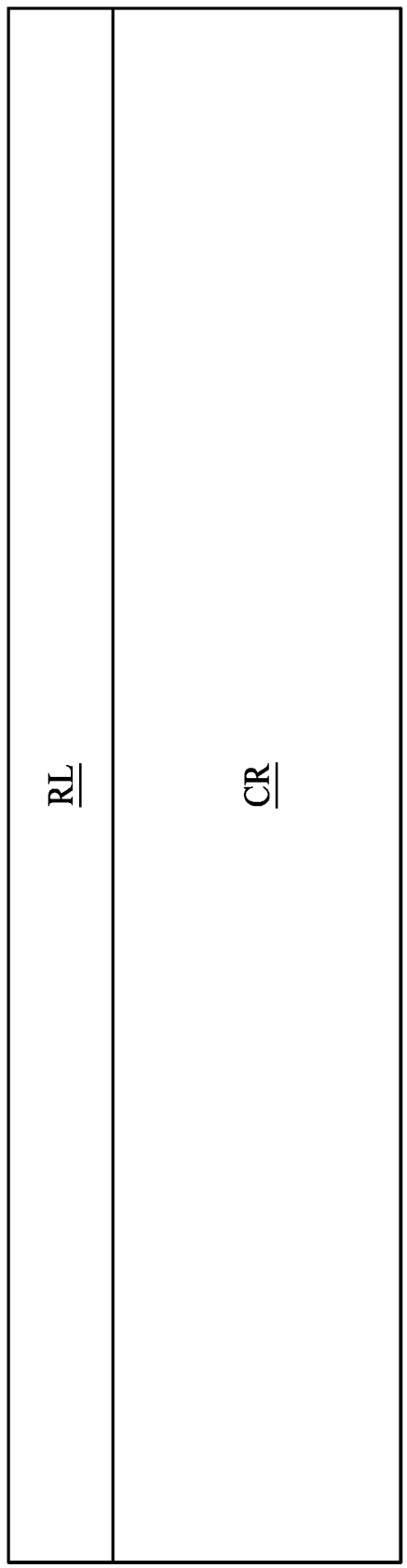
Figure 4C:
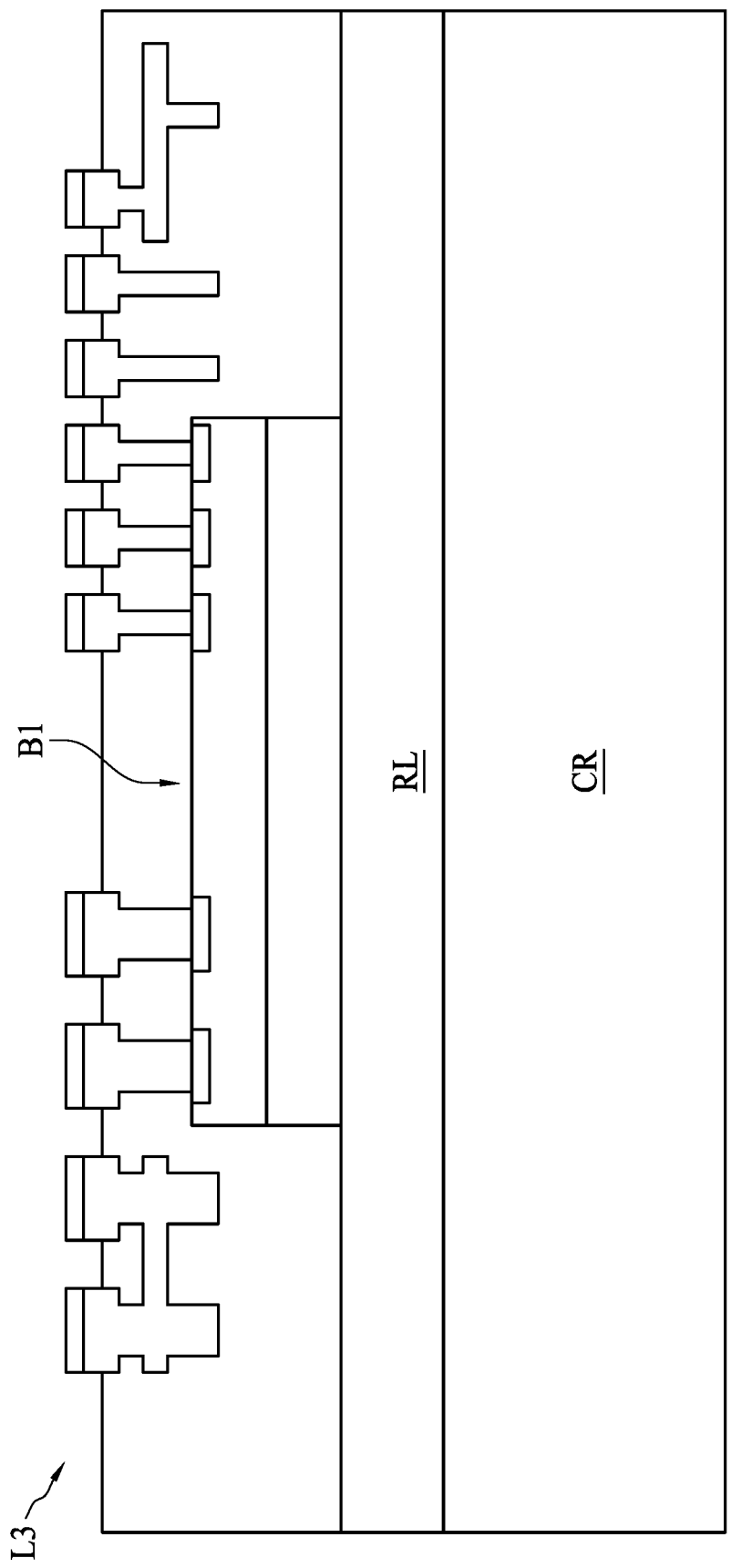
Figure 4D:
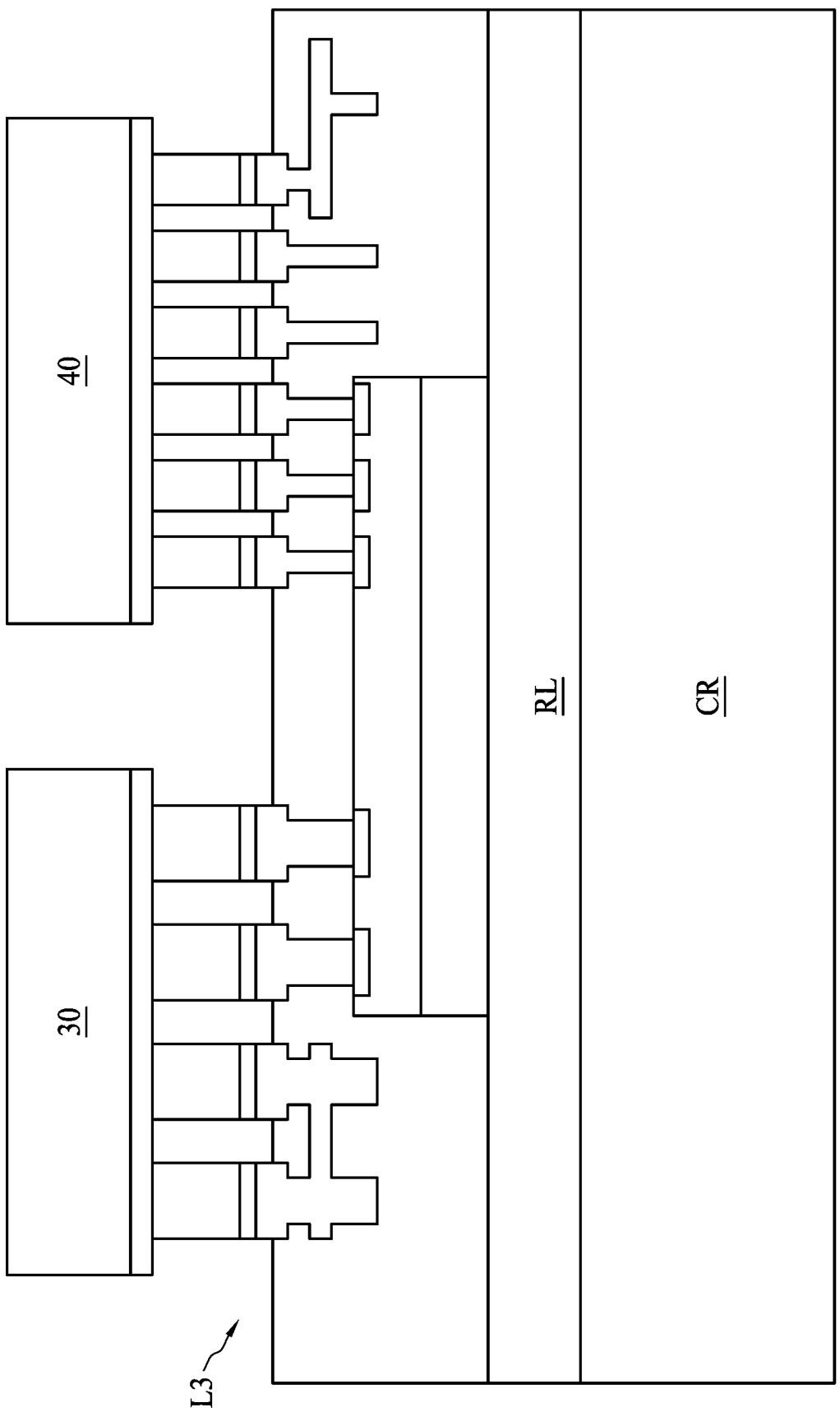
Figure 4E:
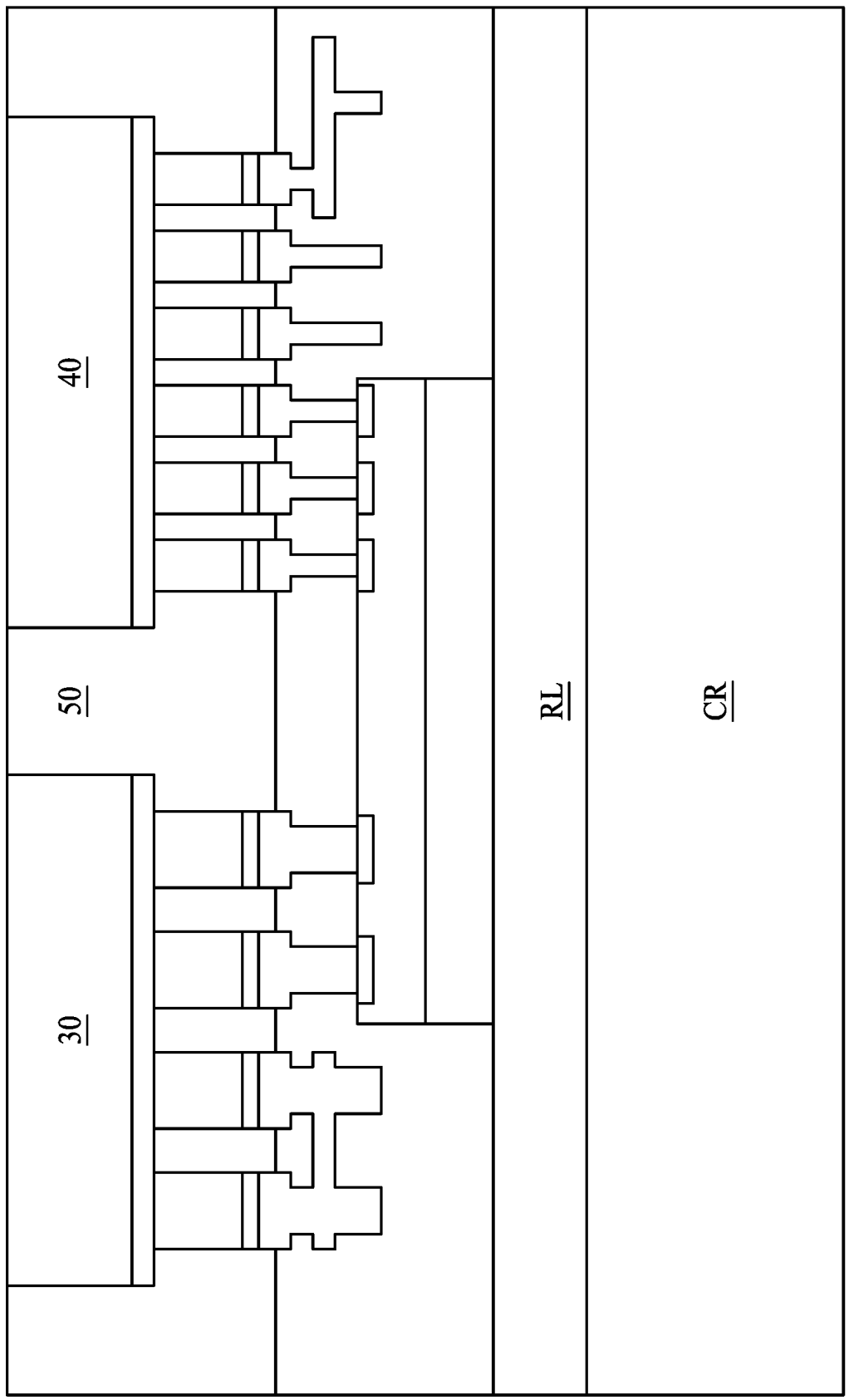

Referring to FIG. 4A, a release layer RL is provided on a carrier CR. Referring to FIG. 4B, a bridge interposer B1 is disposed on the release layer RL. The bridge interposer B1 is similar to or the same as the bridge interposer B1 in FIG. 3B and includes an interconnection structure B11 and a base portion B12. Referring to FIG. 4C, an RDL L3 is formed on the bridge interposer B1. Referring to FIG. 4D, semiconductor dies 30 and 40 are disposed on the RDL L3. Referring to FIG. 4E, the semiconductor dies 30 and 40 are encapsulated by an encapsulant (or molding compound) 50.

Figure 4F:
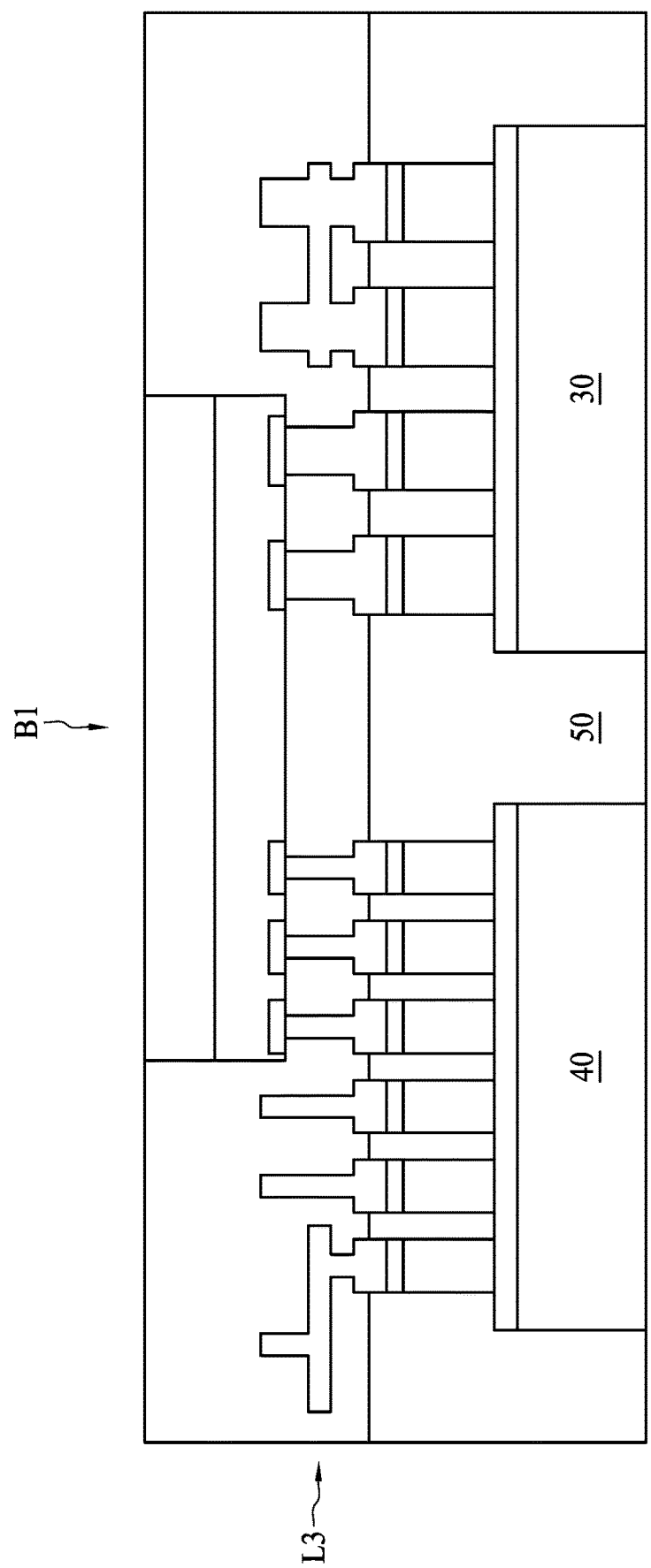
Figure 4G:
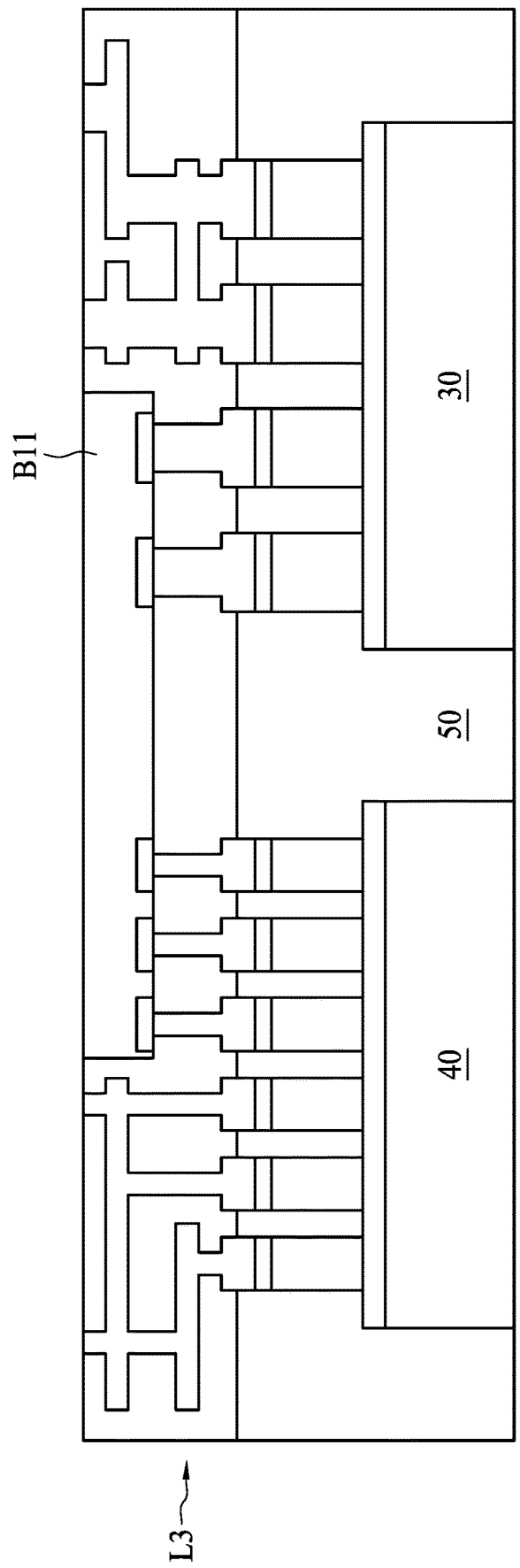
Figure 4H:
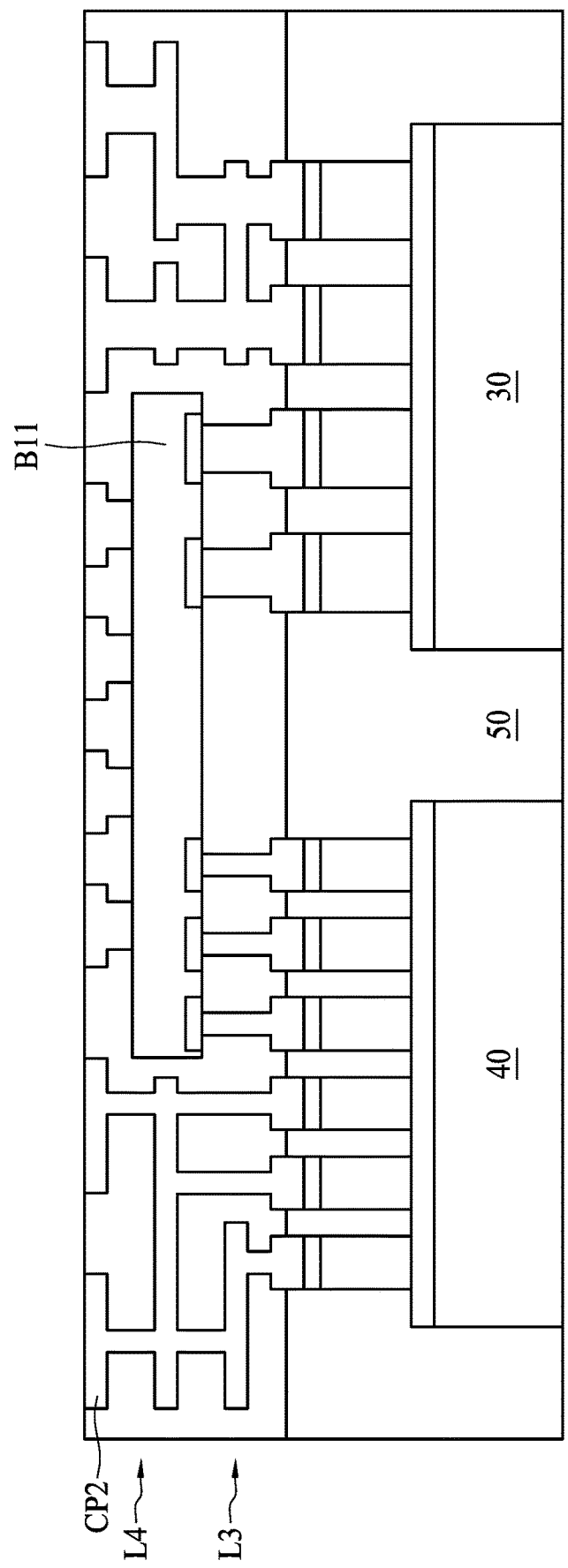
Figure 4I:
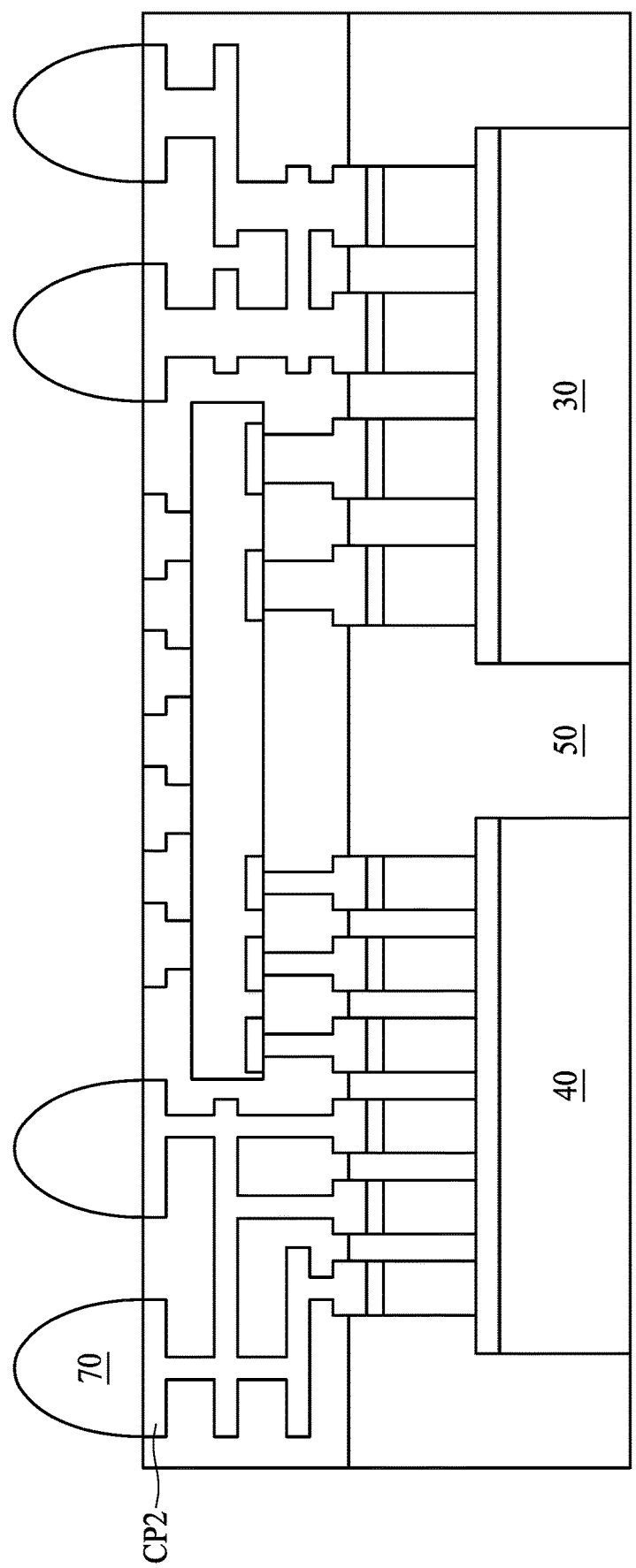
Figure 4J:
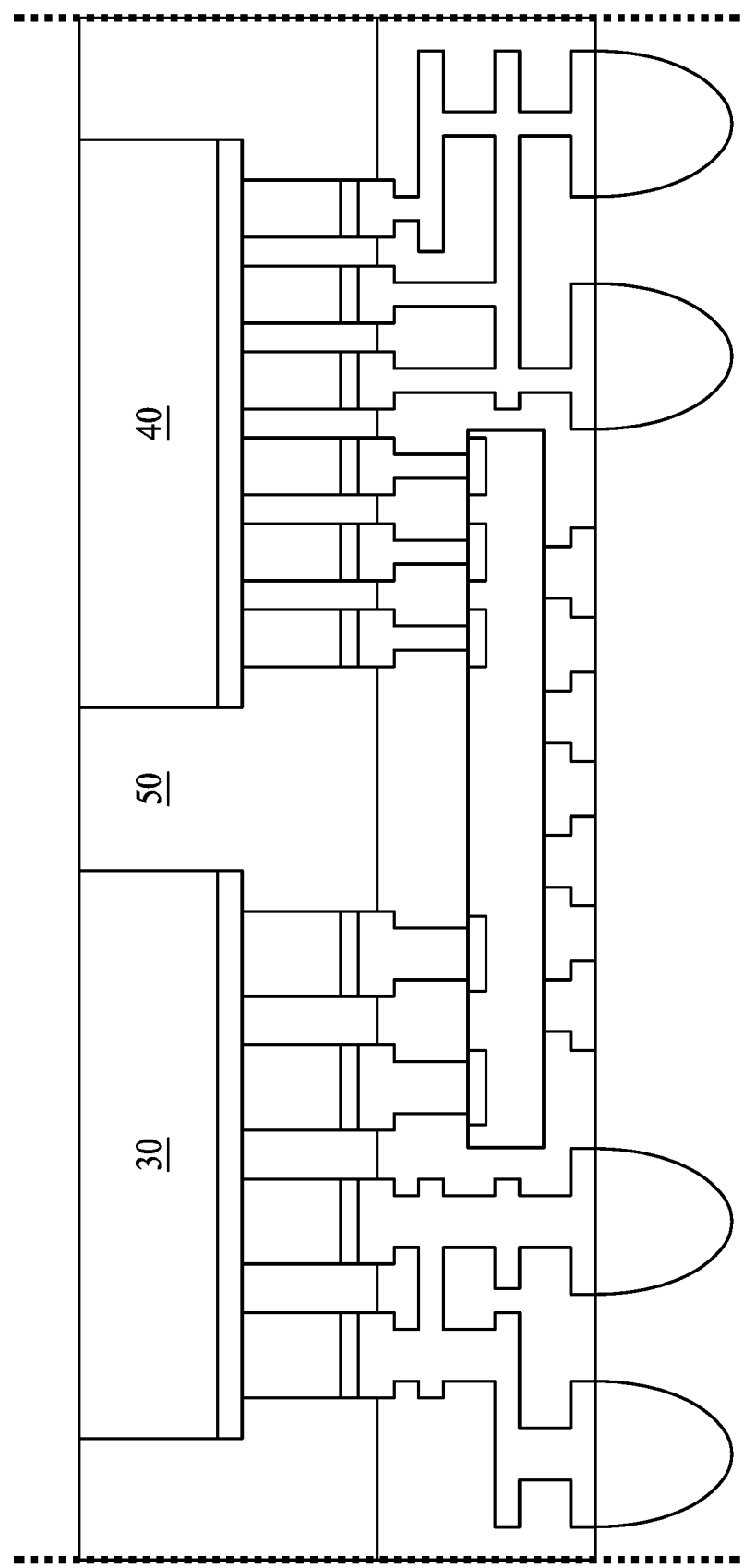

Referring to FIG. 4F, the release layer RL and the carrier CR are removed. The bridge interposer B1 is exposed. Referring to FIG. 4G, the base portion B12 of the bridge interposer B1 and a portion of the RDL L3 are removed by grinding technique and/or etching technique. The interconnection structure B11 of the bridge interposer B1 is exposed. Some electrical contacts of the interconnection structure B11 may be exposed. Referring to FIG. 4H, an RDL L4 is formed on the RDL L3 and on the bridge interposer B1 (or the interconnection structure B11). Some conductive pads CP2 of the RDL L4 are exposed. Referring to FIG. 4I, connection elements (e.g. solder balls or solder bumps) 70 are formed on the conductive pads CP2 of the RDL L4. Referring to FIG. 4J, a singulation operation is performed to form the semiconductor device package 4j. The semiconductor device package 4j may be similar to or the same as the semiconductor device package 1b of FIG. 1B.

FIG. 5A, FIG. 5B, FIG. 5C, FIG. 5D, FIG. 5E, FIG. 5F, FIG. 5G, FIG. 5H, FIG. 5I, and FIG. 5J are cross-sectional views of a semiconductor device package 5j fabricated at various stages, in accordance with some embodiments of the present disclosure. Various figures have been simplified for a better understanding of the aspects of the present disclosure.

Figure 5A:
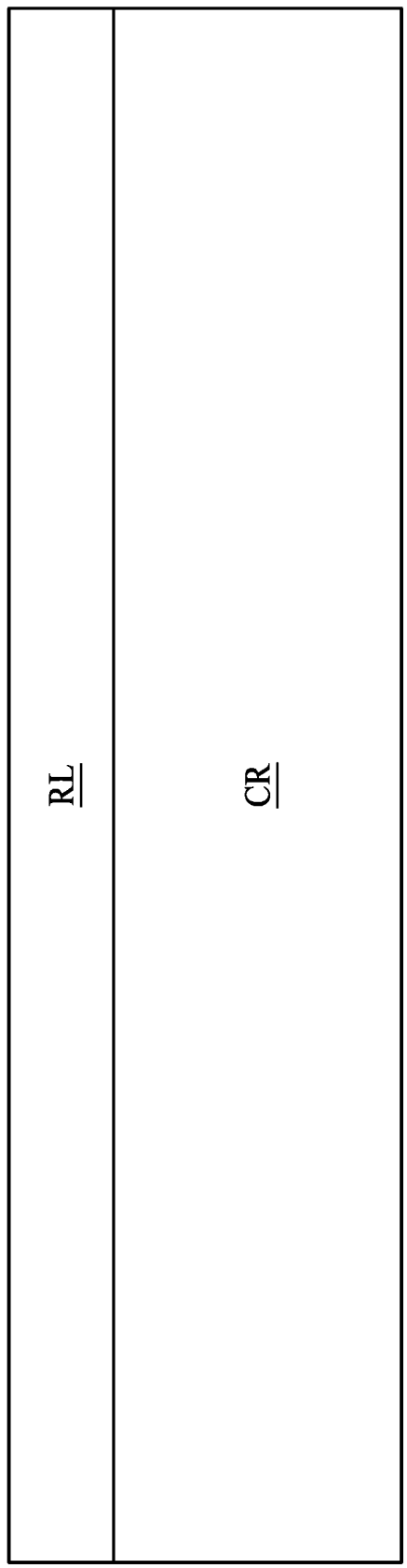
FIG. 5A, FIG. 5B, FIG. 5C, FIG. 5D, FIG. 5E, FIG. 5F, FIG. 5G, FIG. 5H, FIG. 5I, and FIG. 5J are cross-sectional views of a semiconductor device package fabricated at various stages, in accordance with some embodiments of the present disclosure.
Figure 5B:
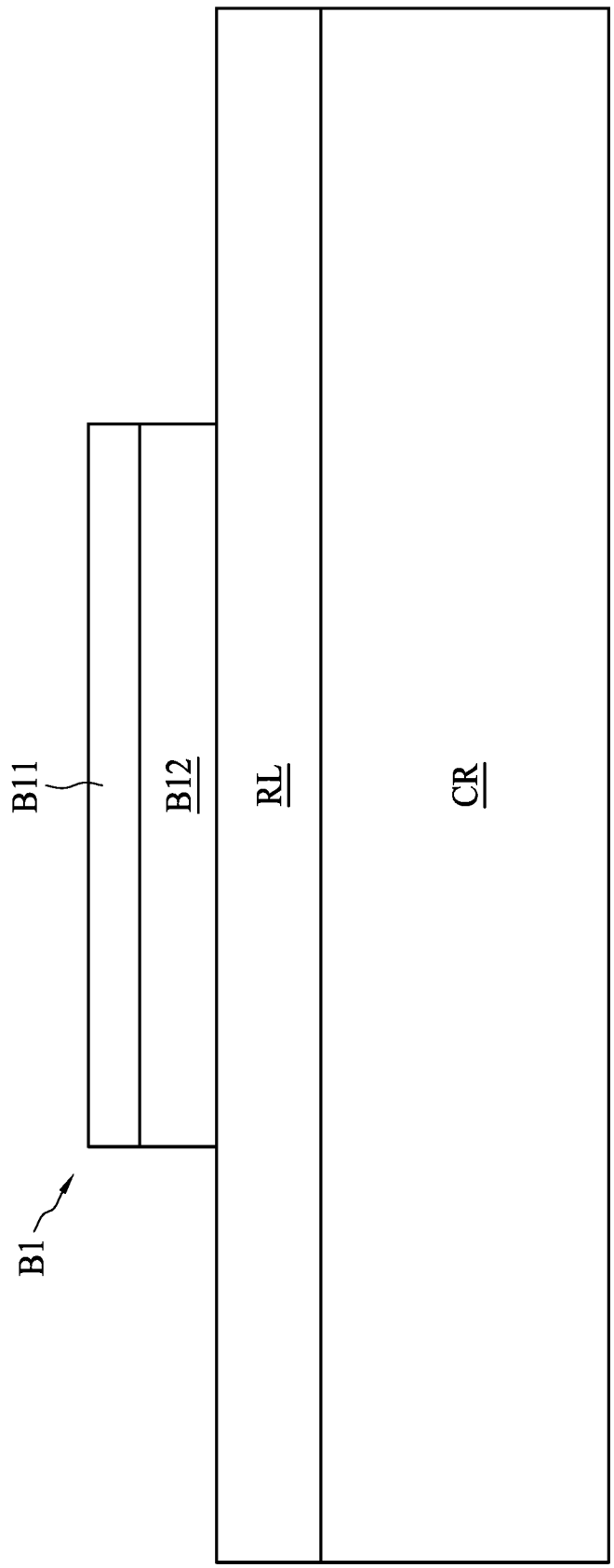
Figure 5C:
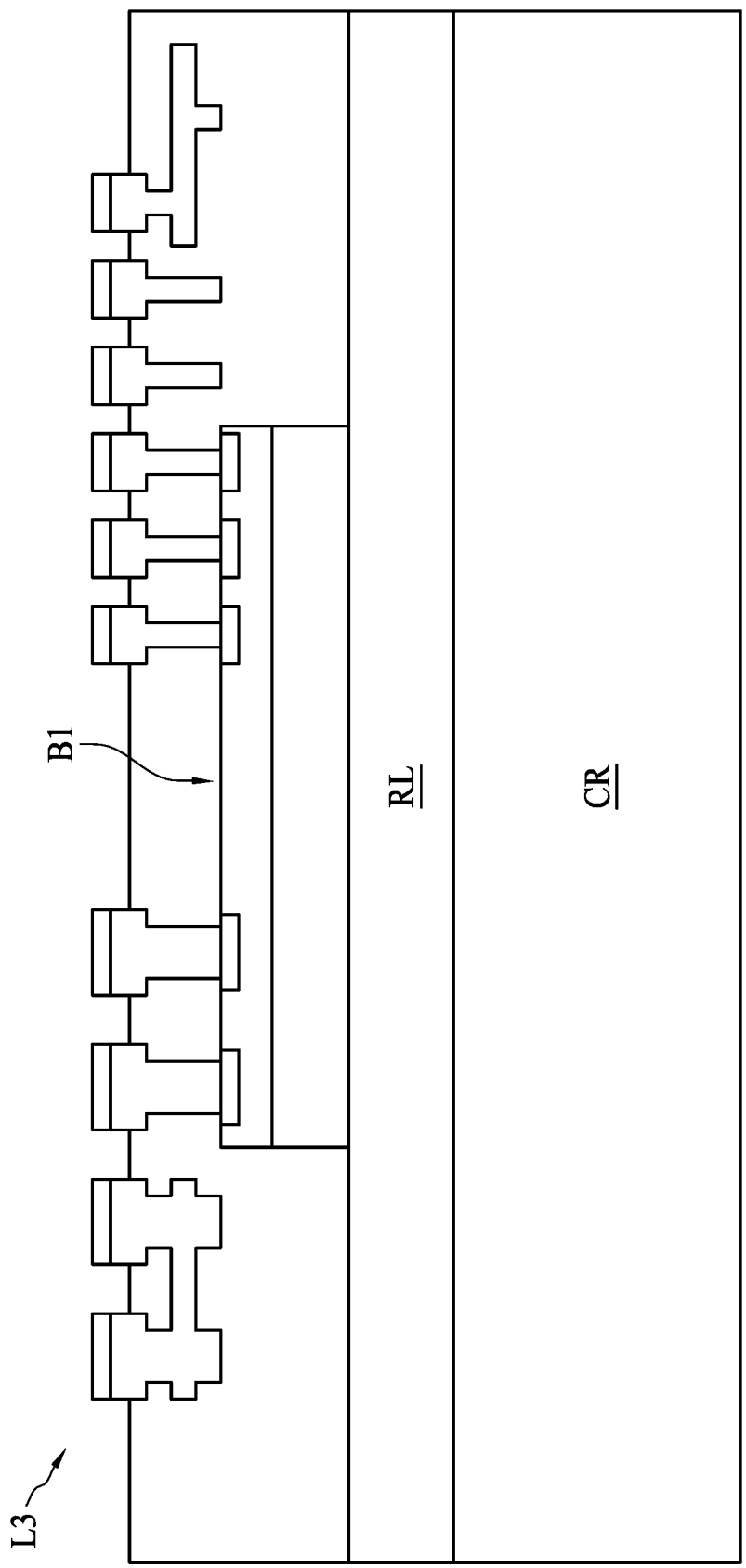
Figure 5D:
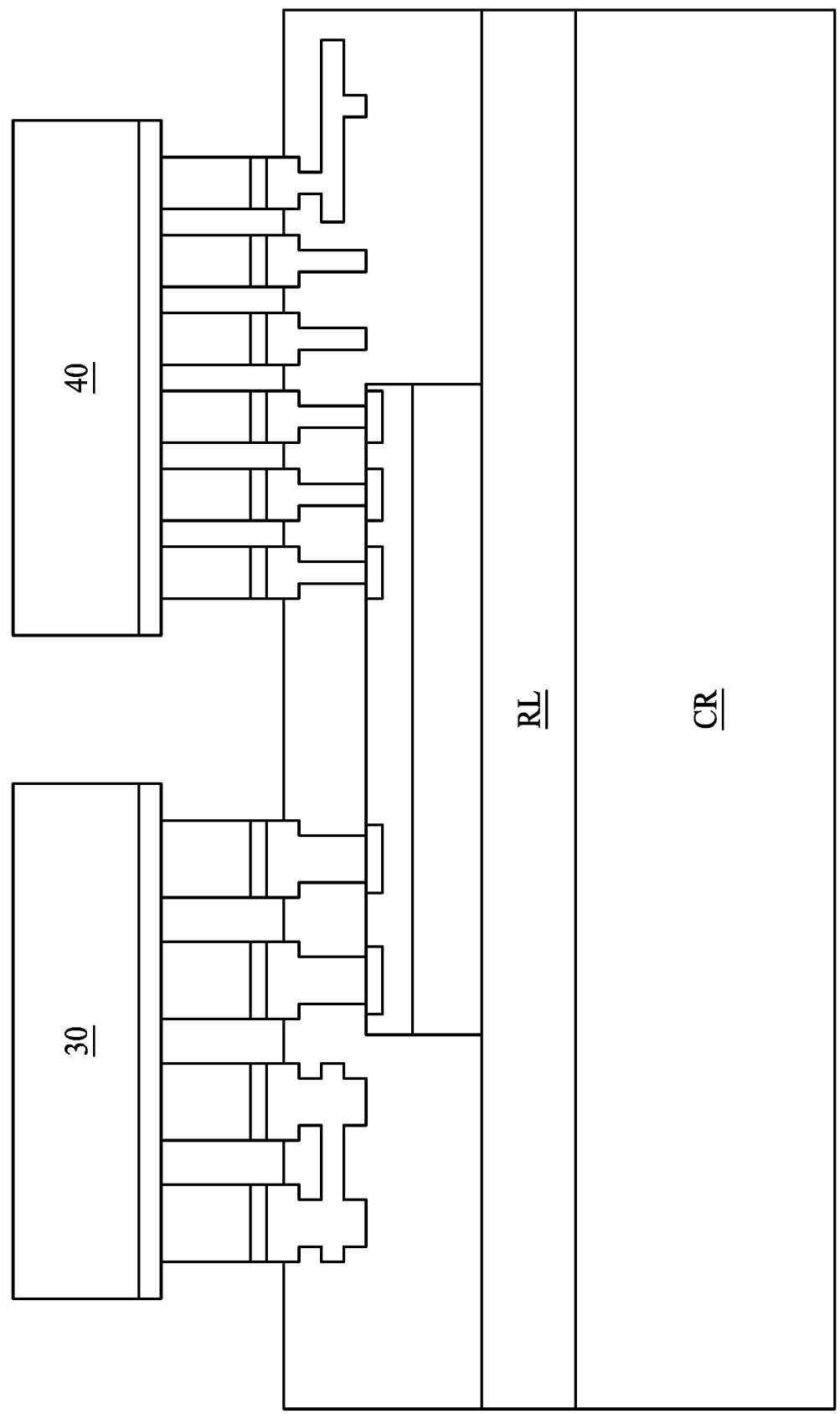
Figure 5E:
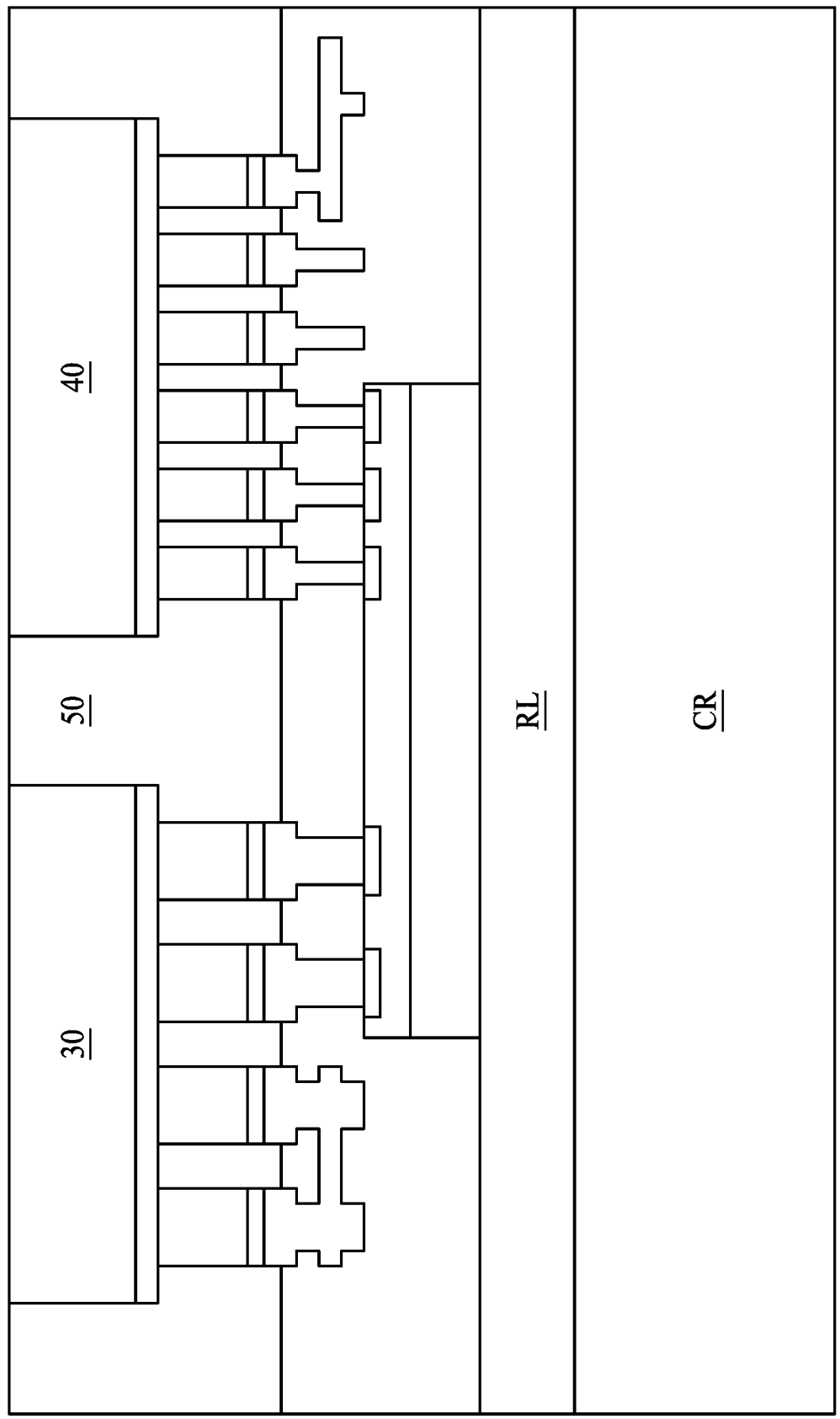
Figure 5F:
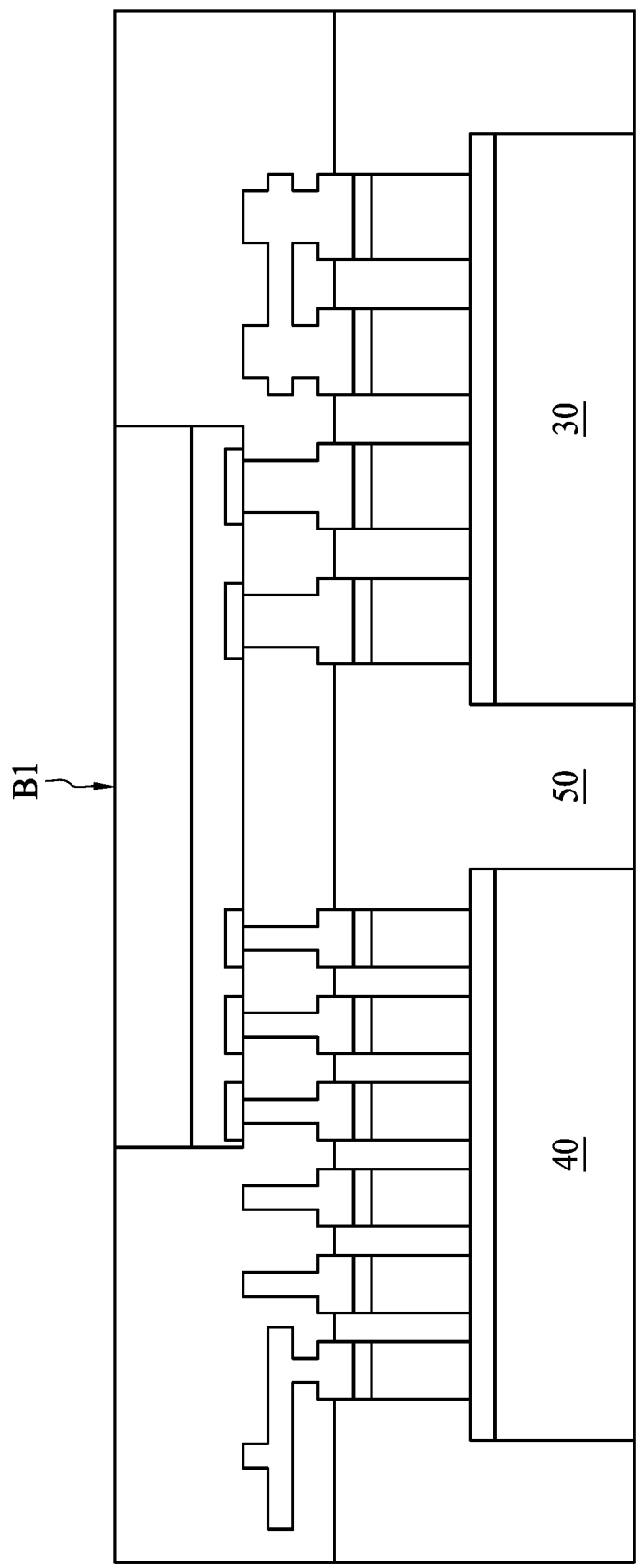

Referring to FIG. 5A, a release layer RL is provided on a carrier CR. Referring to FIG. 5B, a bridge interposer B1 is disposed on the release layer RL. The bridge interposer B1 is similar to or the same as the bridge interposer B1 in FIG. 3B and includes an interconnection structure B11 and a base portion B12. Referring to FIG. 5C, an RDL L3 is formed on the bridge interposer B1. Referring to FIG. 5D, semiconductor dies 30 and 40 are disposed on the RDL L3. Referring to FIG. 5E, the semiconductor dies 30 and 40 are encapsulated by an encapsulant (or molding compound) 50. Referring to FIG. 5F, the release layer RL and the carrier CR are removed. The bridge interposer B1 is exposed.

Figure 5G:
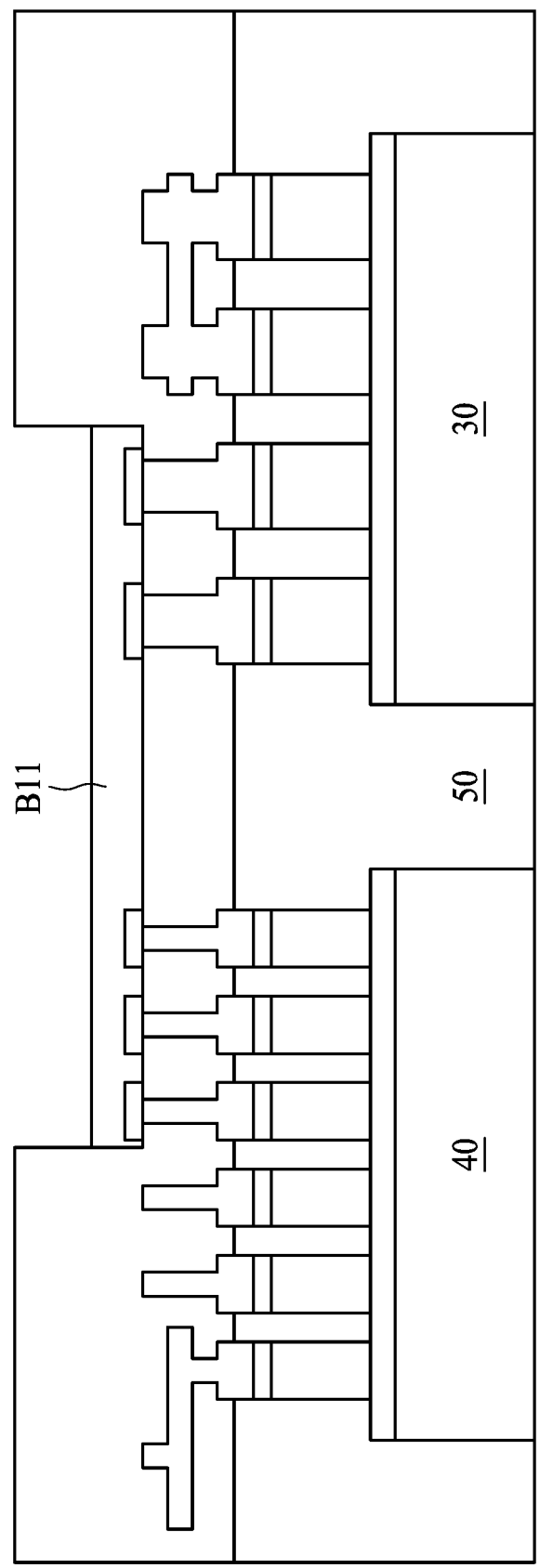
Figure 5H:
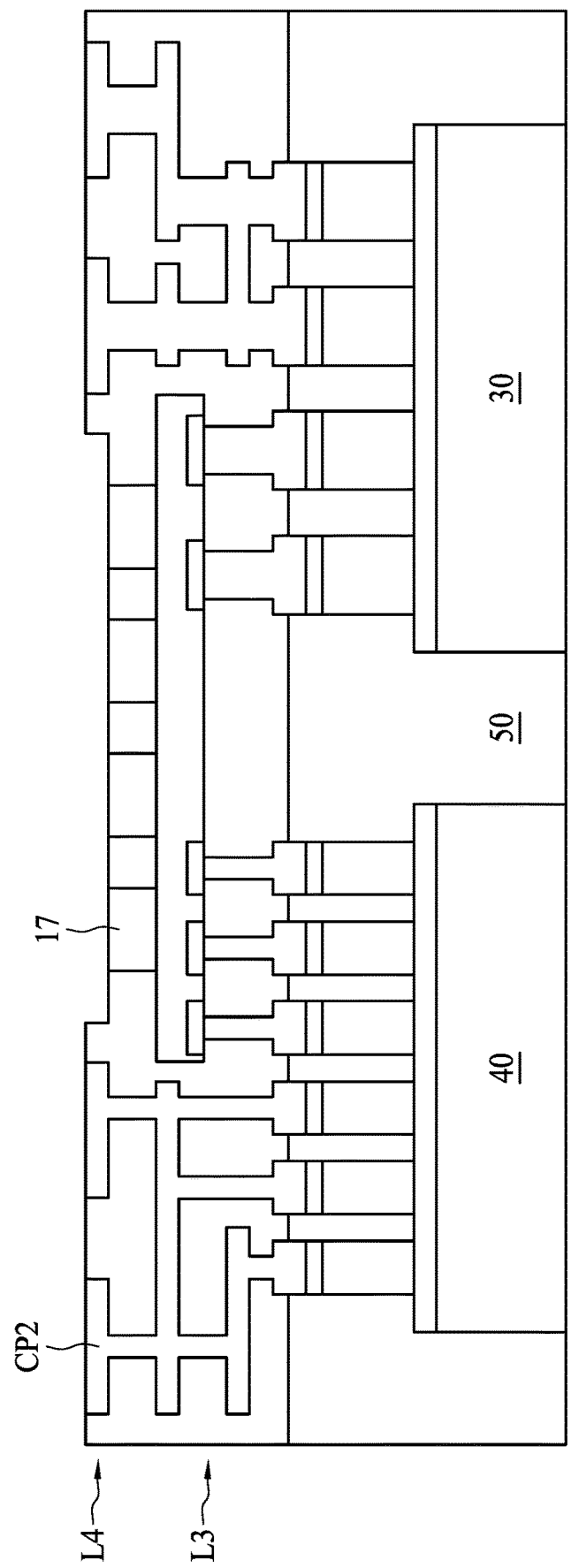
Figure 5I:
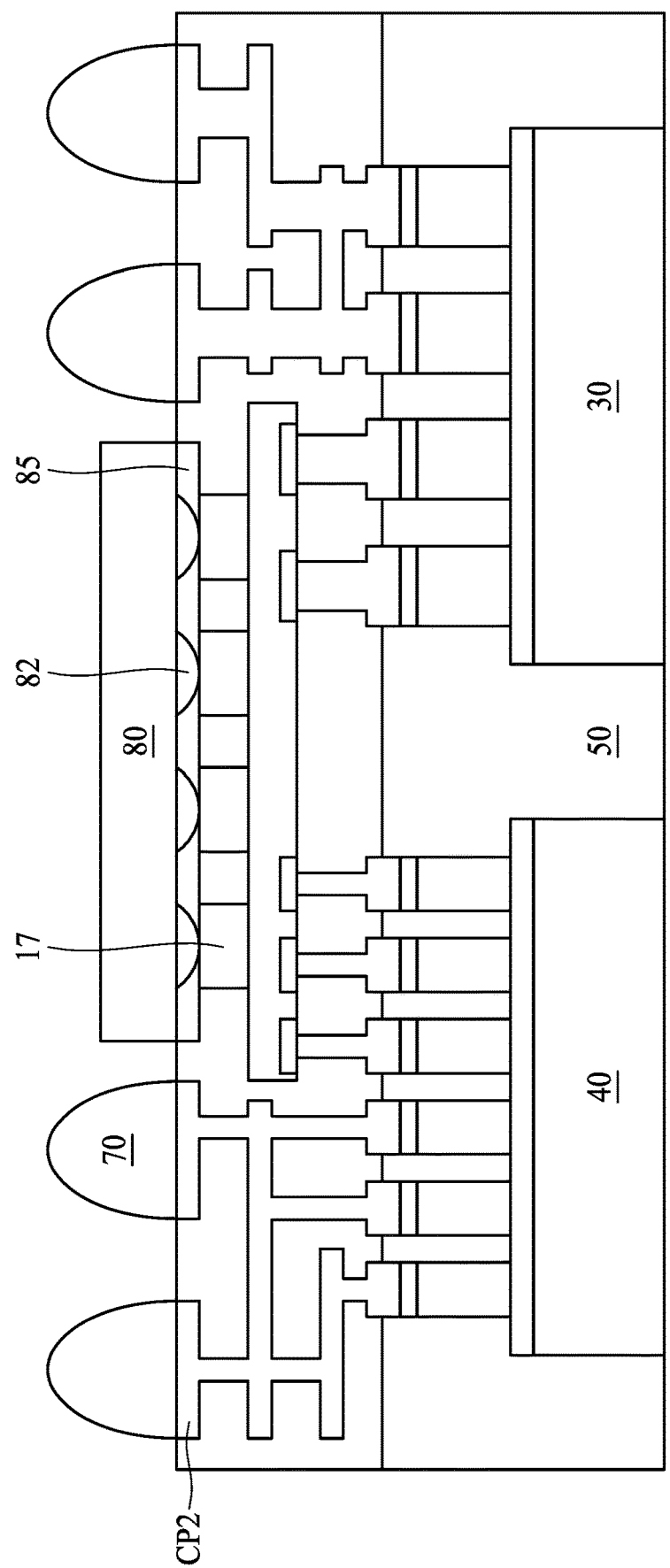
Figure 5J:
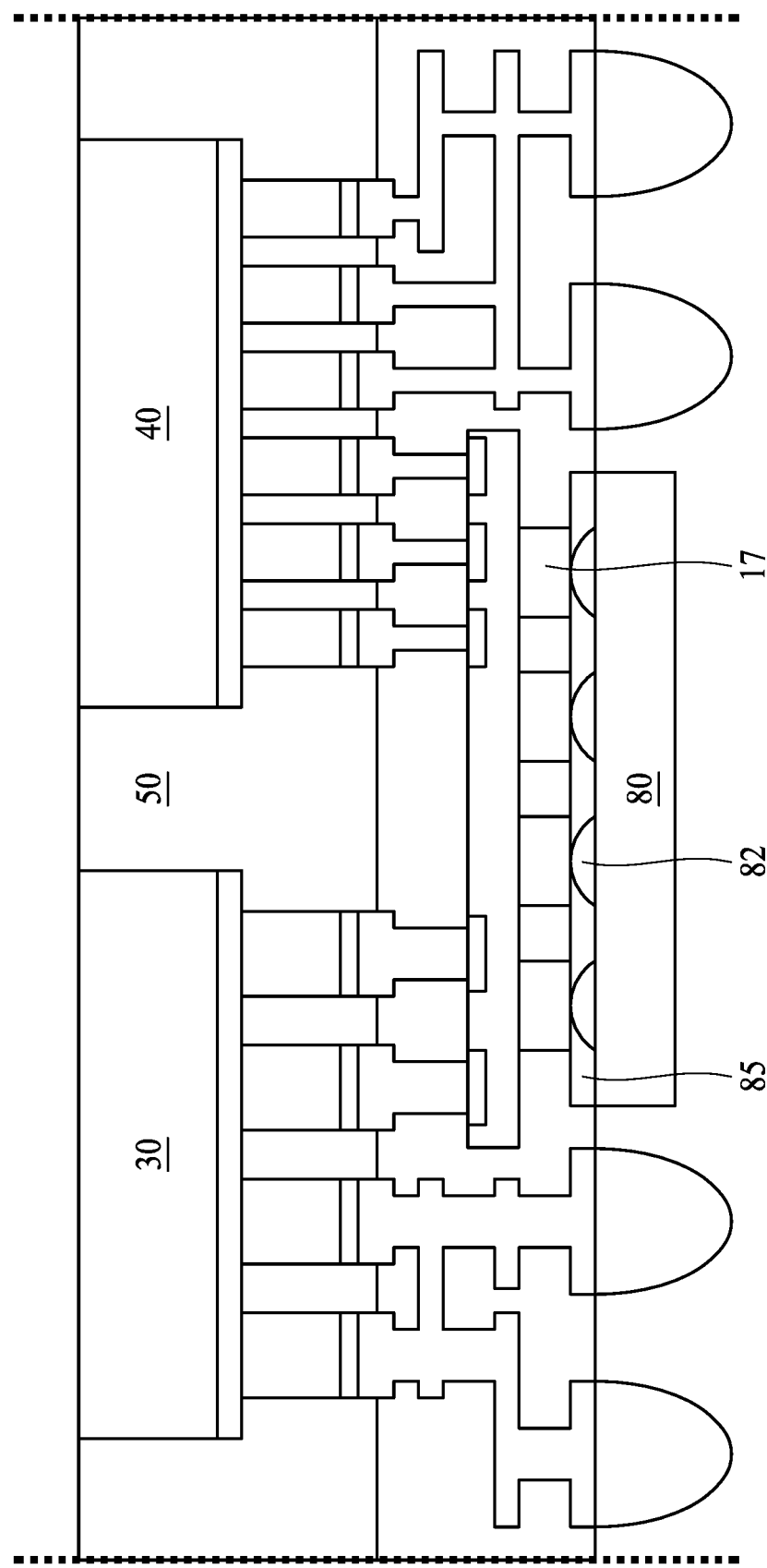

Referring to FIG. 5G, the base portion B12 of the bridge interposer B1 is removed by etching technique to form a recess. The interconnection structure B11 is exposed. Referring to FIG. 5H, an RDL L4 is formed on the RDL L3 and on the bridge interposer B1 (or the interconnection structure B11). The RDL L4 includes conductors 17 and conductive pads CP2 which are exposed from a surface of the RDL L4. Referring to FIG. 5I, connection elements (e.g. solder balls or solder bumps) 70 are formed on the conductive pads CP2 of the RDL L4. A semiconductor die 80 is disposed on the RDL L4. The semiconductor die 80 includes conductors (e.g., conductive pads or bumps) 82 electrically connected to the conductors 17 the RDL L4. The conductors 82 are surrounded by an underfill 85. The underfill 85 is at least partially surrounded by the RDL L4. Referring to FIG. 5J, a singulation operation is performed to form the semiconductor device package 5j. The semiconductor device package 5j may be similar to or the same as the semiconductor device package 1c of FIG. 1C.

FIG. 6A, FIG. 6B, FIG. 6C, FIG. 6D, FIG. 6E, FIG. 6F, FIG. 6G, FIG. 6H, FIG. 6I, FIG. 6J, FIG. 6K and FIG. 6L are cross-sectional views of a semiconductor device package 6(l) fabricated at various stages, in accordance with some embodiments of the present disclosure. Various figures have been simplified for a better understanding of the aspects of the present disclosure.

Figure 6A:
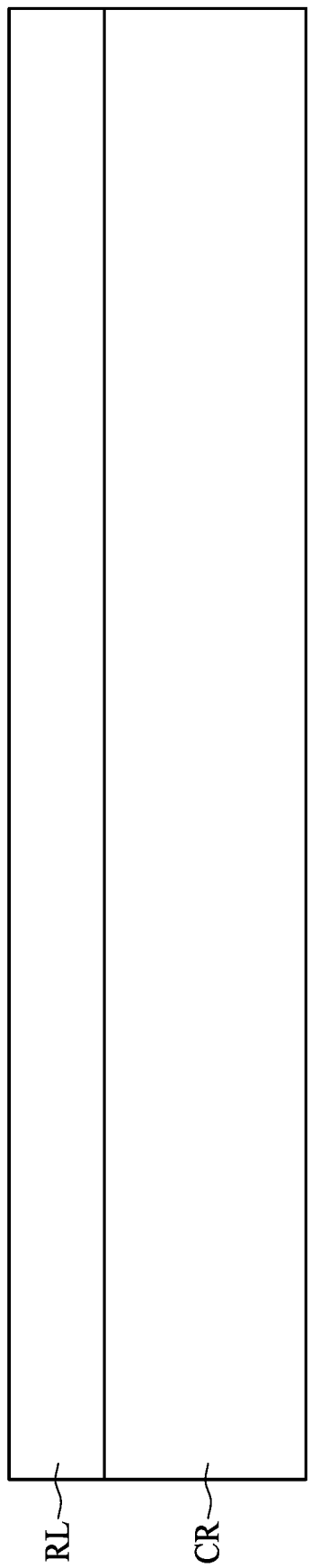
FIG. 6A, FIG. 6B, FIG. 6C, FIG. 6D, FIG. 6E, FIG. 6F, FIG. 6G, FIG. 6H, FIG. 6I, FIG. 6J, FIG. 6K and FIG. 6L are cross-sectional views of a semiconductor device package fabricated at various stages, in accordance with some embodiments of the present disclosure.
Figure 6B:
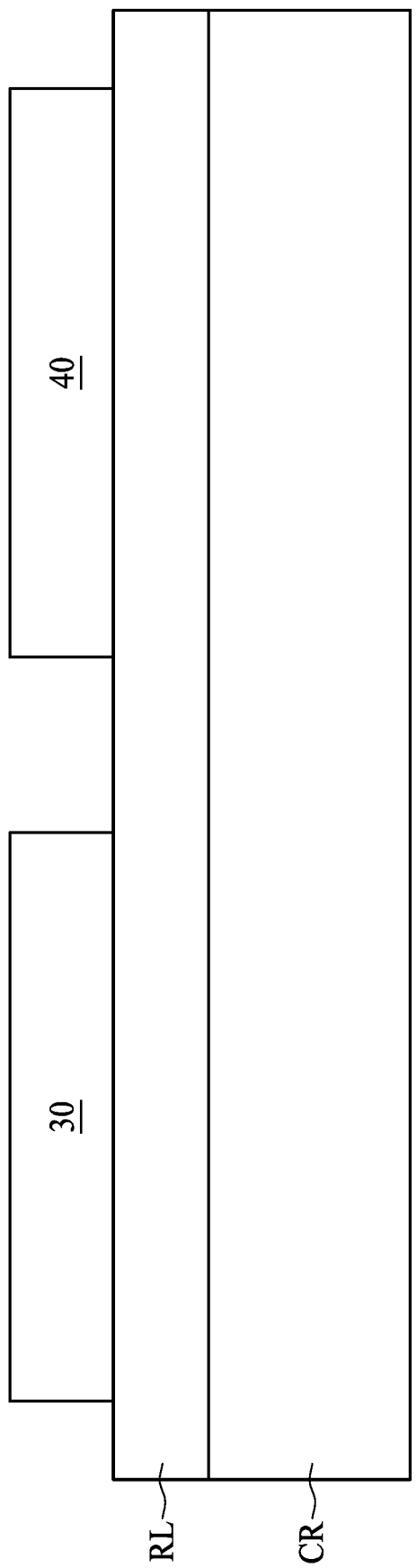
Figure 6C:
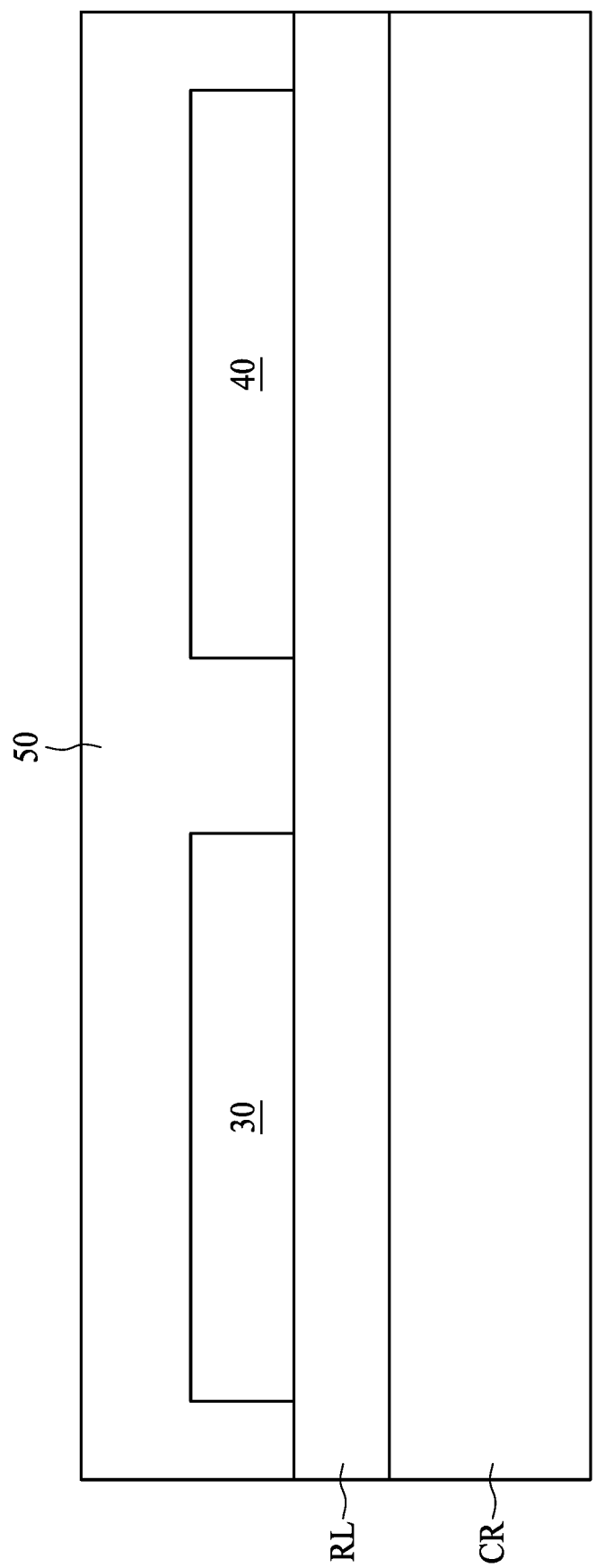
Figure 6D:
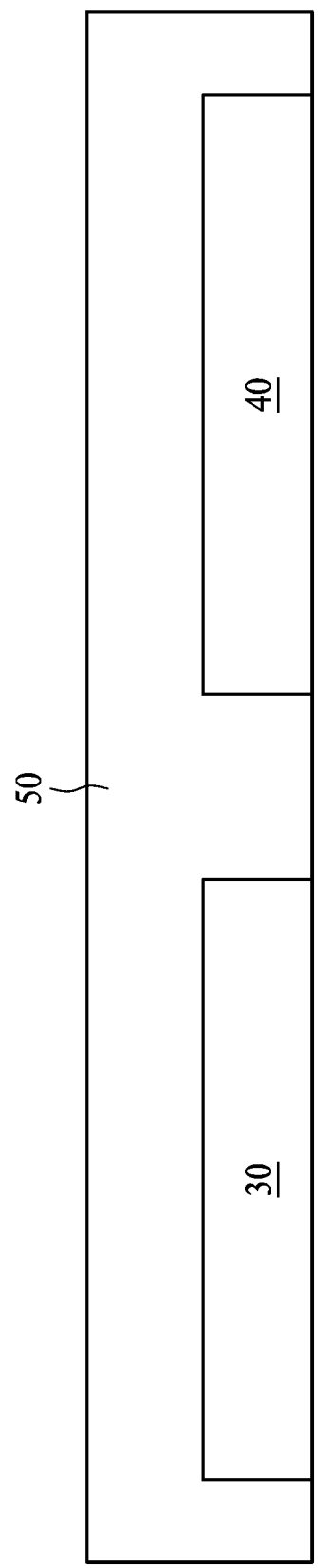
Figure 6E:
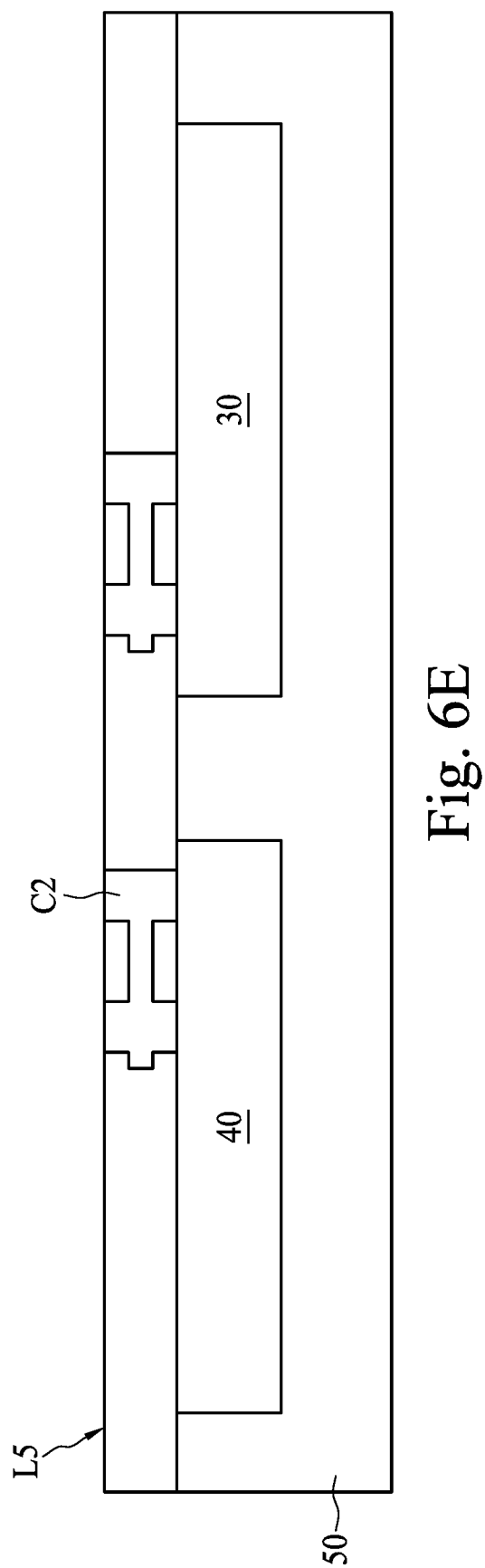
Figure 6F:
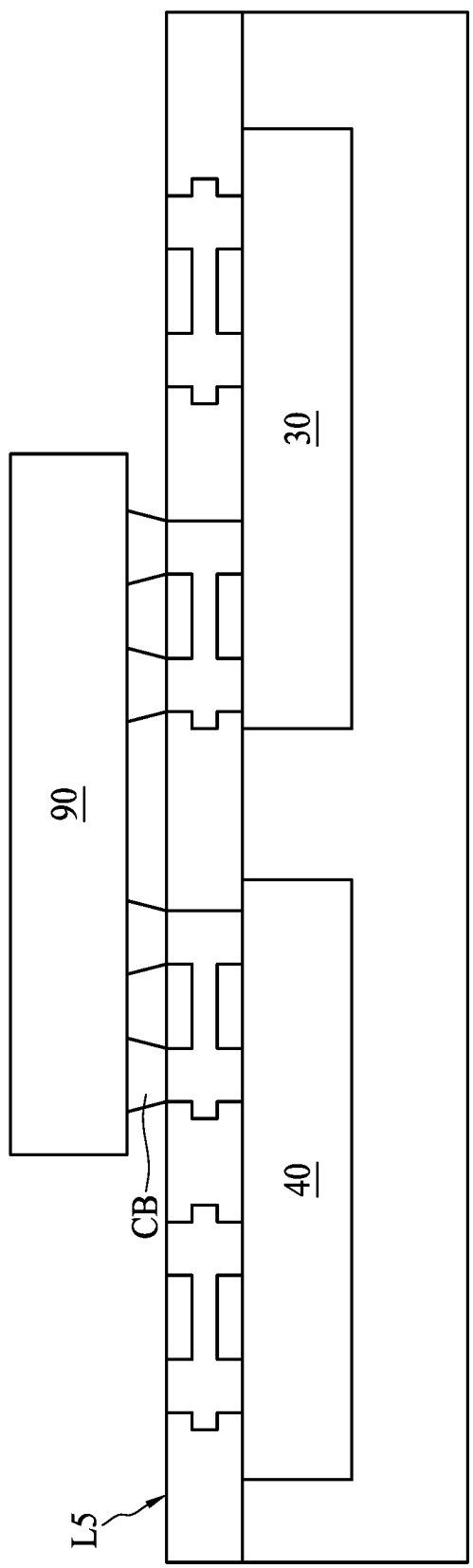

Referring to FIG. 6A, a release layer RL is provided on a carrier CR. Referring to FIG. 6B, semiconductors 30 and 40 are disposed on the release layer. Referring to FIG. 6C, the semiconductors 30 and 40 are encapsulated by an encapsulant 50. Referring to FIG. 6D, the release layer RL and the carrier CR are removed. Referring to FIG. 6E, an RDL L5 is formed on the encapsulant 50 and electrically connected to the semiconductors 30 and 40. A conductive structure C2 is exposed. Referring to FIG. 6F, a bridge interposer 90 is formed on and electrically connected to the RDL L5. The bridge interposer 90 includes conductive bumps CB which are connected to the conductive structure C2. The conductive bumps CB of the bridge interposer 90 may be electrically connected to the semiconductor dies 30 and 40.

Figure 6G:
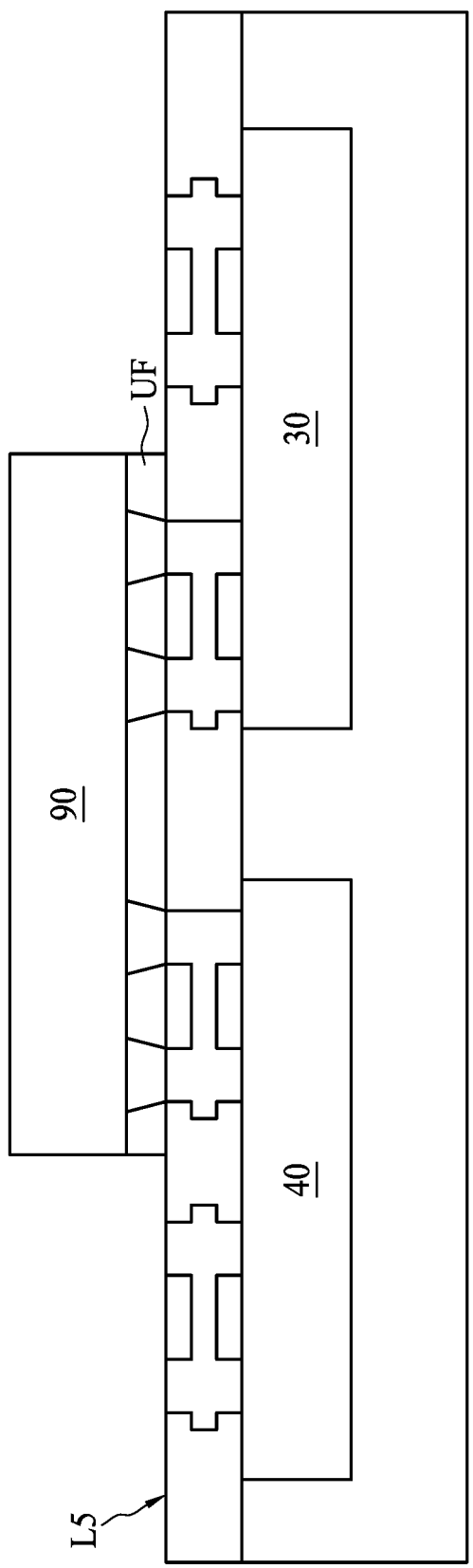
Figure 6H:
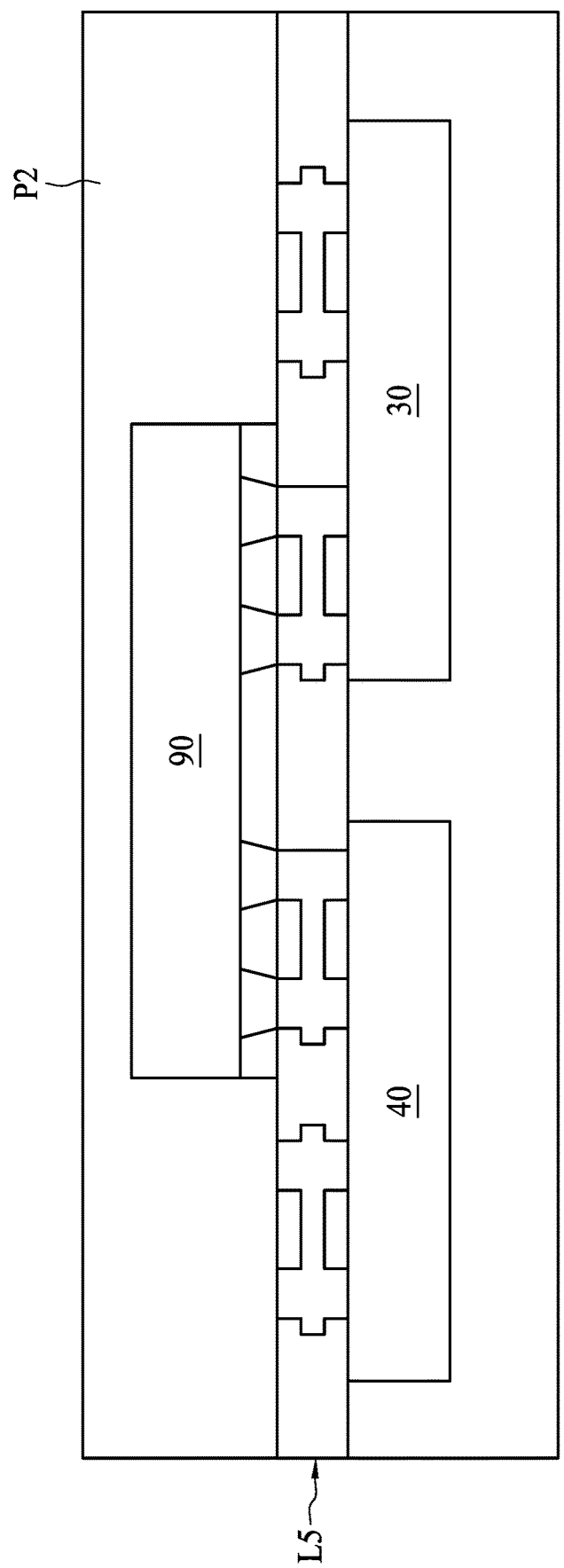
Figure 6I:
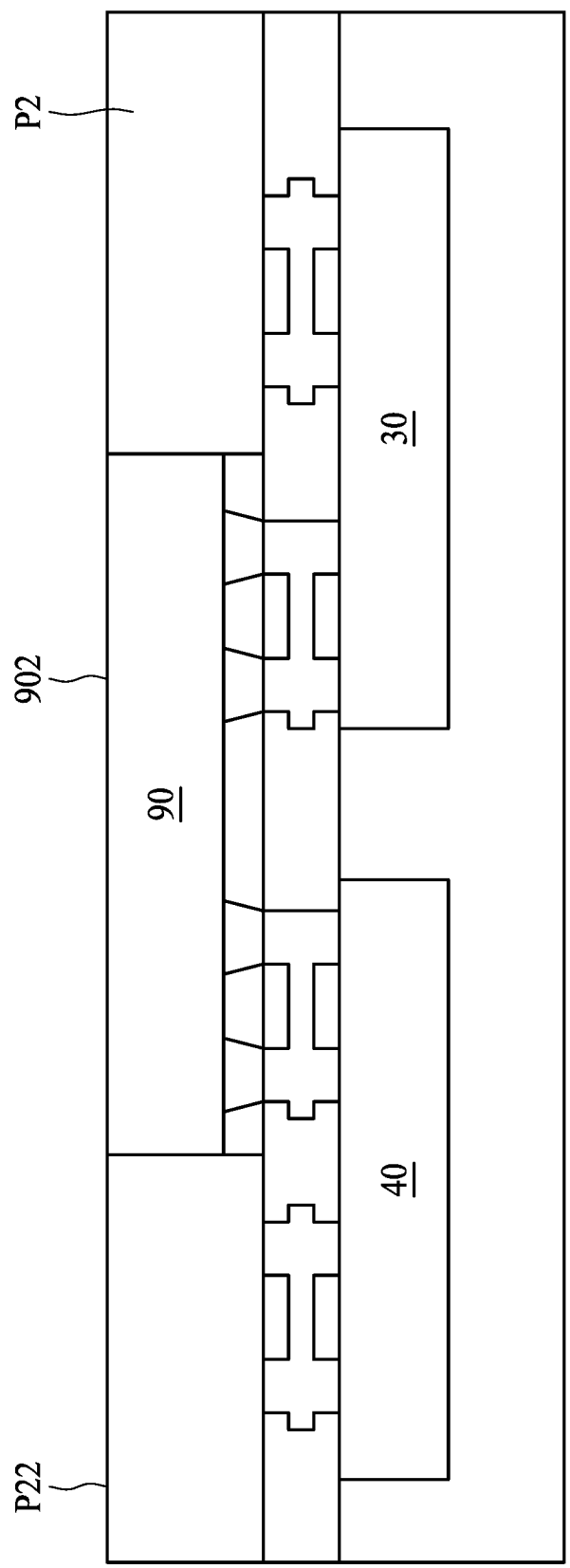

Referring to FIG. 6G, a space between the RDL L5 and the bridge interposer 90 is filled with an underfill UF to surround the conductive bumps CB of the bridge interposer 90. Referring to FIG. 6H, a passivation layer P2 is formed on the RDL L5 to cover the bridge interposer 90. Referring to FIG. 6I, a portion of the passivation layer P2 is removed by, for example, grinding technique to expose the bridge interposer 90. A portion of the bridge interposer 90 may be removed by grinding technique. A surface 902 of the bridge interposer 90 may be coplanar with a surface P22 of the passivation layer P2.

Figure 6J:
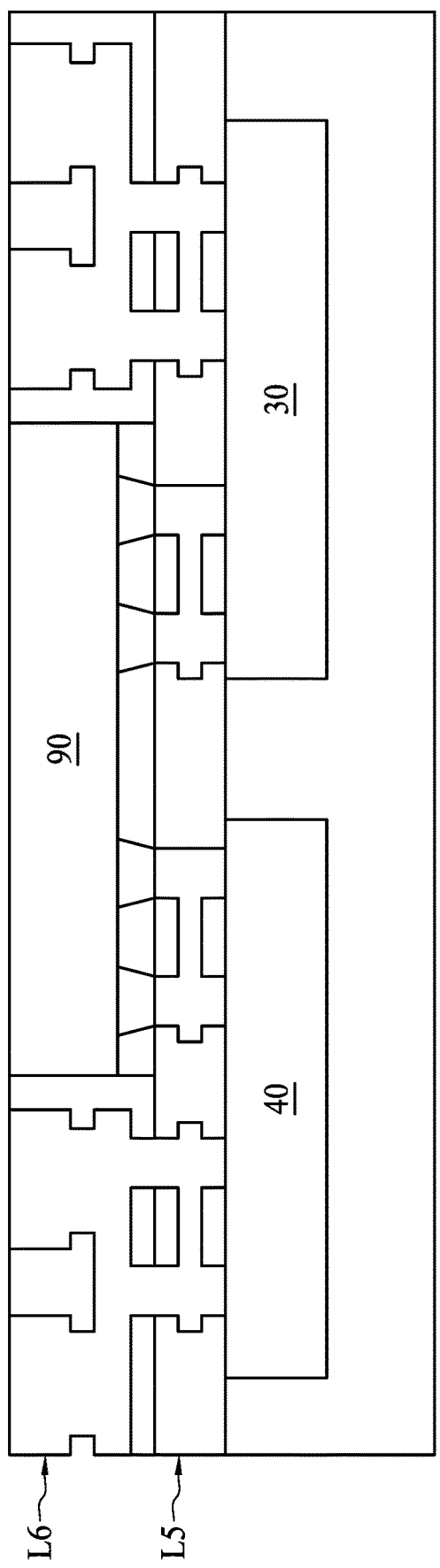
Figure 6K:
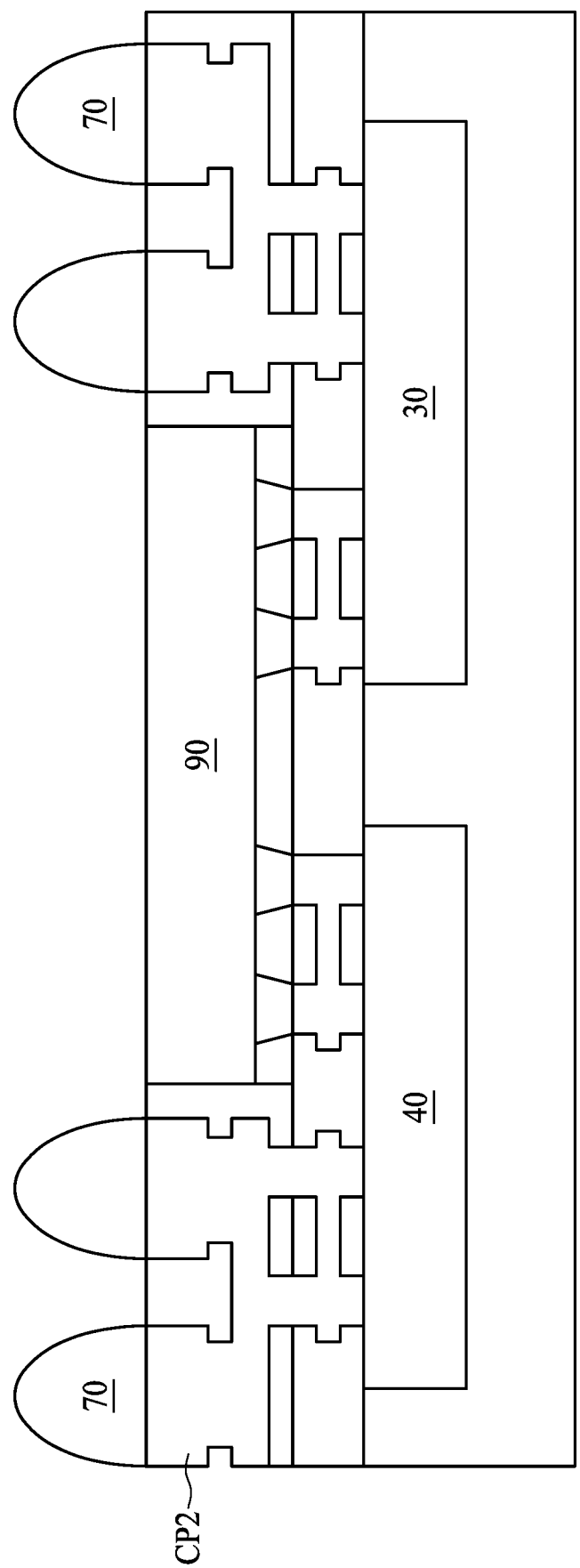
Figure 6L:
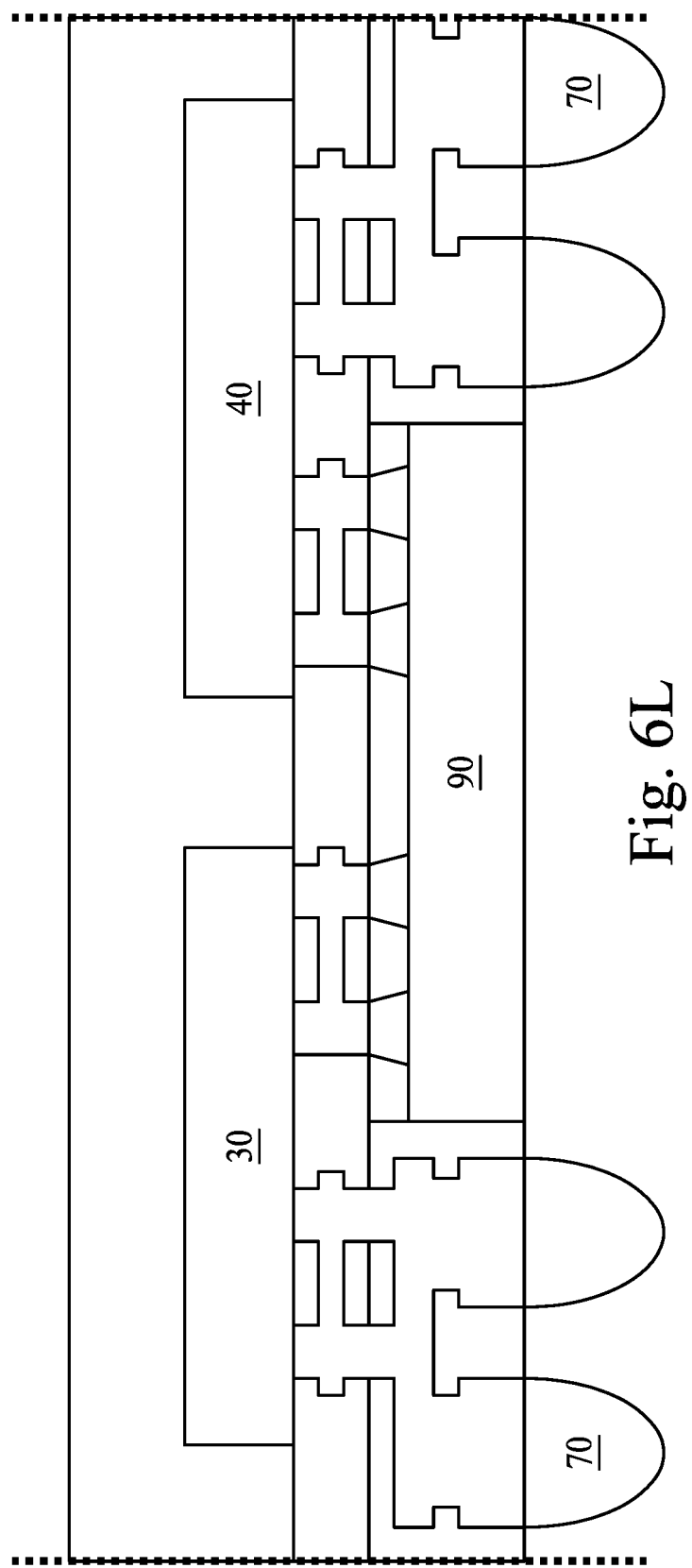

Referring to FIG. 6J, an RDL L6 is formed on the RDL L5 to surround the bridge interposer 90. Referring to FIG. 6K, connection elements (e.g. solder balls or solder bumps) 70 are formed on conductive pads CP2 of the RDL L6. Referring to FIG. 6L, a singulation operation is performed to form the semiconductor device package 6(l). The semiconductor device package 6(l) may be similar to or the same as the semiconductor device package 1d of FIG. 1D.

FIG. 7A, FIG. 7B, FIG. 7C, FIG. 7D, FIG. 7E, FIG. 7F, FIG. 7G and FIG. 7H are cross-sectional views of a semiconductor device package 7h fabricated at various stages, in accordance with some embodiments of the present disclosure. Various figures have been simplified for a better understanding of the aspects of the present disclosure.

Figure 7A:
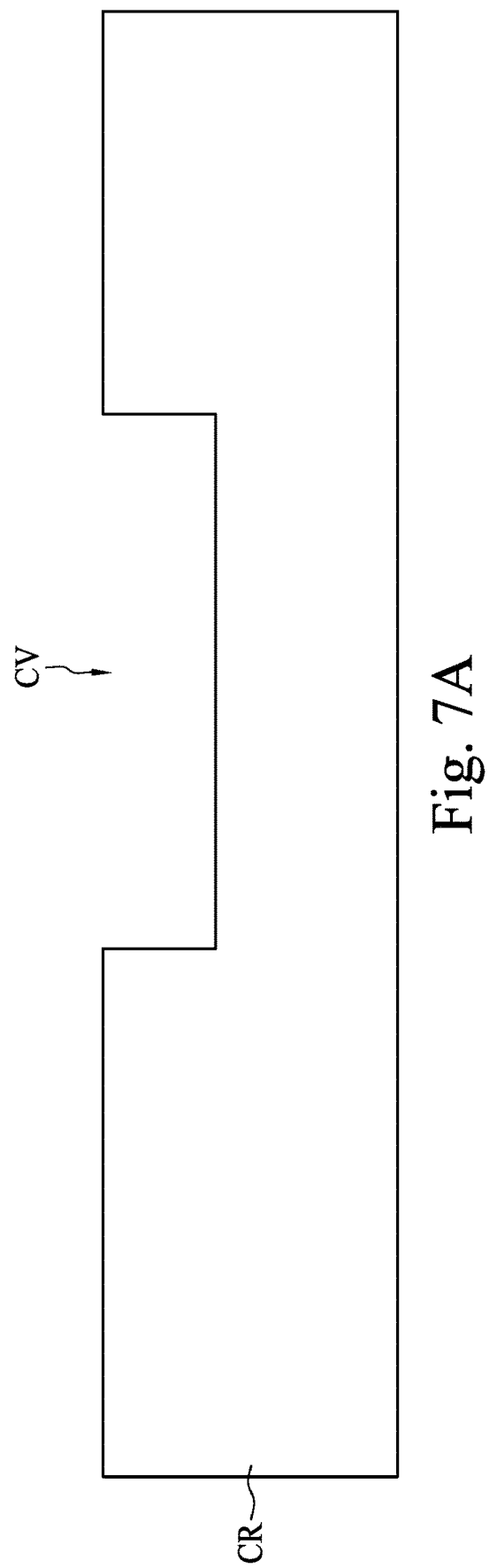
FIG. 7A, FIG. 7B, FIG. 7C, FIG. 7D, FIG. 7E, FIG. 7F, FIG. 7G and FIG. 7H are cross-sectional views of a semiconductor device package fabricated at various stages, in accordance with some embodiments of the present disclosure.
Figure 7B:
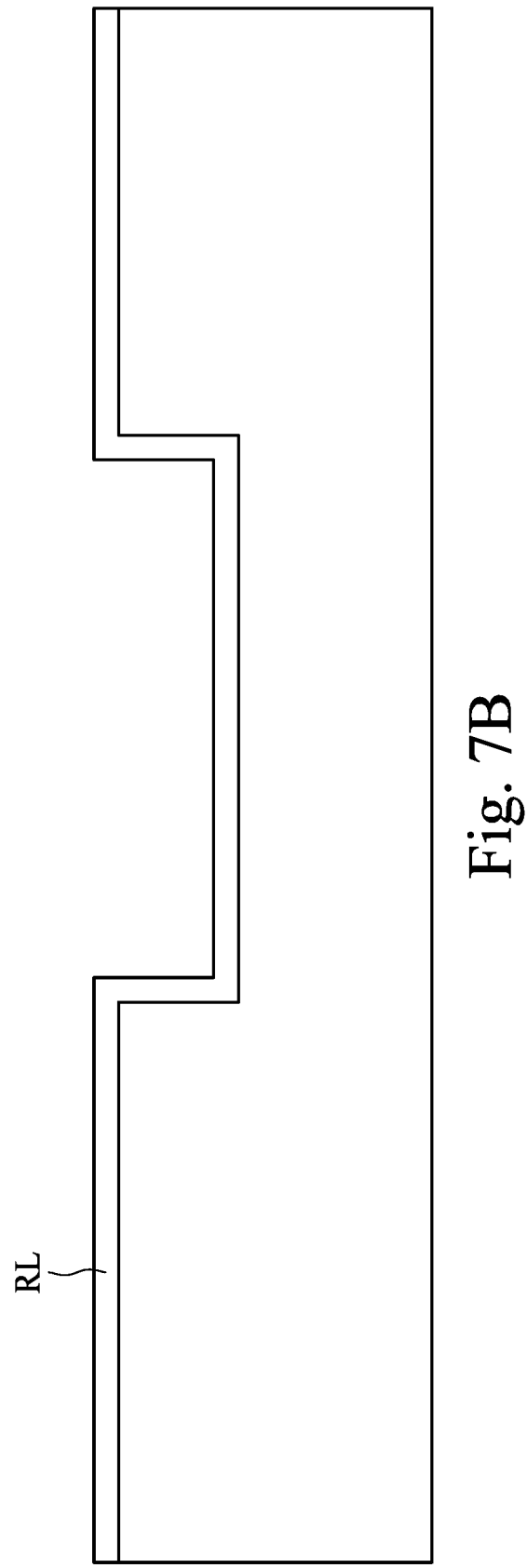
Figure 7C:
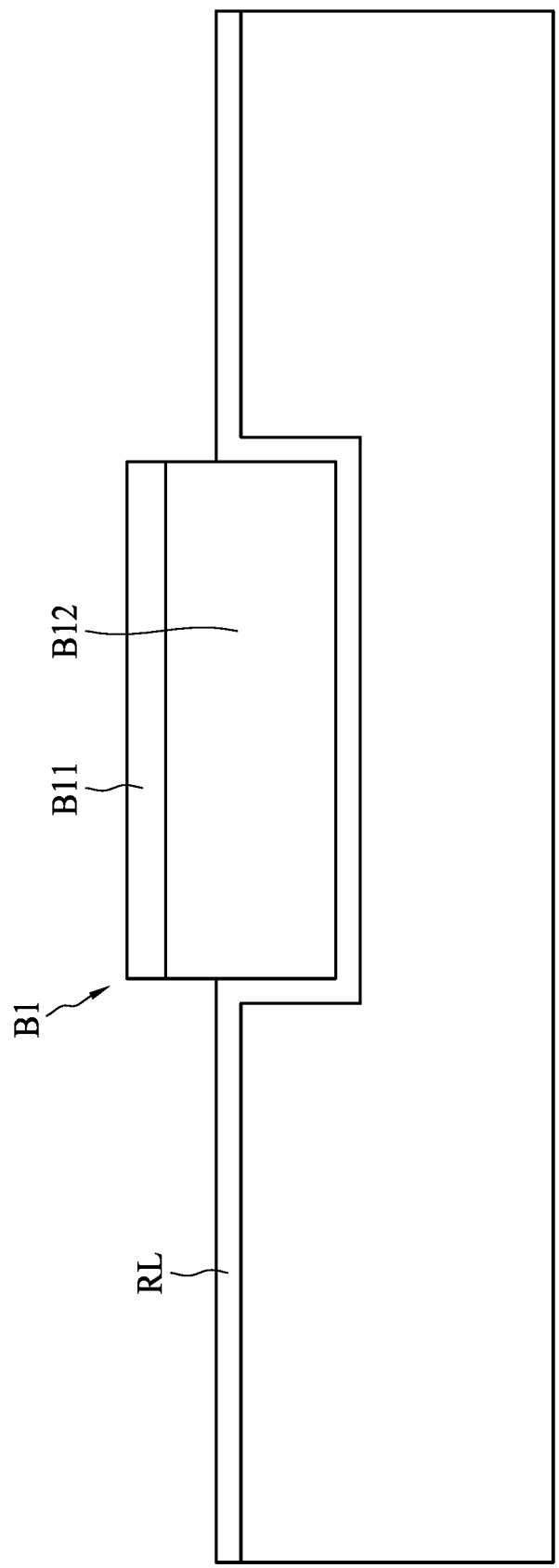
Figure 7D:
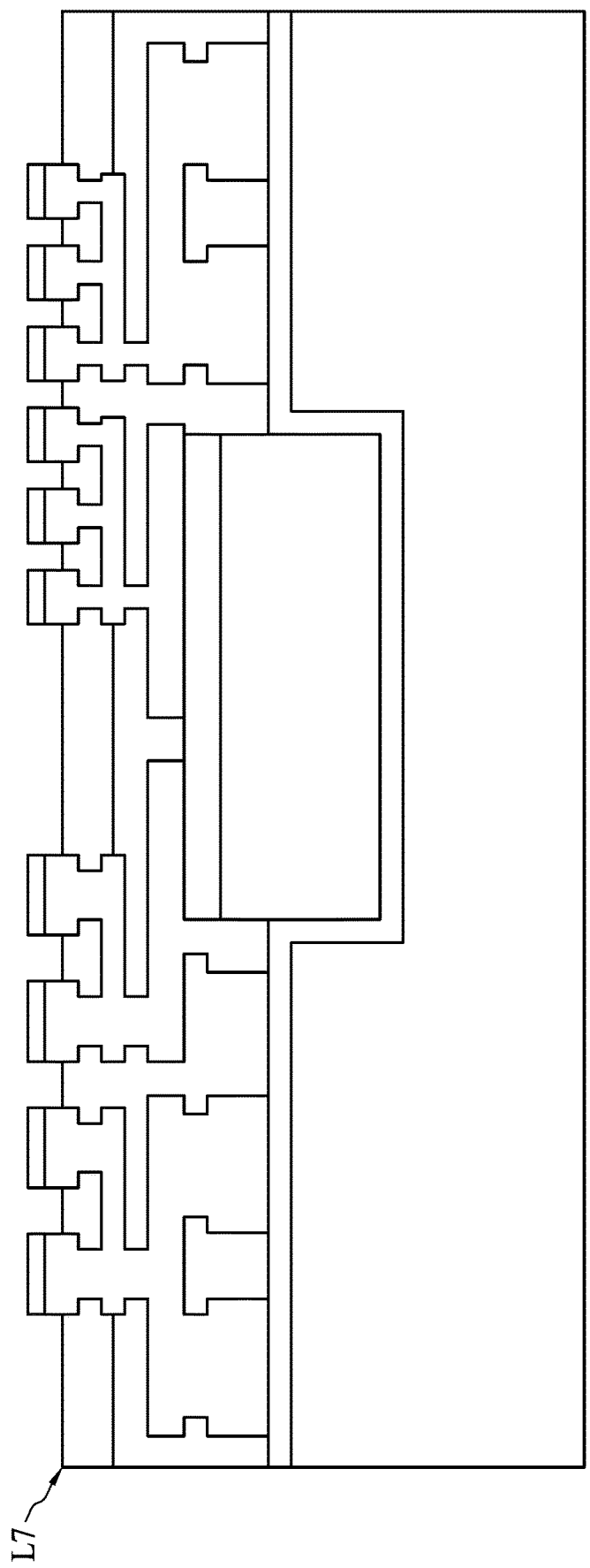
Figure 7E:
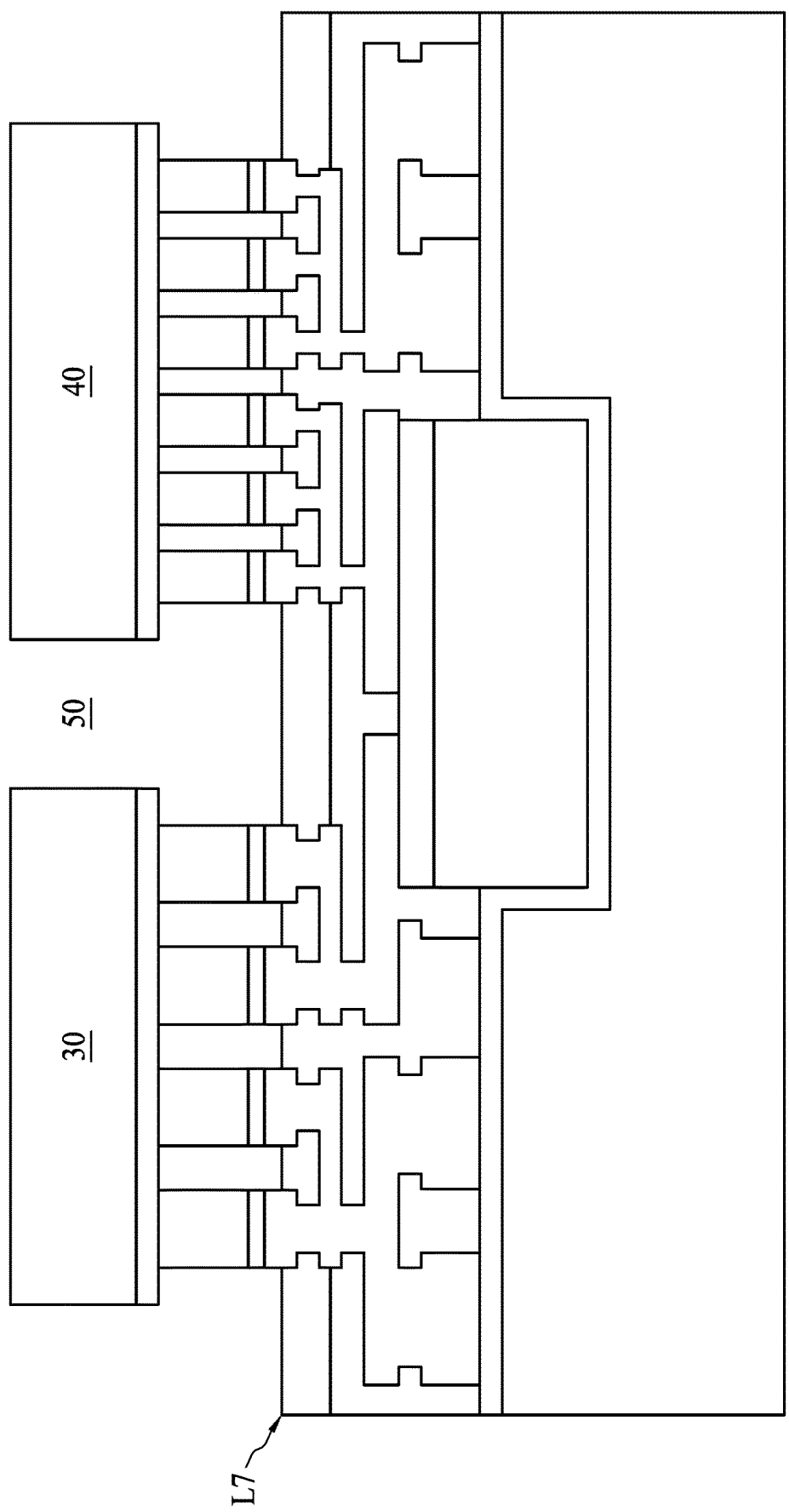
Figure 7F:
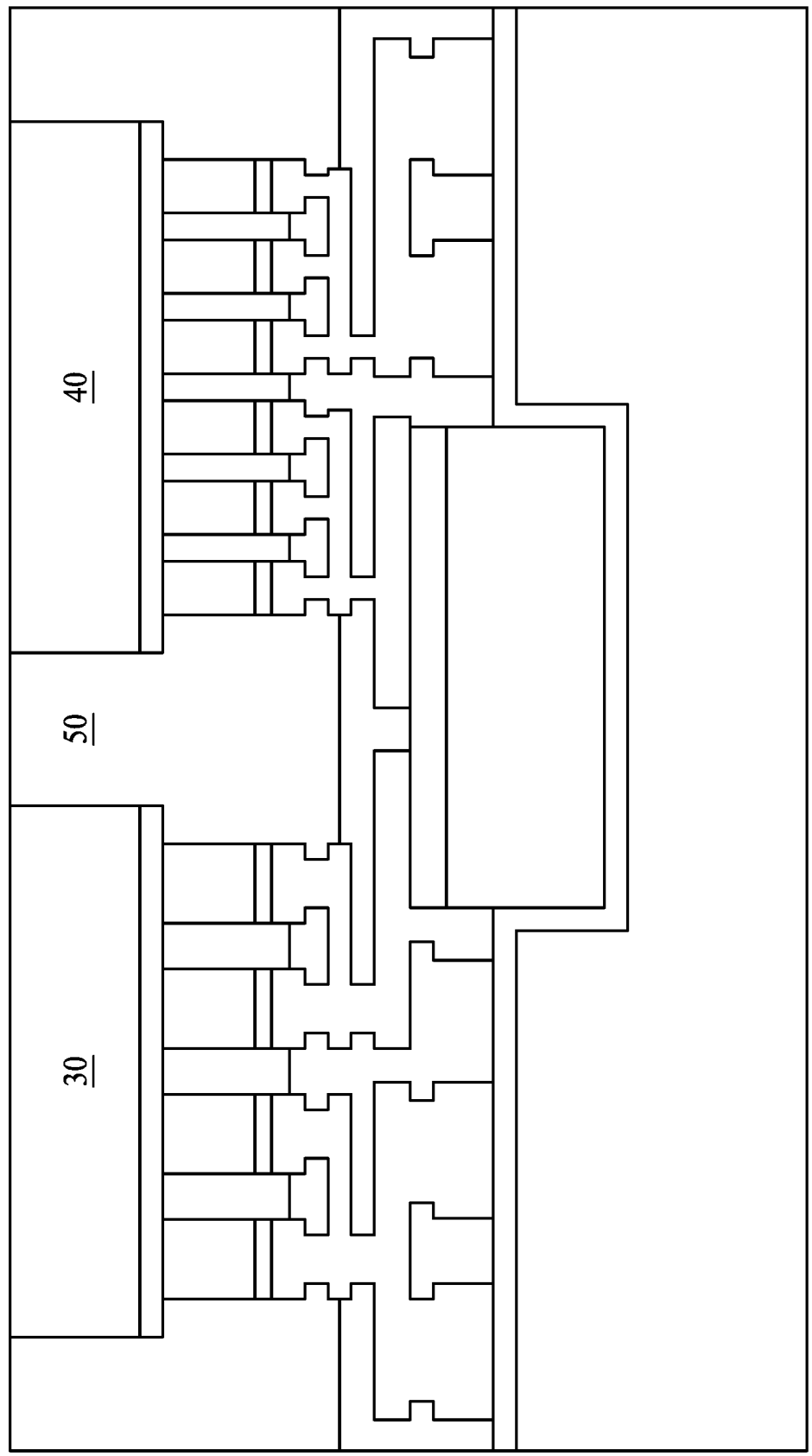
Figure 7G:
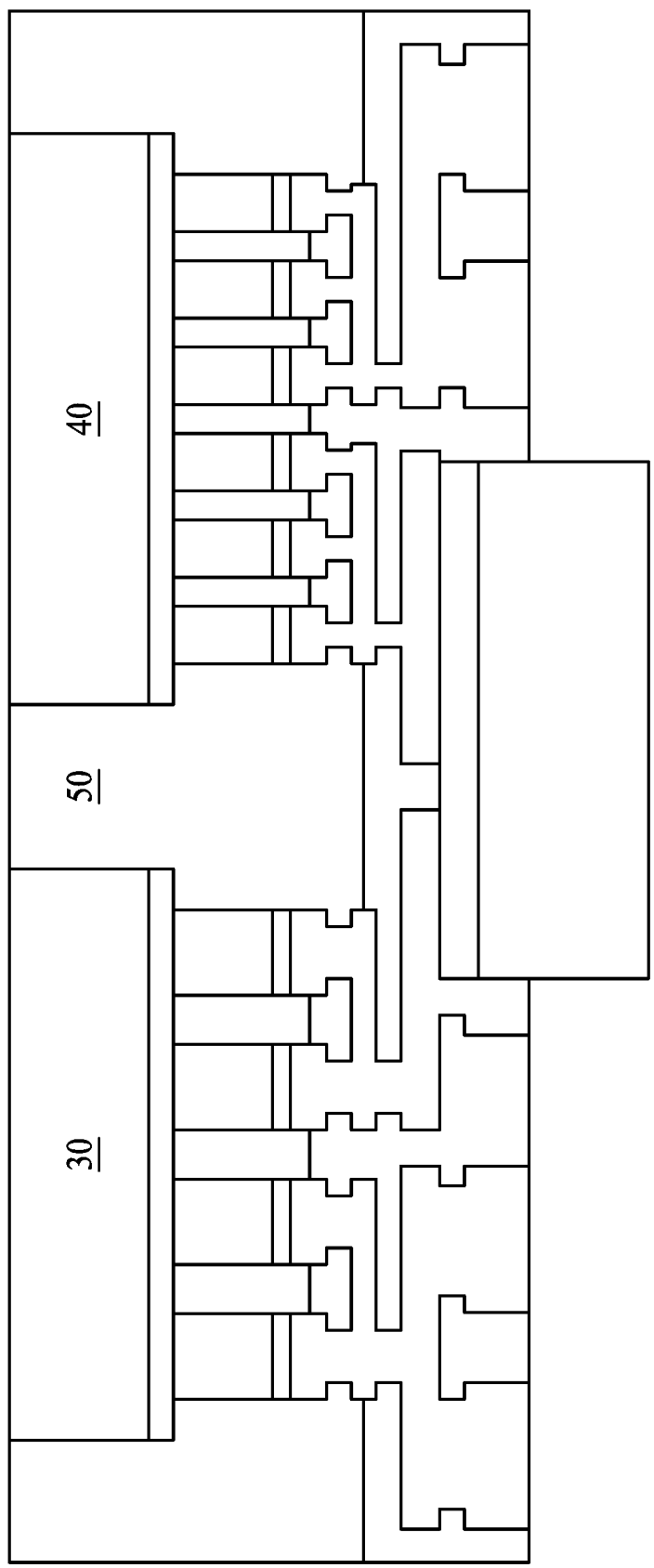
Figure 7H:
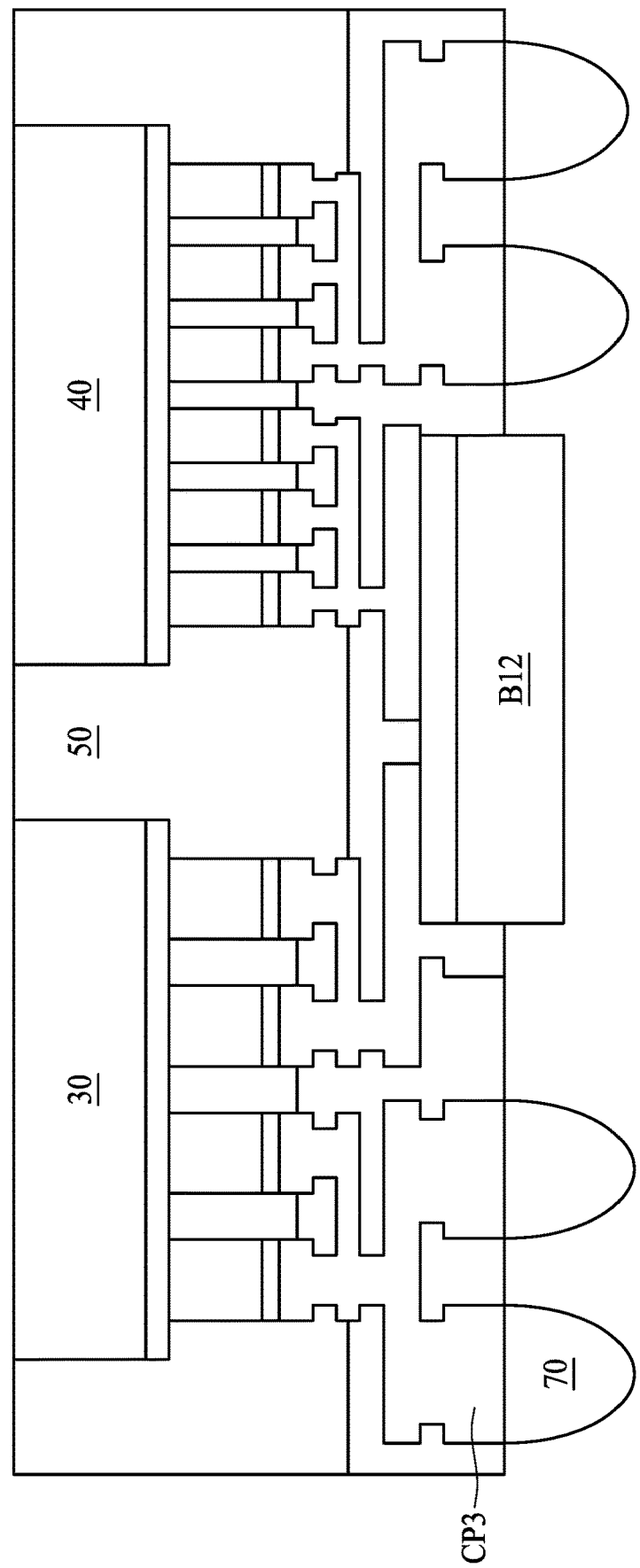

Referring to FIG. 7A, a carrier CR is provided. A cavity CV is formed on the carrier CR by suitable techniques such as drilling, laser or etching technique. Referring to FIG. 7B, a release layer RL is provided conformally on the carrier CR (and in the cavity CV). The release layer RL may be formed by coating technique. Referring to FIG. 7C, a bridge interposer B1 is disposed in the cavity CV. The bridge interposer B1 includes an interconnection structure B11 and a base portion B12. Referring to FIG. 7D, an RDL L7 is formed on the carrier CR and on the bridge interposer B1. Referring to FIG. 7E, semiconductor dies 30 and 40 are disposed on the RDL L7. Referring to FIG. 7F, the semiconductor dies 30 and 40 are encapsulated by an encapsulant 50. Referring to FIG. 7G, the carrier CR and the release layer RL are removed. Referring to FIG. 7H, connection elements (e.g. solder balls or solder bumps) 70 are formed on conductive pads CP3 of the RDL L7. A semiconductor device package 7h is formed. The semiconductor device package 7h may be similar to or the same as the semiconductor device package 1a of FIG. 1A. In some embodiments, a portion of the base portion B12 protruding beyond the RDL L7 in the semiconductor device package 7h may be greater than a portion of the base portion 60 protruding beyond the RDL 10 in the semiconductor device package 1a.

FIG. 8A, FIG. 8B, FIG. 8C and FIG. 8D are cross-sectional views of a semiconductor device package 8d fabricated at various stages, in accordance with some embodiments of the present disclosure. Various figures have been simplified for a better understanding of the aspects of the present disclosure.

Figure 8A:
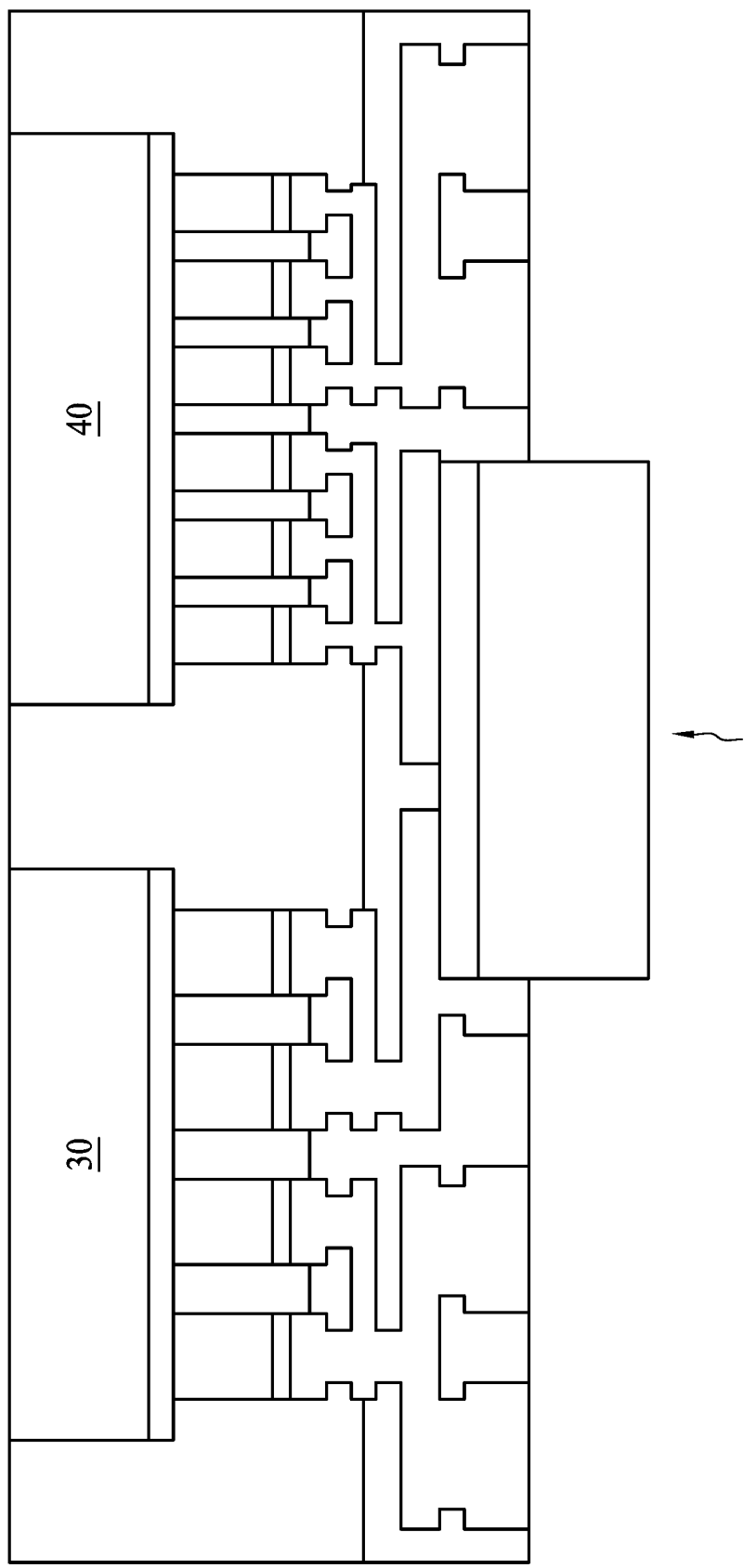
FIG. 8A, FIG. 8B, FIG. 8C and FIG. 8D are cross-sectional views of a semiconductor device package fabricated at various stages, in accordance with some embodiments of the present disclosure.
Figure 8B:
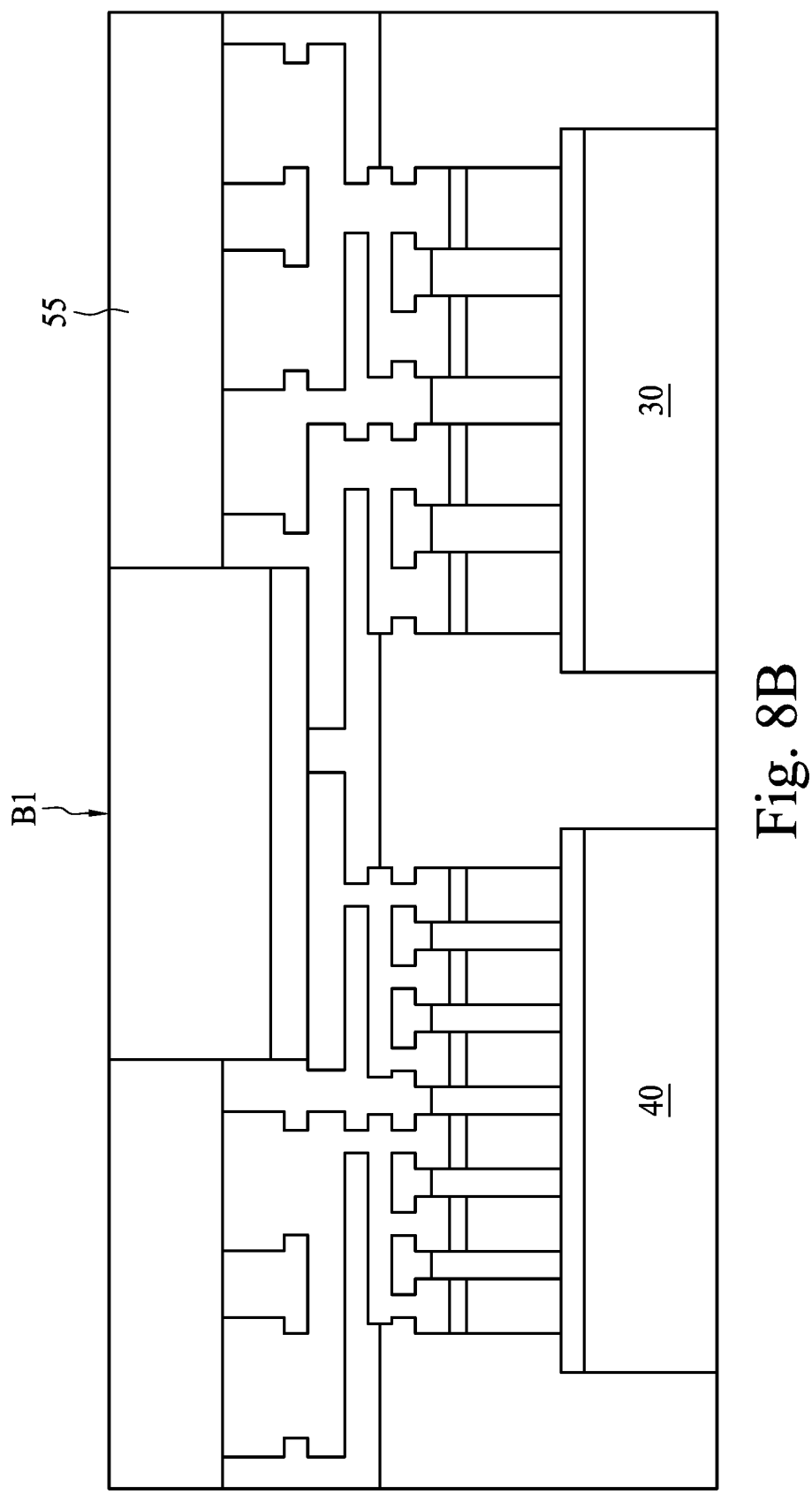
Figure 8C:
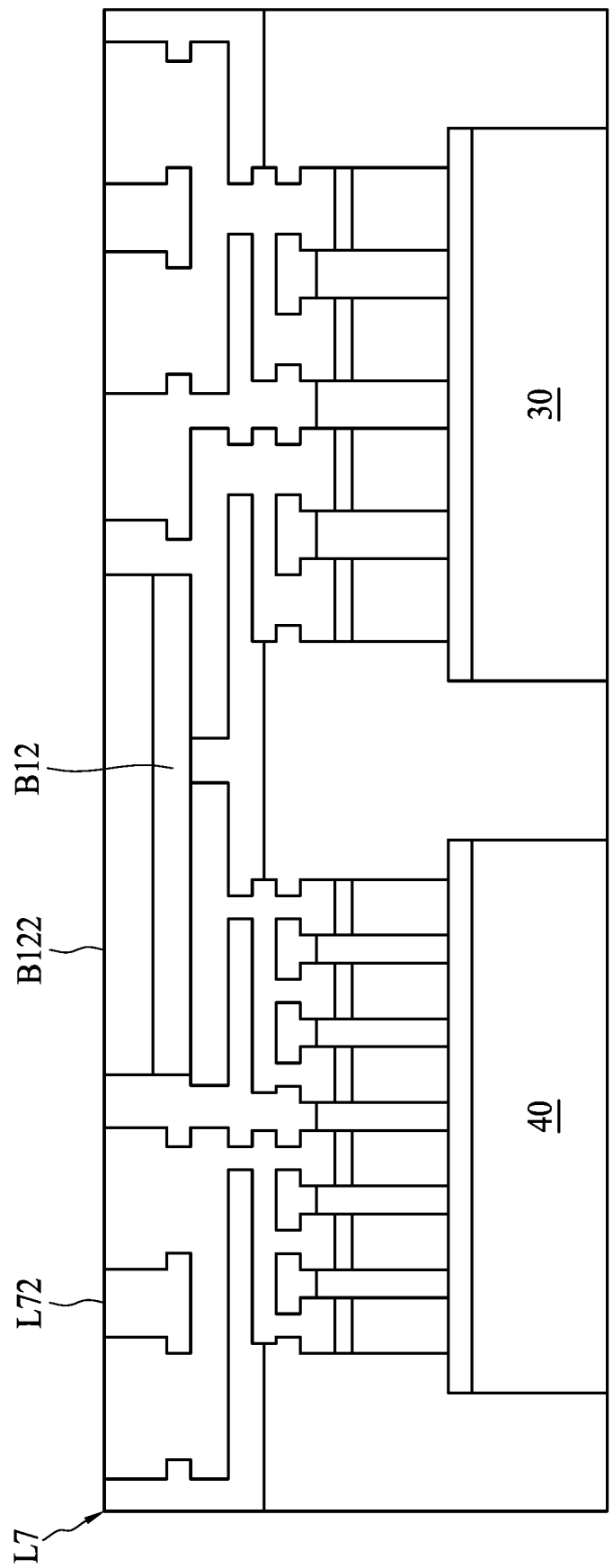
Figure 8D:
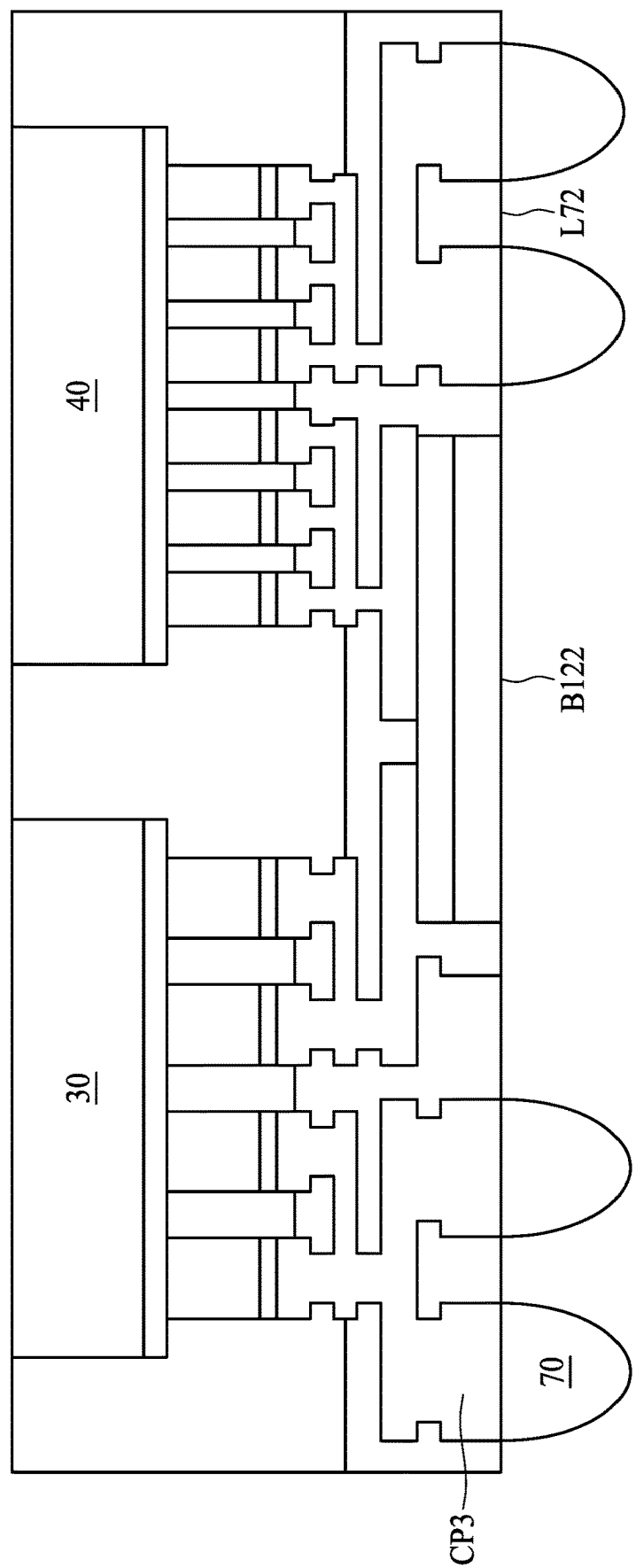

The structure in FIG. 8A is similar to or the same as the structure in FIG. 7G. Referring to FIG. 8B, an encapsulant (or a molding compound) 55 is formed on the RDL L7. The encapsulant 55 surrounds and covers the bridge interposer B1. Referring to FIG. 8C, the encapsulant 55 and a portion of the base portion B12 of the bridge interposer B1 are removed by suitable techniques such as grinding technique. A surface B122 of the base portion B12 of the bridge interposer B1 is coplanar with a surface L72 of the RDL L7. Referring to FIG. 8D, connection elements (e.g. solder balls or solder bumps) 70 are formed on the conductive pads CP3 of the RDL L7. A semiconductor device package 8d is formed. The semiconductor device package 8d may be similar to or the same as the semiconductor device package 1a of FIG. 1A.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a difference between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a first redistribution layer (RDL);
   a first die on the first RDL and electrically connected to the first RDL, the first die having a first electrical contact;
   a second die on the first RDL and electrically connected to the first RDL, the second die having a second electrical contact;
   a second RDL surrounded by the first RDL, the second RDL having a third electrical contact electrically connected to the first electrical contact of the first die and a fourth electrical contact electrically connected to the second electrical contact of the second die, a size of the third electrical contact of the second RDL being greater than a size of the fourth electrical contact of the second RDL; and
   an encapsulant on the first RDL and covering the first die and the second die.

2. The semiconductor device package of claim 1, wherein a size of the first electrical contact of the first die is greater than a size of the second electrical contact of the second die.

3. The semiconductor device package of claim 1, wherein the first RDL has a fifth electrical contact electrically connected between the first electrical contact of the first die and the third electrical contact of the second RDL, and a sixth electrical contact electrically connected between the second electrical contact of the second die and the fourth electrical contact of the second RDL, and wherein a size of the fifth electrical contact of the first RDL is greater than a size of the sixth electrical contact of the first RDL.

4. The semiconductor device package of claim 1, wherein the first RDL has a seventh electrical contact and an eighth electrical contact;
the first die has a nineth electrical contact electrically connected to the seventh electrical contact of the first RDL;
the second die has a tenth electrical contact electrically connected to the eighth electrical contact of the first RDL; and
a size of the seventh electrical contact and the eighth electrical contact of the first RDL is respectively greater than a size of the fifth electrical contact and the sixth electrical contact of the first RDL.

5. The semiconductor device package of claim 1, wherein a side wall of the second RDL is in contact with the first RDL.

6. The semiconductor device package of claim 1, further comprising a base portion in contact with the second RDL.

7. The semiconductor device package of claim 6, wherein a surface of the base portion facing away from the second RDL is exposed from the first RDL.

8. The semiconductor device package of claim 7, wherein the surface of the base portion is coplanar with a surface of the first RDL.

9. The semiconductor device package of claim 6, wherein at least a portion of a side wall of the base portion is exposed from the first RDL.

10. The semiconductor device package of claim 6, wherein the base portion has a first portion covered by the first RDL and a second portion exposed from the first RDL, and wherein a thickness of the first portion of the base portion is equal to or less than 8 micrometers (µm).

11. The semiconductor device package of claim 1, wherein
the second RDL has a surface facing away from the first die and exposed from the first RDL; and
the second RDL has a fifth electrical contact adjacent to and exposed from the surface of the second RDL.

12. The semiconductor device package of claim 11, further comprising an electronic component electrically connected to the fifth electrical contact of the second RDL.

13. A method of manufacturing a semiconductor device package, comprising:
providing a carrier;
disposing an interconnection structure on the carrier;
forming a redistribution layer (RDL) on the carrier at least partially surrounding the interconnection structure;
disposing a first die and a second die on the RDL and the interconnection structure; and
forming an encapsulant on the RDL to cover the first die and the second die.

14. The method of claim 13, wherein
the interconnection structure has a first electrical contact electrically connected to the first die and a second electrical contact electrically connected to the second die; and
a size of the first electrical contact is greater than a size of the second electrical contact.

15. The method of claim 13, further comprising removing the carrier to expose a portion of the interconnection structure.

16. The method of claim 15, further comprising removing a base portion of the interconnection structure after removing the carrier.

17. The method of claim 16, further comprising exposing an electrical contact of the interconnection structure after removing the base portion.

18. The method of claim 13, wherein disposing the interconnection structure comprises forming a cavity in the carrier and disposing the interconnection structure in the cavity.

19. A method of manufacturing a semiconductor device package, comprising:
providing a carrier;
disposing a first die and a second die on the carrier;
forming an encapsulant covering the first die and the second die;
removing the carrier to expose the first die and the second die;
disposing an interconnection structure on the first die and the second die, wherein a first electrical contact of the interconnection structure is electrically connected to the first die and a second electrical contact of the interconnection structure is electrically connected to the second die; and
forming a first redistribution layer (RDL) surrounding the interconnection structure.

20. The method of claim 19, wherein a size of the first electrical contact of the interconnection structure is greater than a size of the second electrical contact of the interconnection structure.

* * * * *